US009786688B2

(12) United States Patent
Umezaki

(10) Patent No.: US 9,786,688 B2
(45) Date of Patent: Oct. 10, 2017

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 218 days.

(21) Appl. No.: 14/841,759

(22) Filed: Sep. 1, 2015

(65) Prior Publication Data

US 2016/0064424 A1    Mar. 3, 2016

(30) Foreign Application Priority Data

Sep. 3, 2014   (JP) ................. 2014-178698

(51) Int. Cl.
*H01L 27/12*      (2006.01)
*H01L 29/786*     (2006.01)
*G09G 3/3266*     (2016.01)
*G09G 3/36*       (2006.01)

(52) U.S. Cl.
CPC ....... *H01L 27/1225* (2013.01); *G09G 3/3266* (2013.01); *G09G 3/3677* (2013.01); *H01L 29/7869* (2013.01); *G09G 2300/0426* (2013.01); *G09G 2340/0492* (2013.01)

(58) Field of Classification Search
CPC . H01L 27/1225; H01L 27/124; H01L 27/127; H01L 27/1255; H01L 27/1251; H03K 3/02; G11C 19/28

USPC .... 327/164, 203, 404, 427, 538; 377/64, 74, 377/79

See application file for complete search history.

(56) References Cited

U.S. PATENT DOCUMENTS

| 7,038,653 | B2 | 5/2006 | Moon |
| 7,486,269 | B2 | 2/2009 | Moon |
| 8,330,702 | B2 | 12/2012 | Miyake et al. |
| 8,519,929 | B2 | 8/2013 | Umezaki |
| 8,548,115 | B2 * | 10/2013 | Shang ................. G09G 3/3677 377/64 |
| 8,564,523 | B2 | 10/2013 | Moon |
| 8,698,551 | B2 | 4/2014 | Umezaki |
| 9,048,117 | B2 | 6/2015 | Miyake et al. |
| 9,373,414 | B2 * | 6/2016 | Shang ................. G11C 19/184 |

(Continued)

*Primary Examiner* — John Poos
(74) *Attorney, Agent, or Firm* — Fish & Richardson P.C.

(57) ABSTRACT

A semiconductor device or the like with a novel structure that can change the orientation of the display is provided. A semiconductor device or the like with a novel structure, in which a degradation in transistor characteristics can be suppressed, is provided. A semiconductor device or the like with a novel structure, in which operation speed can be increased, is provided. A semiconductor device or the like with a novel structure, in which a dielectric breakdown of a transistor can be suppressed, is provided. The semiconductor device or the like has a circuit configuration capable of switching between a first operation and a second operation by changing the potentials of wirings. By switching between these two operations, the scan direction is easily changed. The semiconductor device is configured to change the scan direction.

20 Claims, 33 Drawing Sheets

(56) References Cited

U.S. PATENT DOCUMENTS

| | | | |
|---|---|---|---|
| 2007/0195920 A1* | 8/2007 | Tobita | G11C 19/28 377/64 |
| 2008/0101529 A1* | 5/2008 | Tobita | G09G 3/3677 377/64 |
| 2010/0201659 A1 | 8/2010 | Miyake et al. | |
| 2013/0156148 A1* | 6/2013 | Sasaki | G11C 19/184 377/64 |
| 2013/0223584 A1 | 8/2013 | Umezaki | |
| 2013/0342516 A1* | 12/2013 | Shang | G09G 3/3677 345/206 |
| 2015/0310929 A1 | 10/2015 | Umezaki | |

* cited by examiner

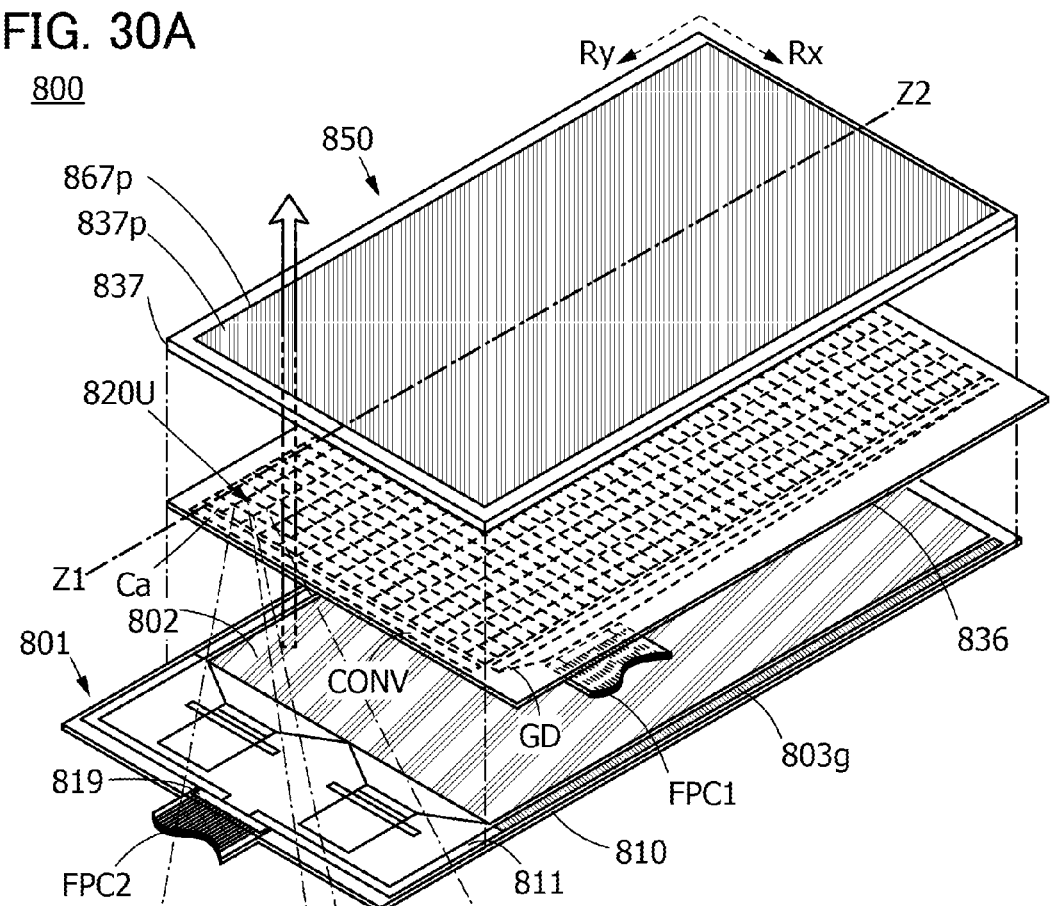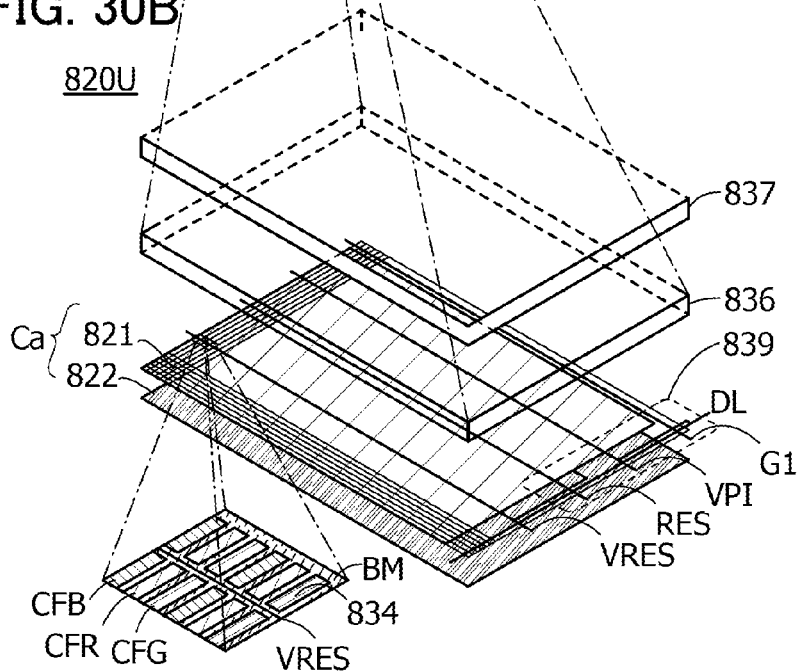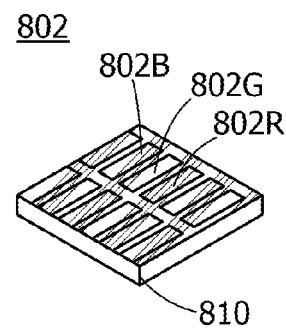

1400
1401 1402 1403

1410
1414 1412
1411
1415 1413

1420
1424
1422
1421
1423

SEMICONDUCTOR DEVICE AND ELECTRONIC DEVICE

BACKGROUND OF THE INVENTION

1. Field of the Invention

One embodiment of the present invention relates to a semiconductor device and an electronic device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specific examples of the technical field of one embodiment of the present invention disclosed in this specification include a semiconductor device, a display device, a light-emitting device, a power storage device, an imaging device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

2. Description of the Related Art

In a semiconductor device having a display function typified by a television receiver, the orientation of the display is fixed.

A shift register is mounted on a driver circuit for driving such a semiconductor device (see Patent Document 1).

REFERENCE

Patent Document

[Patent Document 1] United States Patent Application Publication No. 2010/0201659

SUMMARY OF THE INVENTION

Recently, with the widespread of smartphones and the like, a semiconductor device that can change the orientation of the display between portrait and landscape modes is demanded.

An object of one embodiment of the present invention is to provide a novel semiconductor device, a novel electronic device, and the like.

An object of one embodiment of the present invention is to provide a semiconductor device or the like with a novel structure that can change the orientation of the display. Another object of one embodiment of the present invention is to provide a semiconductor device or the like with a novel structure, in which a degradation in transistor characteristics can be suppressed. Another object of one embodiment of the present invention is to provide a semiconductor device or the like with a novel structure, in which operation speed can be increased. Another object of one embodiment of the present invention is to provide a semiconductor device or the like with a novel structure, in which a dielectric breakdown of a transistor can be suppressed.

Note that the objects of one embodiment the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention solves at least one of the aforementioned objects and the other objects.

One embodiment of the present invention is a semiconductor device which includes a first transistor, a second transistor, a third transistor, a fourth transistor, a fifth transistor, a sixth transistor, a seventh transistor, an eighth transistor, and a ninth transistor. In the semiconductor device, one of a source and a drain of the first transistor is electrically connected to one of a source and a drain of the second transistor, and the other of the source and the drain of the first transistor is electrically connected to a first wiring. The one of the source and the drain of the second transistor is electrically connected to a second wiring, the other of the source and the drain of the second transistor is electrically connected to a third wiring, one of a source and a drain of the third transistor is electrically connected to a gate of the first transistor, and the other of the source and the drain of the third transistor is electrically connected to the third wiring. Furthermore, one of a source and a drain of the fourth transistor is electrically connected to a gate of the second transistor or a gate of the third transistor, and the other of the source and the drain of the fourth transistor is electrically connected to a fourth wiring. One of a source and a drain of the fifth transistor is electrically connected to the one of the source and the drain of the fourth transistor, the other of the source and the drain of the fifth transistor is electrically connected to the third wiring, and a gate of the fifth transistor is electrically connected to the gate of the first transistor. In addition, one of a source and a drain of the sixth transistor is electrically connected to a gate of the fourth transistor, the other of the source and the drain of the sixth transistor is electrically connected to a fifth wiring, and a gate of the sixth transistor is electrically connected to a sixth wiring. One of a source and a drain of the seventh transistor is electrically connected to the gate of the fourth transistor, the other of the source and the drain of the seventh transistor is electrically connected to a seventh wiring, and a gate of the seventh transistor is electrically connected to an eighth wiring. Furthermore, one of a source and a drain of the eighth transistor is electrically connected to the gate of the first transistor, the other of the source and the drain of the eighth transistor is electrically connected to the fifth wiring, and a gate of the eighth transistor is electrically connected to a ninth wiring. One of a source and a drain of the ninth transistor is electrically connected to the gate of the first transistor, the other of the source and the drain of the ninth transistor is electrically connected to the seventh wiring, and a gate of the ninth transistor is electrically connected to a tenth wiring. Moreover, the fifth wiring has a function of transmitting one of a first potential and a second potential in a first operation and transmitting the other of the first potential and the second potential in a second operation, and the seventh wiring has a function of transmitting the other of the first potential and the second potential in the first operation and transmitting the one of the first potential and the second potential in the second operation.

In the semiconductor device of one embodiment of the present invention, it is preferable that the first wiring have a function of transmitting a first clock signal, the sixth wiring have a function of transmitting a second clock signal, and the eighth wiring have a function of transmitting a third clock signal.

In the semiconductor device of one embodiment of the present invention, it is preferable that the second wiring have a function of transmitting an output signal, the tenth wiring have a function of transmitting a signal output from a previous stage circuit, and the ninth wiring have a function of transmitting a signal output from a next stage circuit.

In the semiconductor device of one embodiment of the present invention, it is preferable that the fourth wiring have a function of transmitting the first potential and the third wiring have a function of transmitting the second potential.

In the semiconductor device of one embodiment of the present invention, it is preferable that a first capacitor be further included, one electrode of the first capacitor be electrically connected to the one of the source and the drain of the first transistor, and the other electrode of the first capacitor be electrically connected to the gate of the first transistor.

In the semiconductor device of one embodiment of the present invention, it is preferable that a second capacitor be further included, one electrode of the second capacitor be electrically connected to the one of the source and the drain of the fourth transistor, and the other electrode of the second capacitor be electrically connected to the gate of the fourth transistor.

In the semiconductor device of one embodiment of the present invention, it is preferable that a W/L of the first transistor, where W is a channel width and L is a channel length, be higher than W/Ls of the second to ninth transistors, In the semiconductor device of one embodiment of the present invention, it is preferable that a W/L of the sixth transistor, where W is a channel width and L is a channel length, be 0.8 times to 1.2 times a W/L of the seventh transistor.

In the semiconductor device of one embodiment of the present invention, it is preferable that a W/L of the eighth transistor, where W is a channel width and L is a channel length, be 0.8 times to 1.2 times a W/L of the ninth transistor.

In the semiconductor device of one embodiment of the present invention, it is preferable that the first to ninth transistors include an oxide semiconductor in their channel formation regions.

One embodiment of the present invention is a display module including the above-described semiconductor device and an FPC.

One embodiment of the present invention is an electronic device including the above-described semiconductor device or the above-described display module, and a speaker, an operation button, and/or an antenna.

Note that other embodiments of the present invention are described in the following embodiments with reference to the drawings.

One embodiment of the present invention can provide a novel semiconductor device, a novel electronic device, or the like.

With one embodiment of the present invention, a semiconductor device or the like with a novel structure that can change the orientation of the display can be provided. With one embodiment of the present invention, a semiconductor device or the like with a novel structure, in which a degradation in transistor characteristics can be suppressed, can be provided. With one embodiment of the present invention, a semiconductor device or the like with a novel structure, in which operation speed can be increased, can be provided. With one embodiment of the present invention, a semiconductor device or the like with a novel structure, in which a dielectric breakdown of a transistor can be suppressed, can be provided.

Note that the effects of one embodiment of the present invention are not limited to the above effects. The effects described above do not disturb the existence of other effects. The other effects are not described above and will be described below. The other effects will be apparent from and can be derived from the description of the specification, the drawings, and the like by those skilled in the art. One embodiment of the present invention has at least one of the aforementioned effects and the other effects. Accordingly, in some cases, one embodiment of the present invention does not have the aforementioned effects.

BRIEF DESCRIPTION OF THE DRAWINGS

In the accompanying drawings:

FIGS. 30A to 30C are projection views illustrating one embodiment of the present invention;

DETAILED DESCRIPTION OF THE INVENTION

Figure 1:
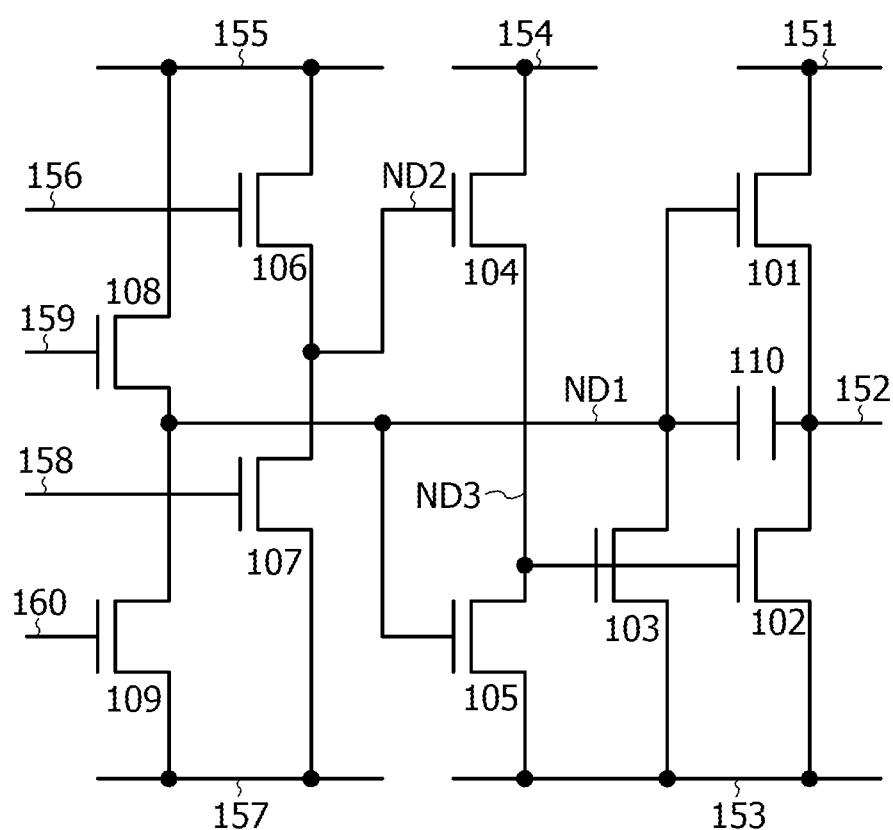
FIG. 1 is a circuit diagram illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components. For example, in the present specification and the like, a "first" component in one embodiment can be referred to as a "second" component in other embodiments or claims. Furthermore, in the present specification and the like, a "first" component in one embodiment can be referred to without the ordinal number in other embodiments or claims.

The same elements or elements having similar functions, elements formed using the same material, elements formed at the same time, or the like in the drawings are denoted by the same reference numerals, and the description thereof is not repeated in some cases.

Embodiment 1

A structure of a semiconductor device of one embodiment of the present invention will be described with reference to FIG. 1.

A semiconductor device illustrated in FIG. 1 includes a circuit 100. The circuit 100 has a function of controlling the potential of a wiring 152. The circuit 100 may be referred to as a logic circuit or a sequential circuit.

The circuit 100 can switch between a first operation and a second operation by changing the potentials of wirings 155 and 157 connected to the circuit 100. A semiconductor device including the circuit 100 that can switch between these two operations can easily change the scan direction. A semiconductor device having a display function provided with such a function of changing the scan direction can change the orientation of the display.

The circuit 100 includes transistors 101 to 109 and a capacitor 110. In FIG. 1, a gate of the transistor 101 is represented by a node ND1. Similarly, a gate of the transistor 104 is represented by a node ND2. Furthermore, a gate of the transistor 102 is represented by a node ND3.

The connections among the transistors 101 to 109 and the capacitor 110 will be described.

One of a source and a drain of the transistor 101 is connected to a wiring 151. The other of the source and the drain of the transistor 101 is connected to the wiring 152.

One of a source and a drain of the transistor 102 is connected to a wiring 153. The other of the source and the drain of the transistor 102 is connected to the wiring 152

A gate of the transistor 103 is connected to the node ND3. One of a source and a drain of the transistor 103 is connected to the wiring 153. The other of the source and the drain of the transistor 103 is connected to the node ND1.

One of a source and a drain of the transistor 104 is connected to a wiring 154. The other of the source and the drain of the transistor 104 is connected to the node ND3.

A gate of the transistor 105 is connected to the node ND1. One of a source and a drain of the transistor 105 is connected to the wiring 153. The other of the source and the drain of the transistor 105 is connected to the node ND3.

A gate of the transistor 106 is connected to a wiring 156. One of a source and a drain of the transistor 106 is connected to the wiring 155. The other of the source and the drain of the transistor 106 is connected to the node ND2.

A gate of the transistor 107 is connected to a wiring 158. One of a source and a drain of the transistor 107 is connected to the wiring 157. The other of the source and the drain of the transistor 107 is connected to the node ND2.

A gate of the transistor 108 is connected to a wiring 159. One of a source and a drain of the transistor 108 is connected to the wiring 155. The other of the source and the drain of the transistor 108 is connected to the node ND1.

A gate of the transistor 109 is connected to a wiring 160. One of a source and a drain of the transistor 109 is connected to the wiring 157. The other of the source and the drain of the transistor 109 is connected to the node ND1.

A first electrode of the capacitor 110 is connected to the node ND1. A second electrode of the capacitor 110 is connected to the wiring 152.

Note that the transistors 101 to 109 preferably have the same polarity. That is, the transistors 101 to 109 are preferably all n-channel transistors. Alternatively, the transistors 101 to 109 are preferably all p-channel transistors. Thus, manufacturing steps can be simplified, which enables improvement in yield and/or a reduction in costs.

In the case where the transistors 101 to 109 are n-channel transistors, a transistor including an oxide semiconductor in a channel formation region (also referred to as an OS transistor) can be used as each of the transistors 101 to 109. The OS transistor has higher mobility than a transistor including amorphous silicon in a channel formation region, and has an extremely low off-state current. Therefore, the transistors 101 to 109 can be reduced in size, and potentials of the nodes ND1 to ND3 can be easily kept.

Note that W (channel width)/L (channel length) of the transistor 101 is preferably higher than W/L of the transistors 102 to 109. Thus, the current supply capability of the transistor 101 can be increased, so that the rise time and fall time of the signal to the wiring 152 can be shortened.

In the case where a transistor is formed of a plurality of transistors, the W/L of the transistor is the sum of W/Ls of the plurality of transistors. For example, in the case where a transistor is formed of a plurality of transistors connected in parallel, W is the sum of Ws of the plurality of transistors and L is the average value of Ls of the plurality of transistors.

The W/L of the transistor 106 is preferably equal to or substantially equal to the W/L of the transistor 107. Furthermore, the W/L of the transistor 108 is preferably equal to or substantially equal to the W/L of the transistor 109. The phrase "one W/L of a transistor is substantially equal to the W/L of the other transistor" means that the W/L of one transistor is 0.8 times to 1.2 times, preferably 0.9 times to 1.1 times, the W/L of the other transistor. With this structure, the circuit 100 can perform operation with the same or substantially the same current supply capability even when switching between the first operation and the second operation is performed.

Signals and potentials of the wirings 151 to 160 and the nodes ND1 to ND3 will be described.

The wiring 151 has a function of transmitting a signal having a high level and a low level. A function of transmitting a clock signal can be given as a specific example of the function. The clock signal transmitted through the wiring 151 may be referred to as a first clock signal.

The wiring 152 has a function of transmitting a signal having a high level and a low level. A specific example of the function is a function of transmitting an output signal. The output signal transmitted through the wiring 152 may be referred to as a scan signal, a selection signal, or a pulse signal.

The wiring 153 has a function of transmitting a low-level potential. When the low-level potential is denoted by VL, the wiring 153 has a function of being set at the potential VL.

The wiring 154 has a function of transmitting a high-level potential. When the high-level potential is denoted by VH (>VL), the wiring 154 has a function of being set at the potential VH.

The wiring 155 has a function of transmitting a signal having a high level and a low level. Specifically, for example, the wiring 155 has a function of being set at the potential VH in the first operation and at the potential VL in the second operation.

The wiring 156 has a function of transmitting a signal having a high level and a low level. A specific example of the function is a function of transmitting a clock signal. The clock signal transmitted through the wiring 156 may be referred to as a second clock signal. The second clock signal has a different phase from the first clock signal.

The wiring 157 has a function of transmitting a signal having a high level and a low level. Specifically, for example, the wiring 157 has a function of being set at the potential VL in the first operation and at the potential VH in the second operation.

The wiring 158 has a function of transmitting a signal having a high level and a low level. A specific example of the function is a function of transmitting a clock signal. The clock signal transmitted through the wiring 158 may be referred to as a third clock signal. The third clock signal has a different phase from the first clock signal and the second clock signal.

The wiring 159 has a function of transmitting a signal having a high level and a low level. Specifically, for example, the wiring 159 has a function of transmitting an output signal from the circuit 100 in the previous stage in the first operation and transmitting an output signal from the circuit 100 in the next stage in the second operation. Note that the output signal transmitted through the wiring 159 is, when sent from the outside, referred to as a start pulse, in some cases.

The wiring 160 has a function of transmitting a signal having a high level and a low level. Specifically, for example, the wiring 160 has a function of transmitting an output signal from the circuit 100 in the next stage in the first operation and transmitting an output signal from the circuit 100 in the previous stage in the second operation. Note that the output signal transmitted through the wiring 160 is, when sent from the outside, referred to as a start pulse, in some cases.

As already mentioned, the circuit 100 can switch between the first operation and the second operation by changing the potentials of the wirings 155 and 157 connected to the circuit 100. A semiconductor device including the circuits 100 can transmit an output signal to the circuit 100 in the next stage that is positioned in a first scan direction in the first operation and transmit an output signal to the circuit 100 in the next stage that is positioned in a second scan direction in the second operation. This switching operation can be performed only by changing the potentials of the wirings 155 and 157; thus, the scan direction can be easily changed. Consequently, the semiconductor device having a display function can change the orientation of the display.

Embodiment 2

An operation of the semiconductor device of one embodiment of the present invention will be described with reference to FIG. 2 and FIG. 3. The operation shown in FIG. 2 and FIG. 3 corresponds to the operation of the circuit 100 described in Embodiment 1. This embodiment is described on the assumption that the transistors 101 to 109 are n-channel transistors.

The semiconductor device of one embodiment of the present invention can transmit an output signal to the circuit 100 in the next stage that is positioned in the first scan direction in the first operation and transmit an output signal to the circuit 100 in the next stage that is positioned in the second scan direction in the second operation. FIG. 2 is an example of a timing chart for the first operation, and FIG. 3 is an example of a timing chart for the second operation.

Figure 2:
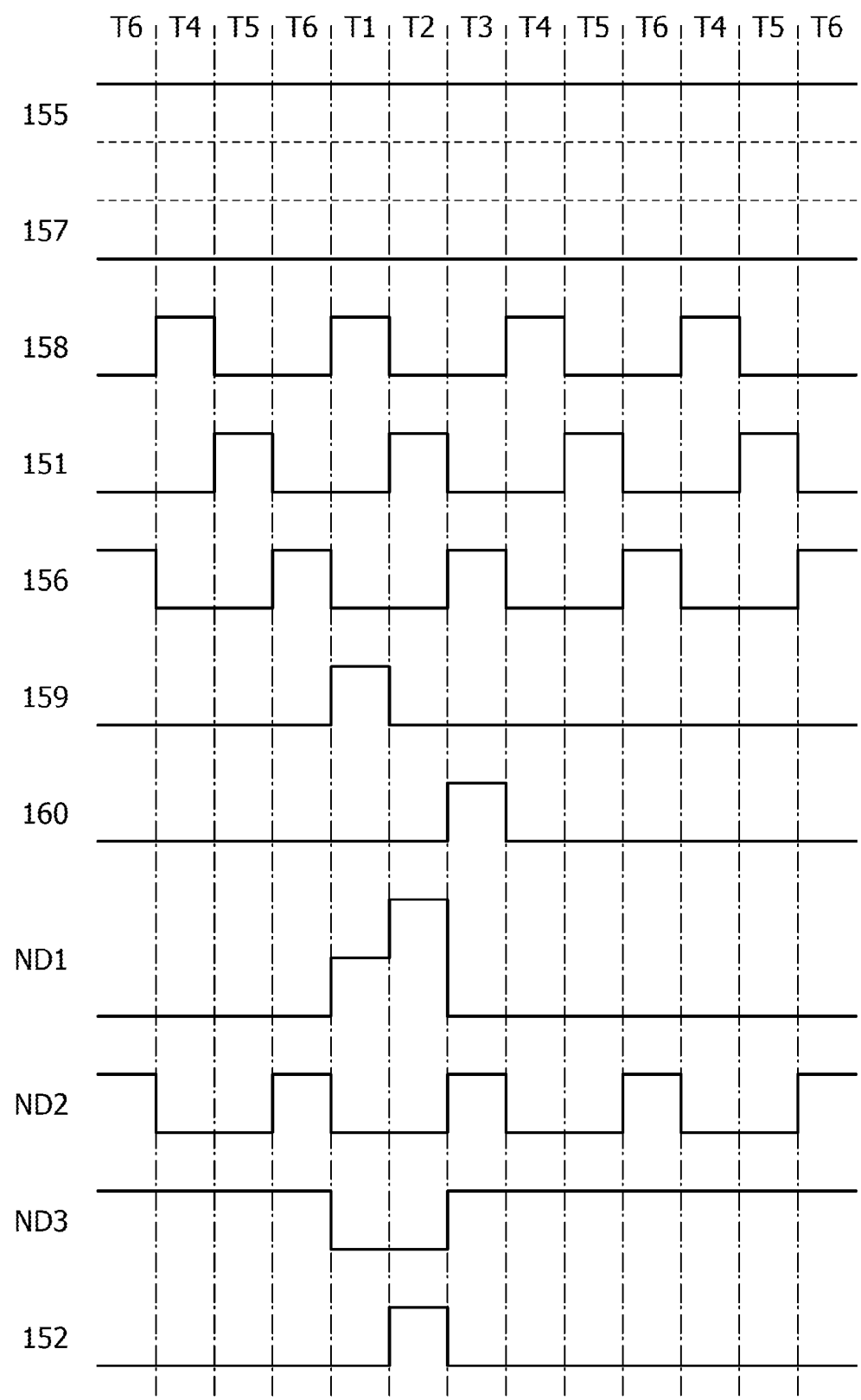
FIG. 2 is a timing chart showing one embodiment of the present invention.
Figure 3:
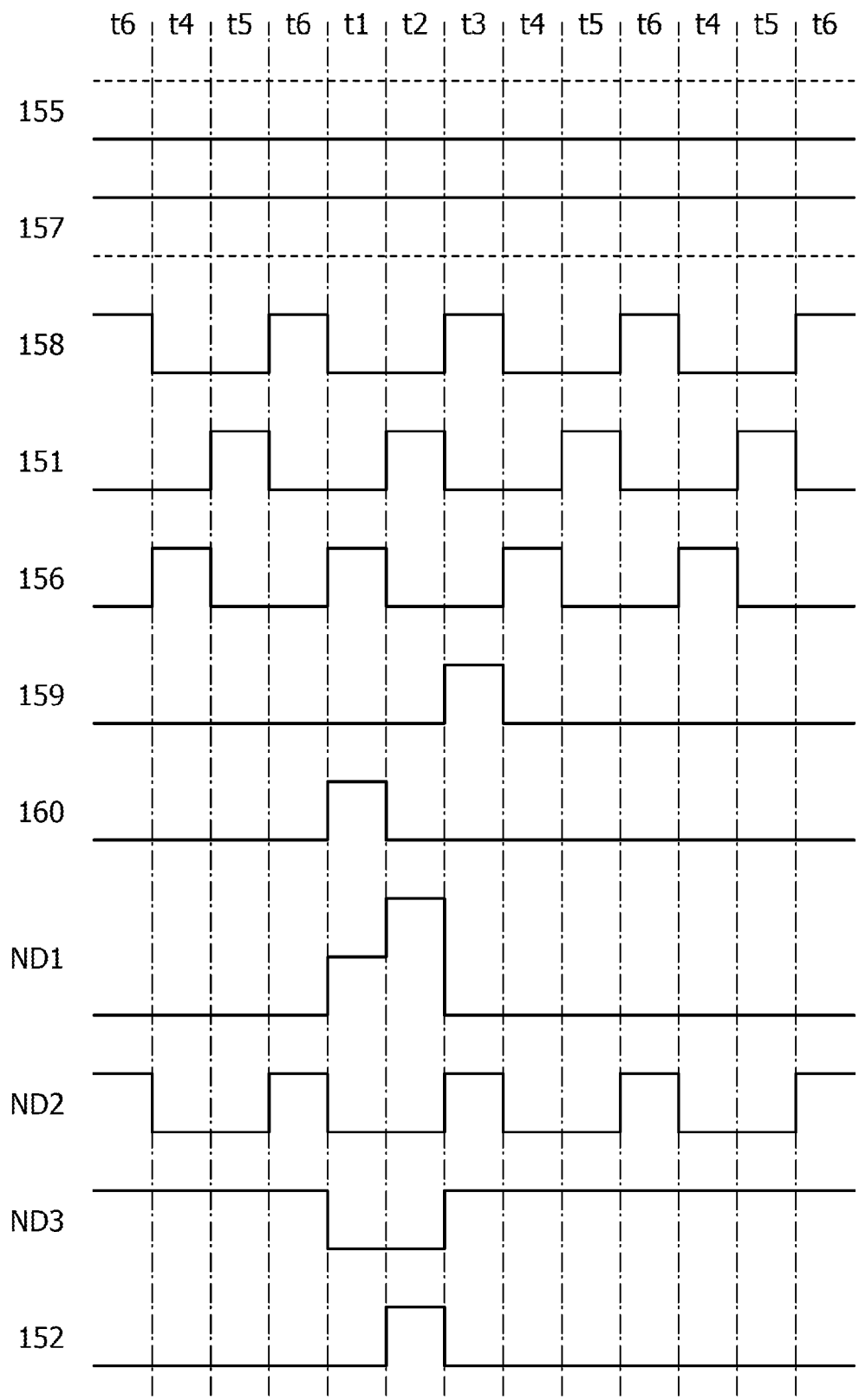
FIG. 3 is a timing chart showing one embodiment of the present invention.

To describe the operation of the circuit 100, FIG. 2 and FIG. 3 show potentials of the wiring 155, the wiring 157, the wiring 158, the wiring 151, the wiring 156, the wiring 159, the wiring 160, the node ND1, the node ND2, the node ND3, and the wiring 152.

<First Operation>

First, the first operation is described with reference to FIG. 2. The first operation is performed under the conditions where the wiring 155 is set at the potential VH and the wiring 157 is set at the potential VL. The first operation in periods T1 to T6 is described. The operation in those periods is described by following changes in the potentials of the nodes ND1 to ND3 and a change in the potential of the wiring 152 through which the output signal is transmitted.

For simple description, the potentials of the signals transmitted by the wirings and the nodes are described using two kinds of potentials, i.e., the high-level potential VH and the low-level potential VL. When the two kinds of potentials VH and VL are used as the potentials of signals transmitted by the wirings and the nodes, the number of generated potentials can be reduced. Accordingly, the scale of the circuit generating the potentials can be reduced. Note that in this embodiment, even when wirings are described as having the same potential VH, the wirings may have not the equal potential but different potentials. Similarly, even when wirings are described as having the same potential VL, the wiring may have not the equal potential but different potentials. The same can apply to the description of the second operation to be described later.

The operation in the period T1 is described.

The potential of the node ND1 is described. Since the potential of the wiring 159 becomes VH, the transistor 108 is turned on. Since the potential of the wiring 160 is VL, the transistor 109 is off. In addition, the potential of the node ND3 becomes VL as described later; accordingly, the transistor 103 is turned off. Therefore, the potential VH of the wiring 155 is transmitted to the node ND1 through the transistor 108, and the potential of the node ND1 increases from VL. Then, when the potential of the node ND1 reaches a value (VH−Vth108) obtained by subtracting the threshold voltage of the transistor 108 (Vth108) from the potential of the gate of the transistor 108 (VH), the transistor 108 is turned off. Thus, the node ND1 is brought into a floating state, and the potential of the node ND1 is kept at (VH−Vth108).

The potential of the node ND2 is described. Since the potential of the wiring 156 becomes VL, the transistor 106 is turned off. Since the potential of the wiring 158 becomes VH, the transistor 107 is turned on. Therefore, the potential VL of the wiring 157 is transmitted to the node ND2 through the transistor 107, and the potential of the node ND2 becomes VL.

The potential of the node ND3 is described. Since the potential of the node ND2 becomes VL, the transistor 104 is turned off. Since the potential of the node ND1 is (VH−Vth108), the transistor 105 is turned on. Therefore, the potential of the wiring 153 is transmitted to the node ND3 through the transistor 105, and the potential of the node ND3 becomes VL.

The potential of the wiring 152 is described. Since the potential of the node ND1 is (VH−Vth108), the transistor 101 is turned on. Since the potential of the node ND3 becomes VL, the transistor 102 is turned off. Therefore, the potential VL of the wiring 151 is transmitted to the wiring 152 through the transistor 101, and the potential of the wiring 152 is VL. In other words, the output signal of the circuit 100 remains VL.

The operation in the period T2 is described.

The potential of the node ND1 is described. Since the potential of the wiring 159 becomes VL, the transistor 108 is turned off. Since the potential of the wiring 160 is VL, the transistor 109 is off. In addition, the potential of the node ND3 is VL as described later; accordingly, the transistor 103 remains off. As a result, the node ND1 is brought into a floating state, and the potential of the node ND1 is kept at (VH−Vth108).

The potential of the node ND2 is described. Since the potential of the wiring 156 is VL, the transistor 106 is off. Since the potential of the wiring 158 becomes VL, the transistor 107 is turned off. Accordingly, the node ND2 is brought into a floating state, and the potential of the node ND2 is kept at VL.

The potential of the node ND3 is described. Since the potential of the node ND2 is VL, the transistor 104 is off. Since the potential of the node ND1 is (VH−Vth108), the transistor 105 is on. Therefore, the potential VL of the wiring 153 is transmitted to the node ND3 through the transistor 105, and the potential of the node ND3 remains VL.

The potential of the wiring 152 is described. Since the potential of the node ND1 is (VH−Vth108), the transistor 101 is on. Since the potential of the node ND3 is VL, the transistor 102 is off. Therefore, the potential VH of the wiring 151 is transmitted to the wiring 152 through the transistor 101, and the potential of the wiring 152 starts increasing from VL. At this time, the capacitor 110 holds a difference in potential between the wiring 152 and the node ND1, and the node ND1 is in a floating state. Therefore, the potential of the node ND1 increases from (VH−Vth108) in accordance with the increase in the potential of the wiring 152. When the potential of the node ND1 becomes higher than the sum (VH+Vth101) of the potential of one of the source and the drain of the transistor 101 (VH: the potential of the wiring 151) and the threshold voltage of the transistor 101 (Vth101), the potential of the wiring 152 increases to VH. In other words, the output signal of the circuit 100 becomes VH.

The operation in the period T3 is described.

The potential of the node ND1 is described. Since the potential of the wiring 159 is VL, the transistor 108 is off. Since the potential of the wiring 160 becomes VH, the transistor 109 is turned on. In addition, the potential of the node ND3 becomes VH as described later; accordingly, the transistor 103 is turned on. Therefore, the potential VL of the wiring 157 is transmitted to the node ND1 through the transistor 109, and in addition, the potential VL of the wiring 153 is transmitted to the node ND1 through the transistor 103; as a result, the potential of the node ND1 becomes VL.

The potential of the node ND2 is described. Since the potential of the wiring 156 becomes VH, the transistor 106 is turned on. Since the potential of the wiring 158 is VL, the transistor 107 is off. Therefore, the potential VH of the wiring 155 is transmitted to the node ND2 through the transistor 106, and the potential of the node ND2 increases from VL. Then, when the potential of the node ND2 reaches a value (VH−Vth106) obtained by subtracting the threshold voltage of the transistor 106 (Vth106) from the potential of the gate of the transistor 106 (VH: the potential of the wiring 156), the transistor 106 is turned off. Thus, the node ND2 is brought into a floating state, and the potential of the node ND2 is kept at (VH−Vth106).

The potential of the node ND3 is described. Since the potential of the node ND2 becomes (VH−Vth106), the transistor 104 is turned on. Since the potential of the node ND1 becomes VL, the transistor 105 is turned off. Therefore, the potential of the wiring 154 is transmitted to the node ND3 through the transistor 104, and the potential of the node ND3 increases. At this time, a difference in potential between the node ND3 and the node ND2 is held by a parasitic capacitance between the gate of the transistor 104 and the other of the source and the drain thereof, and the node ND2 is in a floating state. Accordingly, the potential of the node ND2 increases in accordance with the increase in the potential of the node ND3. When the potential of the node ND2 becomes higher than the sum (VH+Vth104) of the potential of one of the source and the drain of the transistor 104 (VH: the potential of the wiring 154) and the threshold voltage of the transistor 104 (Vth104), the potential of the node ND3 increases to VH.

The potential of the wiring 152 is described. Since the potential of the node ND1 becomes VL, the transistor 101 is turned off. Since the potential of the node ND3 becomes VH, the transistor 102 is turned on. Therefore, the potential VL of the wiring 153 is transmitted to the wiring 152 through the transistor 102, and the potential of the wiring 152 becomes VL. In other words, the output signal of the circuit 100 is VL.

The operation in the period T4 is described.

The potential of the node ND1 is described. Since the potential of the wiring 159 is VL, the transistor 108 is off.

Since the potential of the wiring 160 becomes VL, the transistor 109 is turned off. In addition, the potential of the node ND3 becomes VH as described later; accordingly, the transistor 103 is turned on. Therefore, the potential VL of the wiring 153 is transmitted to the node ND1 through the transistor 103; as a result, the potential of the node ND1 remains VL.

The potential of the node ND2 is described. Since the potential of the wiring 156 becomes VL, the transistor 106 is turned off. Since the potential of the wiring 158 becomes VH, the transistor 107 is turned on. Therefore, the potential VL of the wiring 157 is transmitted to the node ND2 through the transistor 107, and the potential of the node ND2 becomes VL.

The potential of the node ND3 is described. Since the potential of the node ND2 becomes VL, the transistor 104 is turned off. Since the potential of the node ND1 is VL, the transistor 105 is off. Therefore, the node ND3 is brought into a floating state, and the potential of the node ND3 is kept at VH. Note that the potential of the node ND3 is often lower than VH owing to the decrease in the potential of the node ND2.

The potential of the wiring 152 is described. Since the potential of the node ND1 is VL, the transistor 101 is off. Since the potential of the node ND3 is VH, the transistor 102 is on. Therefore, the potential VL of the wiring 153 is transmitted to the wiring 152 through the transistor 102, and the potential of the wiring 152 becomes VL. In other words, the output signal of the circuit 100 is VL.

The operation in the period T5 is described.

The potential of the node ND1 is described. Since the potential of the wiring 159 is VL, the transistor 108 is off. Since the potential of the wiring 160 is VL, the transistor 109 is off. In addition, the potential of the node ND3 is VH as described later; accordingly, the transistor 103 is on. Therefore, the potential VL of the wiring 153 is transmitted to the node ND1 through the transistor 103; as a result, the potential of the node ND1 remains VL.

The potential of the node ND2 is described. Since the potential of the wiring 156 is VL, the transistor 106 is off. Since the potential of the wiring 158 becomes VL, the transistor 107 is turned off. Accordingly, the node ND2 is brought into a floating state, and the potential of the node ND2 is kept at VL.

The potential of the node ND3 is described. Since the potential of the node ND2 is VL, the transistor 104 is off. Since the potential of the node ND1 is VL, the transistor 105 is off. Therefore, the node ND3 is brought into a floating state, and the potential of the node ND3 is kept at VH.

The potential of the wiring 152 is described. Since the potential of the node ND1 is VL, the transistor 101 is off. Since the potential of the node ND3 is VH, the transistor 102 is on. Therefore, the potential VL of the wiring 153 is transmitted to the wiring 152 through the transistor 102, and the potential of the wiring 152 is VL. In other words, the output signal of the circuit 100 is VL.

The operation in the period T6 is described.

The potential of the node ND1 is described. Since the potential of the wiring 159 is VL, the transistor 108 is off. Since the potential of the wiring 160 is VL, the transistor 109 is off. In addition, the potential of the node ND3 is VH as described later; accordingly, the transistor 103 is on. Therefore, the potential VL of the wiring 153 is transmitted to the node ND1 through the transistor 103; as a result, the potential of the node ND1 remains VL.

The potential of the node ND2 is described. Since the potential of the wiring 156 becomes VH, the transistor 106 is turned on. Since the potential of the wiring 158 is VL, the transistor 107 is off. Therefore, the potential VH of the wiring 155 is transmitted to the node ND2 through the transistor 106, and the potential of the node ND2 increases from VL. Then, when the potential of the node ND2 reaches a value (VH−Vth106) obtained by subtracting the threshold voltage of the transistor 106 from the potential of the gate of the transistor 106 (VH: the potential of the wiring 156), the transistor 106 is turned off. Thus, the node ND2 is brought into a floating state, and the potential of the node ND2 is kept at (VH−Vth106).

The potential of the node ND3 is described. Since the potential of the node ND2 becomes (VH−Vth106), the transistor 104 is turned on. Since the potential of the node ND1 is VL, the transistor 105 is off. Therefore, the potential VH of the wiring 154 is transmitted to the node ND3 through the transistor 104, and the potential of the node ND3 increases. At this time, a difference in potential between the node ND3 and the node ND2 is held by a parasitic capacitance between the gate of the transistor 104 and the other of the source and the drain thereof, and the node ND2 is in a floating state. Accordingly, the potential of the node ND2 increases in accordance with the increase in the potential of the node ND3. When the potential of the node ND2 becomes higher than the sum (VH+Vth104) of the potential of one of the source and the drain of the transistor 104 (VH: the potential of the wiring 154) and the threshold voltage of the transistor 104 (Vth104), the potential of the node ND3 increases to VH.

The potential of the wiring 152 is described. Since the potential of the node ND1 is VL, the transistor 101 is off. Since the potential of the node ND3 is VH, the transistor 102 is on. Therefore, the potential of the wiring 153 is transmitted to the wiring 152 through the transistor 102, and the potential of the wiring 152 is VL. In other words, the output signal of the circuit 100 is VL.

The first operation has been described so far. In a semiconductor device including a plurality of circuits 100, an output signal can be transmitted in the first scan direction. For example, in a semiconductor device where the circuits 100 are provided in the (n−1)-th stage, the n-th stage, and the (n+1)-th stage (n is a natural number of 2 or more), an output signal can be output from the circuits 100 in the first scan direction, i.e., from the (n−1)-th circuit 100, the n-th circuit 100, and the (n+1)-th circuit 100 in this order.

Specifically, the n-th circuit 100 can output the output signal in the first scan direction by setting the potential of the wiring 155 at VH, the potential of the wiring 157 at VL, the signal transmitted to the wiring 159 to be the output signal from the (n−1)-th stage circuit 100, and the signal transmitted to the wiring 160 to be the output signal from the (n+1)-th stage circuit 100.

<Second Operation>

Next, the second operation is described with reference to FIG. 3. The second operation is performed under the conditions where the wiring 155 is set at the potential VL and the wiring 157 is set at the potential VH. The second operation in periods t1 to t6 is described. The operation in those periods is described by following changes in the potentials of the nodes ND1 to ND3 and a change in the potential of the wiring 152 through which the output signal is transmitted.

The operation in the period t1 is described.

The potential of the node ND1 is described. Since the potential of the wiring 159 is VL, the transistor 108 is off. Since the potential of the wiring 160 becomes VH, the transistor 109 is turned on. In addition, the potential of the node ND3 becomes VL as described later; accordingly, the transistor 103 is turned off. Therefore, the potential VH of the wiring 157 is transmitted to the node ND1 through the transistor 109, and the potential of the node ND1 increases from VL. Then, when the potential of the node ND1 reaches a value (VH−Vth109) obtained by subtracting the threshold voltage of the transistor 109 (Vth109) from the potential of the gate of the transistor 109 (VH; the potential of the wiring 160), the transistor 109 is turned off. Thus, the node ND1 is brought into a floating state, and the potential of the node ND1 is kept at (VH−Vth109).

The potential of the node ND2 is described. Since the potential of the wiring 156 becomes VH, the transistor 106 is turned on. Since the potential of the wiring 158 becomes VL, the transistor 107 is turned off. Therefore, the potential VL of the wiring 155 is transmitted to the node ND2 through the transistor 106, and the potential of the node ND2 becomes VL.

The potential of the node ND3 is described. Since the potential of the node ND2 becomes VL, the transistor 104 is turned off. Since the potential of the node ND1 is (VH−Vth109), the transistor 105 is turned on. Therefore, the potential VL of the wiring 153 is transmitted to the node ND3 through the transistor 105, and the potential of the node ND3 becomes VL.

The potential of the wiring 152 is described. Since the potential of the node ND1 is (VH−Vth109), the transistor 101 is on. Since the potential of the node ND3 becomes VL, the transistor 102 is turned off. Therefore, the potential VL of the wiring 151 is transmitted to the wiring 152 through the transistor 101, and the potential of the wiring 152 is VL. In other words, the output signal of the circuit 100 is VL.

The operation in the period t2 is described.

The potential of the node ND1 is described. Since the potential of the wiring 159 is VL, the transistor 108 is off. Since the potential of the wiring 160 becomes VL, the transistor 109 is turned off. In addition, the potential of the node ND3 remains VL as described later; accordingly, the transistor 103 is off. As a result, the node ND1 is brought into a floating state, and the potential of the node ND1 is kept at (VH−Vth109).

The potential of the node ND2 is described. Since the potential of the wiring 156 becomes VL, the transistor 106 is turned off. Since the potential of the wiring 158 is VL, the transistor 107 is off. Accordingly, the node ND2 is brought into a floating state, and the potential of the node ND2 is kept at VL.

The potential of the node ND3 is described. Since the potential of the node ND2 is VL, the transistor 104 is off. Since the potential of the node ND1 becomes (VH−Vth109), the transistor 105 is on. Therefore, the potential VL of the wiring 153 is transmitted to the node ND3 through the transistor 105, and the potential of the node ND3 is VL.

The potential of the wiring 152 is described. Since the potential of the node ND1 becomes (VH−Vth109), the transistor 101 is on. Since the potential of the node ND3 is VL, the transistor 102 is off. Therefore, the potential VH of the wiring 151 is transmitted to the wiring 152 through the transistor 101, and the potential of the wiring 152 starts increasing from VL. At this time, the capacitor 110 holds a difference in potential between the wiring 152 and the node ND1, and the node ND1 is in a floating state. Therefore, the potential of the node ND1 increases from (VH−Vth109) in accordance with the increase in the potential of the wiring 152. When the potential of the node ND1 becomes higher than the sum (VH+Vth101) of the potential of one of the source and the drain of the transistor 101 (VH: the potential of the wiring 151) and the threshold voltage of the transistor 101 (Vth101), the potential of the wiring 152 increases to VH. In other words, the output signal of the circuit 100 becomes VH.

The operation in the period t3 is described.

The potential of the node ND1 is described. Since the potential of the wiring 159 becomes VH, the transistor 108 is turned on. Since the potential of the wiring 160 is VL, the transistor 109 is off. In addition, the potential of the node ND3 becomes VH as described later; accordingly, the transistor 103 is turned on. Therefore, the potential VL of the wiring 155 is transmitted to the node ND1 through the transistor 108, and in addition, the potential VL of the wiring 153 is transmitted to the node ND1 through the transistor 103; as a result, the potential of the node ND1 becomes VL.

The potential of the node ND2 is described. Since the potential of the wiring 156 is VL, the transistor 106 is off. Since the potential of the wiring 158 becomes VH, the transistor 107 is turned on. Therefore, the potential VH of the wiring 157 is transmitted to the node ND2 through the transistor 107, and the potential of the node ND2 increases from VL. Then, when the potential of the node ND2 reaches a value (VH−Vth107) obtained by subtracting the threshold voltage of the transistor 107 (Vth107) from the potential of the gate of the transistor 107 (VH: the potential of the wiring 158), the transistor 107 is turned off. Thus, the node ND2 is brought into a floating state, and the potential of the node ND2 is kept at (VH−Vth107).

The potential of the node ND3 is described. Since the potential of the node ND2 becomes (VH−Vth107), the transistor 104 is turned on. Since the potential of the node ND1 becomes VL, the transistor 105 is turned off. Therefore, the potential VH of the wiring 154 is transmitted to the node ND3 through the transistor 104, and the potential of the node ND3 increases. At this time, a difference in potential between the node ND3 and the node ND2 is held by a parasitic capacitance between the gate of the transistor 104 and the other of the source and the drain thereof, and the node ND2 is in a floating state. Accordingly, the potential of the node ND2 increases in accordance with the increase in the potential of the node ND3. When the potential of the node ND2 becomes higher than the sum (VH+Vth104) of the potential of one of the source and the drain of the transistor 104 (VH: the potential of the wiring 154) and the threshold voltage of the transistor 104 (Vth104), the potential of the node ND3 increases to VH.

The potential of the wiring 152 is described. Since the potential of the node ND1 becomes VL, the transistor 101 is turned off. Since the potential of the node ND3 becomes VH, the transistor 102 is turned on. Therefore, the potential of the wiring 153 is transmitted to the wiring 152 through the transistor 102, and the potential of the wiring 152 becomes VL. In other words, the output signal of the circuit 100 becomes VL.

The operation in the period t4 is described.

The potential of the node ND1 is described. Since the potential of the wiring 159 becomes VL, the transistor 108 is turned off. Since the potential of the wiring 160 is VL, the transistor 109 is off. In addition, the potential of the node ND3 is VH as described later; accordingly, the transistor 103 is on. Therefore, the potential VL of the wiring 153 is transmitted to the node ND1 through the transistor 103; as a result, the potential of the node ND1 remains VL.

The potential of the node ND2 is described. Since the potential of the wiring 156 becomes VH, the transistor 106 is turned on. Since the potential of the wiring 158 becomes VL, the transistor 107 is turned off. Therefore, the potential VL of the wiring 155 is transmitted to the node ND2 through the transistor 106, and the potential of the node ND2 becomes VL.

The potential of the node ND3 is described. Since the potential of the node ND2 becomes VL, the transistor 104 is turned off. Since the potential of the node ND1 is VL, the transistor 105 is off. Therefore, the node ND3 is brought into a floating state, and the potential of the node ND3 is kept at VH. Note that the potential of the node ND3 is often lower than VH owing to the decrease in the potential of the node ND2.

The potential of the wiring 152 is described. Since the potential of the node ND1 is VL, the transistor 101 is off. Since the potential of the node ND3 is VH, the transistor 102 is on. Therefore, the potential VL of the wiring 153 is transmitted to the wiring 152 through the transistor 102, and the potential of the wiring 152 becomes VL. In other words, the output signal of the circuit 100 is VL.

The operation in the period t5 is described.

The potential of the node ND1 is described. Since the potential of the wiring 159 is VL, the transistor 108 is off. Since the potential of the wiring 160 is VL, the transistor 109 is off. In addition, the potential of the node ND3 is VH as described later; accordingly, the transistor 103 is on. Therefore, the potential VL of the wiring 153 is transmitted to the node ND1 through the transistor 103; as a result, the potential of the node ND1 remains VL.

The potential of the node ND2 is described. Since the potential of the wiring 156 becomes VL, the transistor 106 is turned off. Since the potential of the wiring 158 is VL, the transistor 107 is off. Accordingly, the node ND2 is brought into a floating state, and the potential of the node ND2 is kept at VL.

The potential of the node ND3 is described. Since the potential of the node ND2 is VL, the transistor 104 is off. Since the potential of the node ND1 is VL, the transistor 105 is off. Therefore, the node ND3 is brought into a floating state, and the potential of the node ND3 is kept at VH.

The potential of the wiring 152 is described. Since the potential of the node ND1 is VL, the transistor 101 is off. Since the potential of the node ND3 is VH, the transistor 102 is on. Therefore, the potential of the wiring 153 is transmitted to the wiring 152 through the transistor 102, and the potential of the wiring 152 is VL. In other words, the output signal of the circuit 100 is VL.

The operation in the period t6 is described.

The potential of the node ND1 is described. Since the potential of the wiring 159 is VL, the transistor 108 is off. Since the potential of the wiring 160 is VL, the transistor 109 is off. In addition, the potential of the node ND3 is VH as described later; accordingly, the transistor 103 is on. Therefore, the potential VL of the wiring 153 is transmitted to the node ND1 through the transistor 103; as a result, the potential of the node ND1 remains VL.

The potential of the node ND2 is described. Since the potential of the wiring 156 is VL, the transistor 106 is off. Since the potential of the wiring 158 becomes VH, the transistor 107 is turned on. Therefore, the potential VH of the wiring 157 is transmitted to the node ND2 through the transistor 107, and the potential of the node ND2 increases from VL. Then, when the potential of the node ND2 reaches a value (VH−Vth107) obtained by subtracting the threshold voltage of the transistor 107 from the potential of the gate of the transistor 107 (VH: the potential of the wiring 158), the transistor 107 is turned off. Thus, the node ND2 is brought into a floating state, and the potential of the node ND2 is kept at (VH−Vth107).

The potential of the node ND3 is described. Since the potential of the node ND2 becomes (VH−Vth107), the transistor 104 is turned on. Since the potential of the node ND1 is VL, the transistor 105 is off. Therefore, the potential VH of the wiring 154 is transmitted to the node ND3 through the transistor 104, and the potential of the node ND3 increases. At this time, a difference in potential between the node ND3 and the node ND2 is held by a parasitic capacitance between the gate of the transistor 104 and the other of the source and the drain thereof, and the node ND2 is in a floating state. Accordingly, the potential of the node ND2 increases in accordance with the increase in the potential of the node ND3. When the potential of the node ND2 becomes higher than the sum (VH+Vth104) of the potential of one of the source and the drain of the transistor 104 (VH: the potential of the wiring 154) and the threshold voltage of the transistor 104 (Vth104), the potential of the node ND3 increases to VH.

The potential of the wiring 152 is described. Since the potential of the node ND1 is VL, the transistor 101 is off. Since the potential of the node ND3 is VH, the transistor 102 is on. Therefore, the potential VL of the wiring 153 is transmitted to the wiring 152 through the transistor 102, and the potential of the wiring 152 is VL. In other words, the output signal of the circuit 100 is VL.

The second operation has been described so far. In a semiconductor device including a plurality of circuits 100, an output signal can be transmitted in the second scan direction. For example, in a semiconductor device where the circuits 100 are provided in the (n−1)-th stage, the n-th stage, and the (n+1)-th stage (n is a natural number of 2 or more), an output signal can be output from the circuits 100 in the second scan direction that is opposite to the first scan direction, i.e., from the (n+1)-th circuit 100, the n-th circuit 100, and the (n−1)-th circuit 100 in this order.

Specifically, the n-th circuit 100 can output the output signal in the second scan direction by setting the potential of the wiring 157 at VH, the potential of the wiring 155 at VL, the signal transmitted to the wiring 159 to be the output signal from the (n−1)-th circuit 100, and the signal transmitted to the wiring 160 to be the output signal from the (n+1)-th circuit 100.

<Summary>

The operation of the circuit 100 described above enables the semiconductor device including the circuit 100 to switch the scan direction by changing the potentials of the wirings 155 and 157. A semiconductor device having a display function provided with such a function of changing the scan direction can change the orientation of the display.

In the operation of the circuit 100, the potential of the wiring 152 can be increased by bringing the node ND1 into a floating state. Therefore, even when the potential of the node ND1 is lower than VH, the potential of the wiring 152 can be boosted to VH and output. Accordingly, a malfunction of a circuit that operates with the output signal transmitted from the wiring 152 can be suppressed.

Furthermore, in the operation of the circuit 100, the potential of the node ND3 can be increased by bringing the node ND2 into a floating state. Therefore, even when the potential of the node ND2 is lower than VH, the potential of the node ND3 can be boosted to VH and output. Accordingly, malfunctions of the transistors 102 and 103, which are turned on or off depending on the potential of the node ND3, can be suppressed.

Embodiment 3

In this embodiment, variations of Embodiments 1 and 2 will be described.

Although an example of the circuit and an example of the operation are shown in Embodiments 1 and 2 with the use of the circuit configuration including the transistors 101 to 109 and the capacitor 110, one embodiment of the present invention is not limited to those examples. A circuit configuration with a different transistor and/or a different capacitor may be employed as well. Moreover, one embodiment of the present invention can have a variety of circuit configurations by employing an additional wiring or eliminating the existing wiring. Such variations will be described below.

Portions similar to those described in Embodiments 1 and 2 are not described in this embodiment.

<Variation 1>

Figure 4:
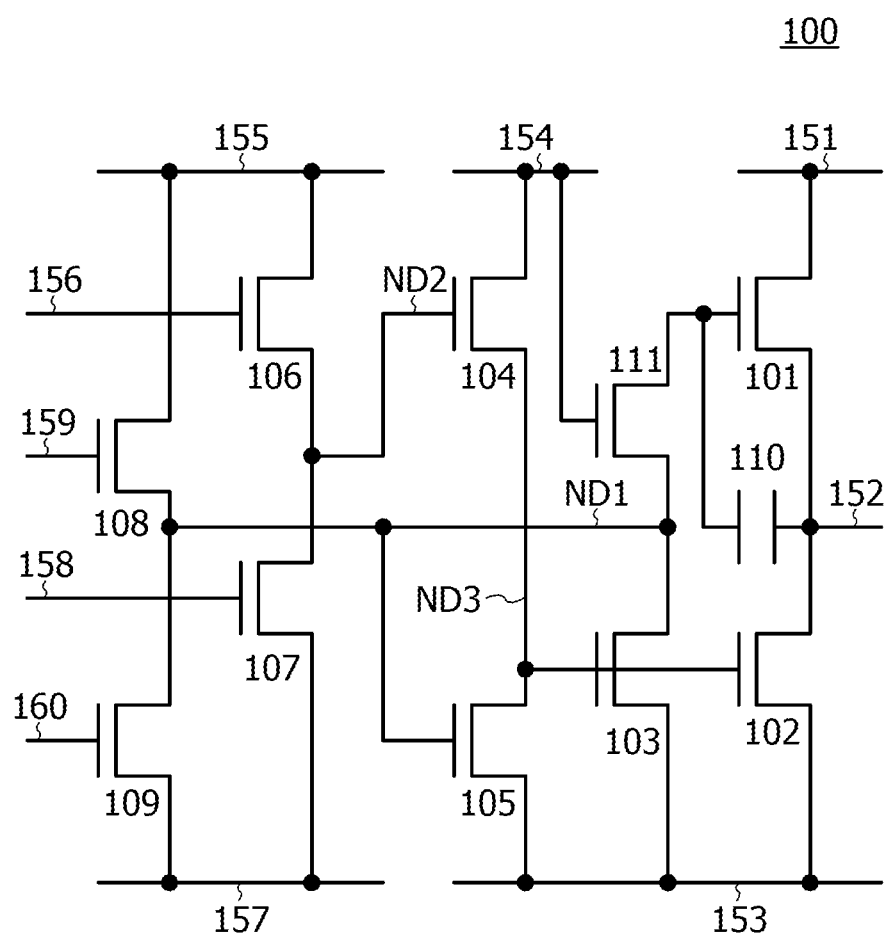
FIG. 4 is a circuit diagram illustrating one embodiment of the present invention.

A semiconductor device illustrated in FIG. 4 is different from the semiconductor device illustrated in FIG. 1 in that the circuit 100 includes a transistor 111.

A gate of the transistor 111 is connected to the wiring 154. One of a source and a drain of the transistor 111 is connected to the gate of the transistor 101 and the first electrode of the capacitor 110. The other of the source and the drain of the transistor 111 is connected to the other of the source and the drain of the transistor 103, the gate of the transistor 105, the other of the source and the drain of the transistor 108, and the other of the source and the drain of the transistor 109.

In the semiconductor device illustrated in FIG. 4, the transistor 111 is off in the period T2 and the period t2; therefore, the potential of the other of the source and the drain of the transistor 111 (the other of the source and the drain of the transistor 108) does not increase in accordance with the increase in the potential of the wiring 152. Thus, the application of a large voltage to the transistors 103, 105, 108, and 109 which are connected to the other of the source and the drain of the transistor 111 can be prevented, which leads to the prevention of those transistors' breakdown and change in characteristics.

Figure 5:
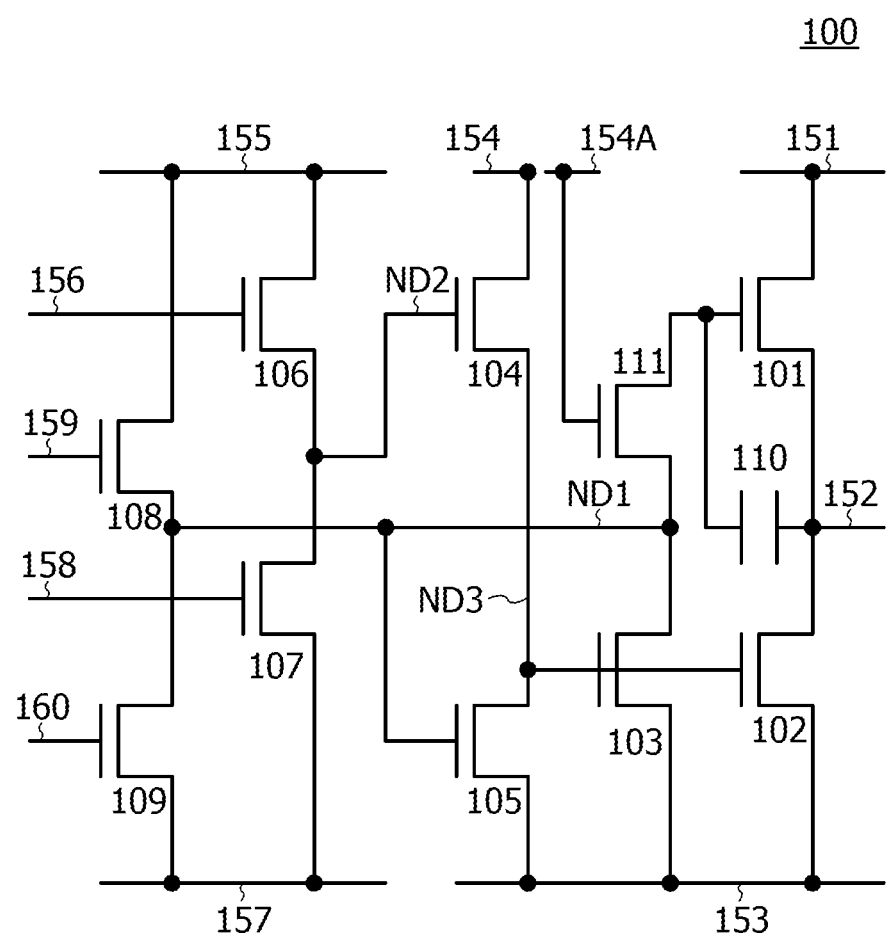
FIG. 5 is a circuit diagram illustrating one embodiment of the present invention.

Alternatively, the semiconductor device illustrated in FIG. 4 may have the configuration illustrated in FIG. 5. In FIG. 5, the gate of the transistor 111 is connected to a wiring 154A that is different from the wiring 154. In FIG. 5, the potential transmitted through the wiring 154A is set lower than the potential VH transmitted through the wiring 154. In this manner, the transistor 111 can be turned off at a point of time when the potential of one of the source and the drain of the transistor 111 is lower than (VH−Vth108) or (VH−Vth109) in the period T1 and the period t1. Accordingly, the gate of the transistor 101 can be brought into a floating state at an earlier timing, which leads to an improvement in operation speed.

<Variation 2>

Figure 6:
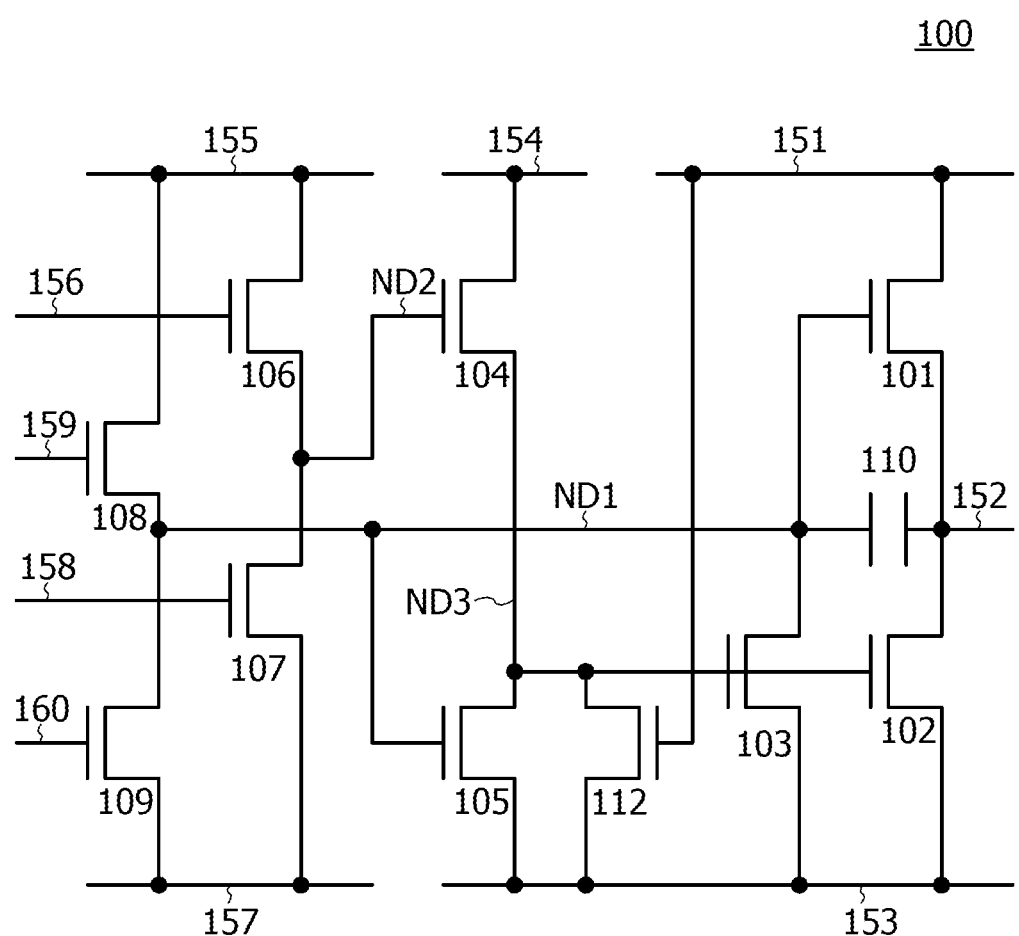
FIG. 6 is a circuit diagram illustrating one embodiment of the present invention.

A semiconductor device illustrated in FIG. 6 is different from the semiconductor device illustrated in FIG. 1 in that the circuit 100 includes a transistor 112.

A gate of the transistor 112 is connected to the wiring 151. One of a source and a drain of the transistor 112 is connected to the wiring 153. The other of the source and the drain of the transistor 112 is connected to the node ND3.

In the period T1, the period T3, the period T4, the period T6, the period t1, the period t3, the period t4, and the period t6, the transistor 112 is off because the potential of the wiring 151 is VL. In the period T2, the period T5, the period t2, and the period t5, the transistor 112 is on because the potential of the wiring 151 is VH; therefore, the potential VL of the wiring 153 is transmitted to the node ND3 through the transistor 112, and the potential of the node ND3 becomes VL. As a result, the transistors 102 and 103 are turned off. Since the transistors 102 and 103 can be off in the period T5 and the period t5, degradation in characteristics of the transistors 102 and 103 can be suppressed.

<Variation 3>

Figure 7:
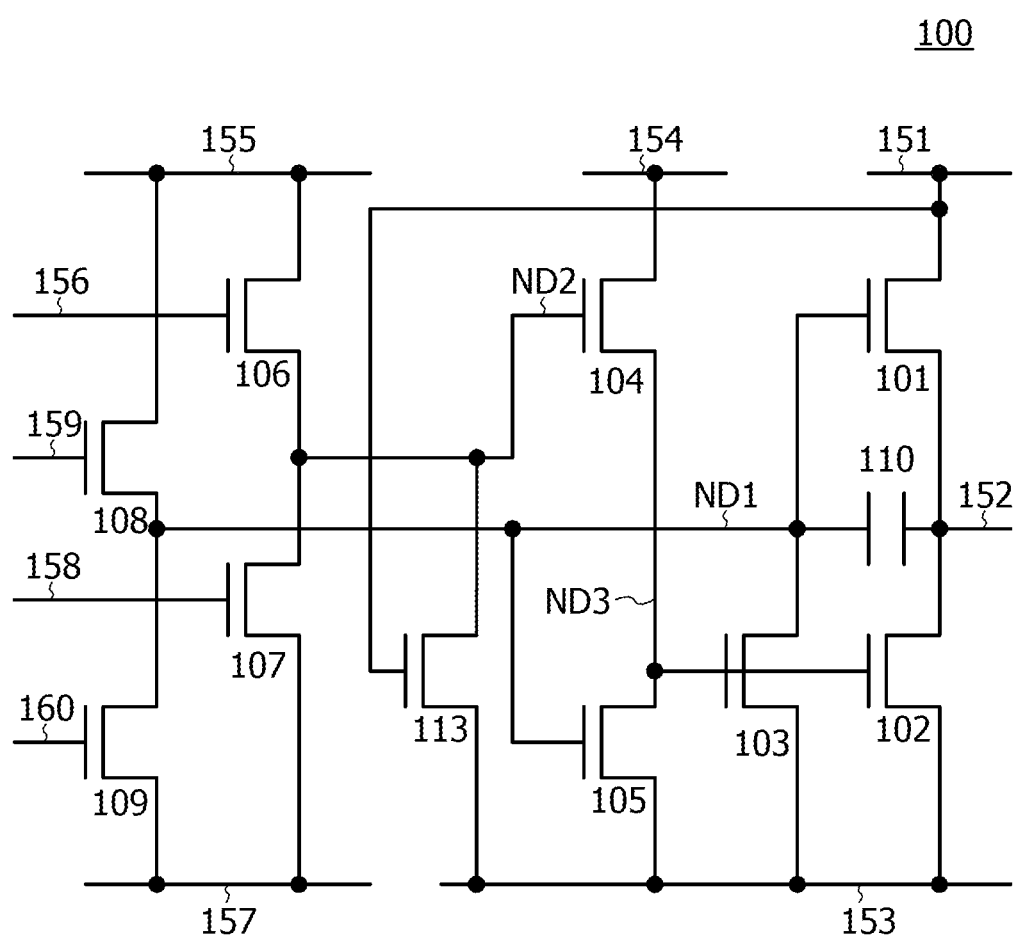
FIG. 7 is a circuit diagram illustrating one embodiment of the present invention.

A semiconductor device illustrated in FIG. 7 is different from the semiconductor device illustrated in FIG. 1 in that the circuit 100 includes a transistor 113.

A gate of the transistor 113 is connected to the wiring 151. One of a source and a drain of the transistor 113 is connected to the wiring 153. The other of the source and the drain of the transistor 113 is connected to the node ND2.

In the period T1, the period T3, the period T4, the period T6, the period t1, the period t3, the period t4, and the period t6, the transistor 113 is off because the potential of the wiring 151 is VL. In the period T2, the period T5, the period t2, and the period t5, the transistor 113 is turned on because the potential of the wiring 151 becomes VH; therefore, the potential VL of the wiring 153 is transmitted to the node ND2 through the transistor 113, and the potential of the node ND2 is VL. The transistor 104 is off. Since the transistor 104 can be off in the period T5 and the period t5, degradation in characteristics of the transistor 104 can be suppressed.

<Variation 4>

Figure 8:
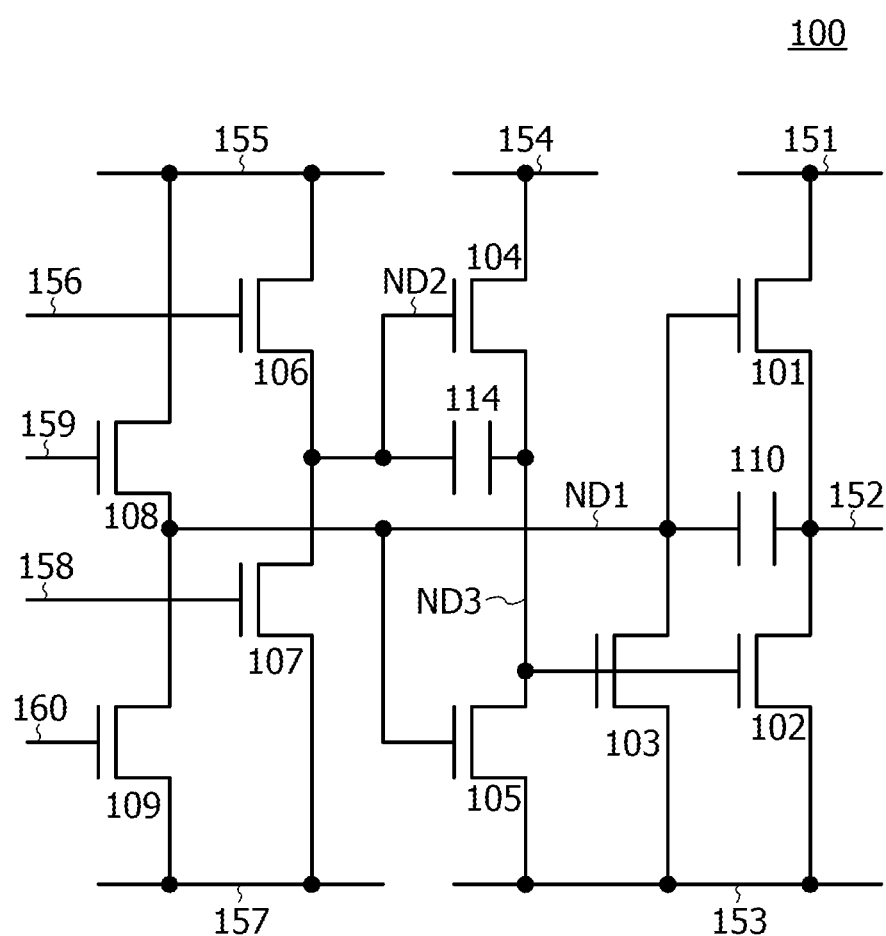
FIG. 8 is a circuit diagram illustrating one embodiment of the present invention.

A semiconductor device illustrated in FIG. 8 is different from the semiconductor device illustrated in FIG. 1 in that the circuit 100 includes a capacitor 114.

A first electrode of the capacitor 114 is connected to the node ND2. A second electrode of the capacitor 114 is connected to the node ND3.

In the period T3 and the period t3, the node ND2 is brought into a floating state; accordingly, the potential of the node ND3 is increased with a difference in potential between the node ND3 and the node ND2 held and thus the potential of the node ND2 is increased. At this time, if a parasitic capacitance between the gate of the transistor 104 and the other of the source and the drain thereof is small, the potential of the node ND2 is hard to increase. With the capacitor 114 between the gate of the transistor 104 and the other of the source and the drain thereof, the potential of the node ND2 can be easily increased. Thus, the potential of the node ND3 can be more surely set at VH to turn on the transistor 102, so that the error of the output signal from the circuit 100 can be reduced.

<Variation 5>

Figure 9:
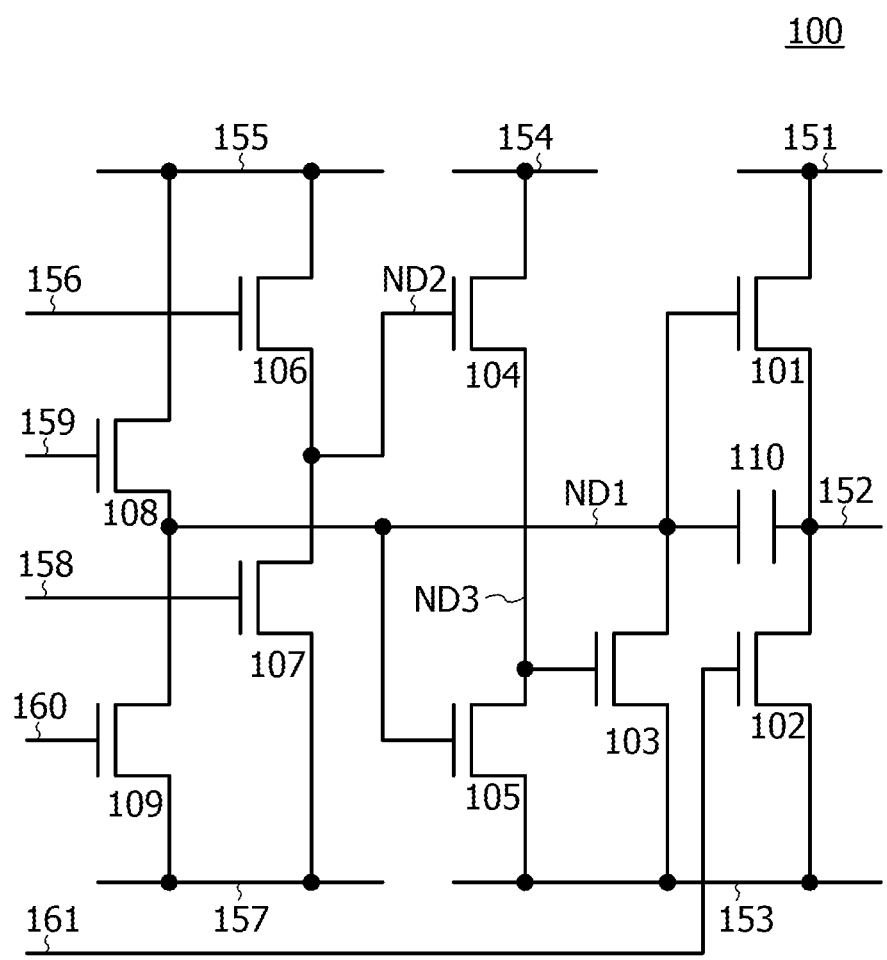
FIG. 9 is a circuit diagram illustrating one embodiment of the present invention.
Figure 10:
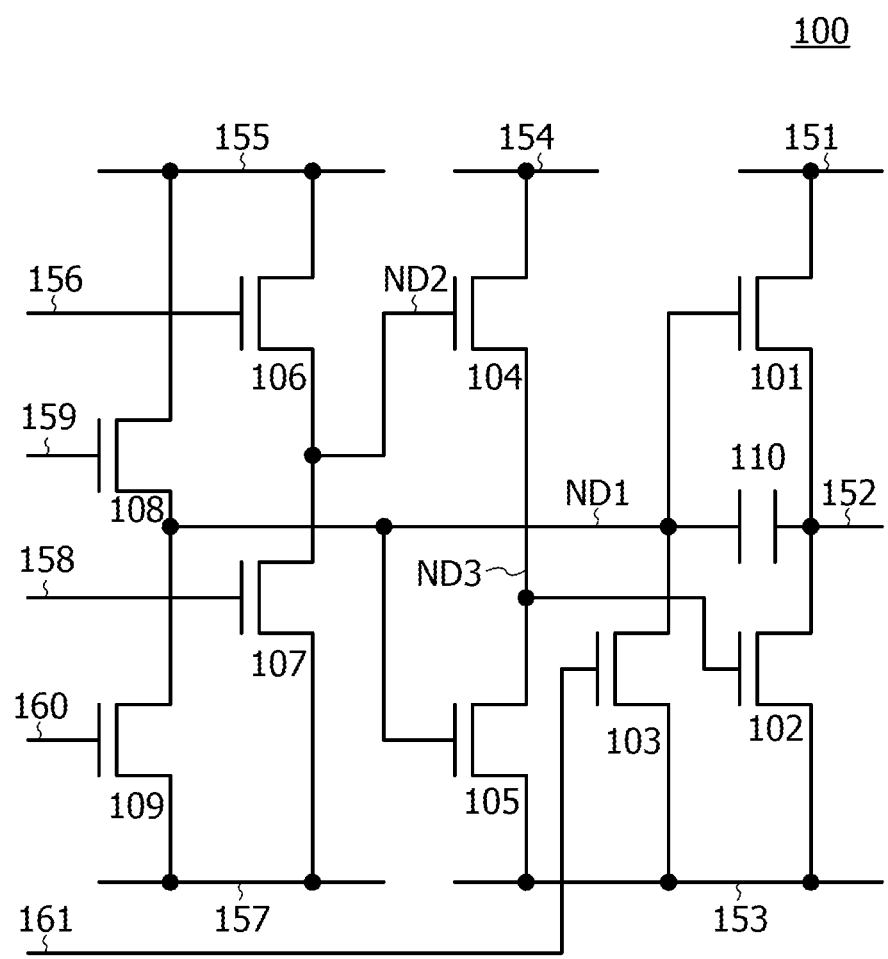
FIG. 10 is a circuit diagram illustrating one embodiment of the present invention.

A semiconductor device illustrated in FIG. 9 is different from the semiconductor device illustrated in FIG. 1 in that the gate of the transistor 102 is connected to a wiring 161. Similarly, a semiconductor device illustrated in FIG. 10 is different from the semiconductor device illustrated in FIG. 1 in that the gate of the transistor 103 is connected to the wiring 161.

The wiring 161 has a function of transmitting a signal having a high level and a low level. Specifically, for example, the wiring 161 has a function of transmitting a signal for making the transistor 102 or 103 in an on state in a period other than the period when the potential of the wiring 152 is VH in the first operation and the second operation. For example, a signal having VH may be transmitted to the wiring 161 at an arbitrary timing in the periods T4 to T6 and the periods t4 to t6. This signal is preferably a clock signal having a phase different from those of the first to third clock signals. The clock signal transmitted through the wiring 161 may be referred to as a fourth clock signal. With the configurations illustrated in FIG. 9 and FIG. 10, the potential of the wiring 152 can be more surely set at VL, so that the error of the output signal from the circuit 100 can be reduced.

Alternatively, in the semiconductor device illustrated in FIG. 9, the gate of the transistor 102 may be connected to the wiring 156 or the wiring 158.

<Variation 6>

Figure 11:
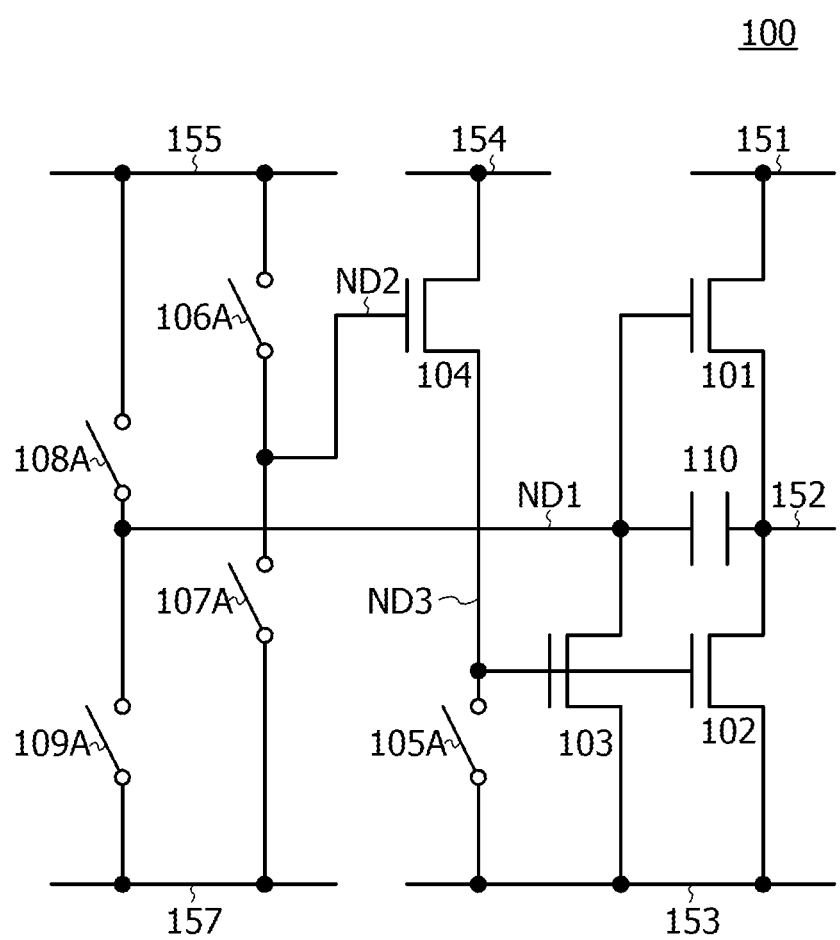
FIG. 11 is a circuit diagram illustrating one embodiment of the present invention.
Figure 12:
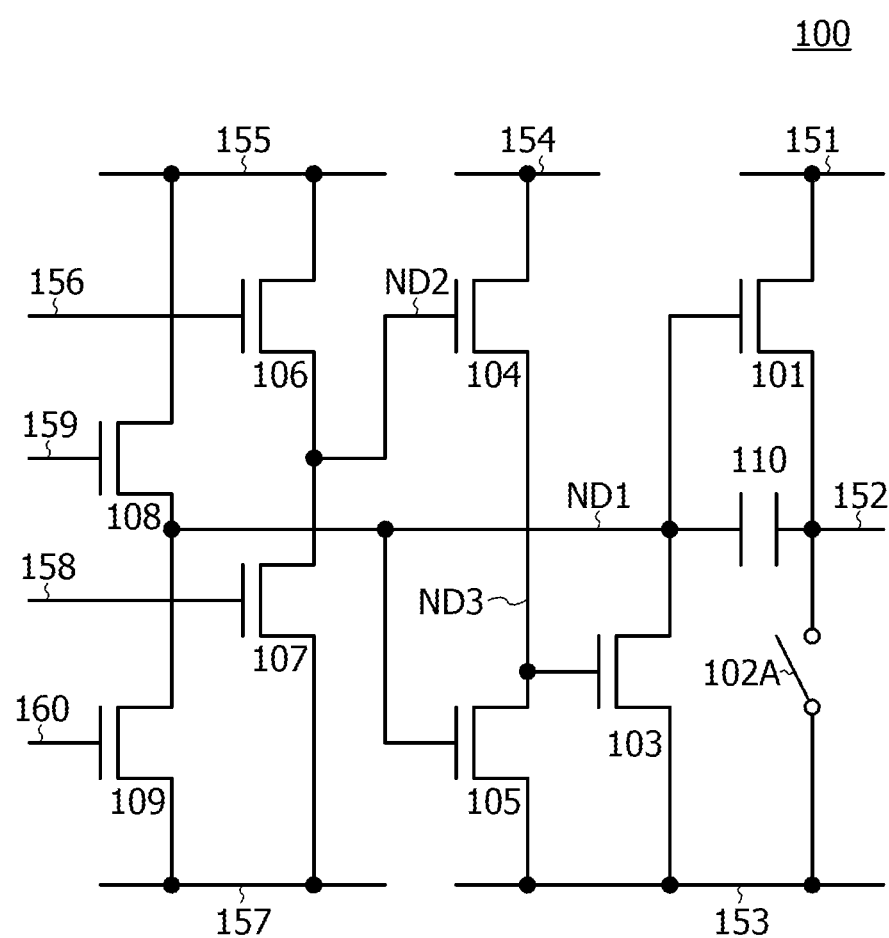
FIG. 12 is a circuit diagram illustrating one embodiment of the present invention.
Figure 13:
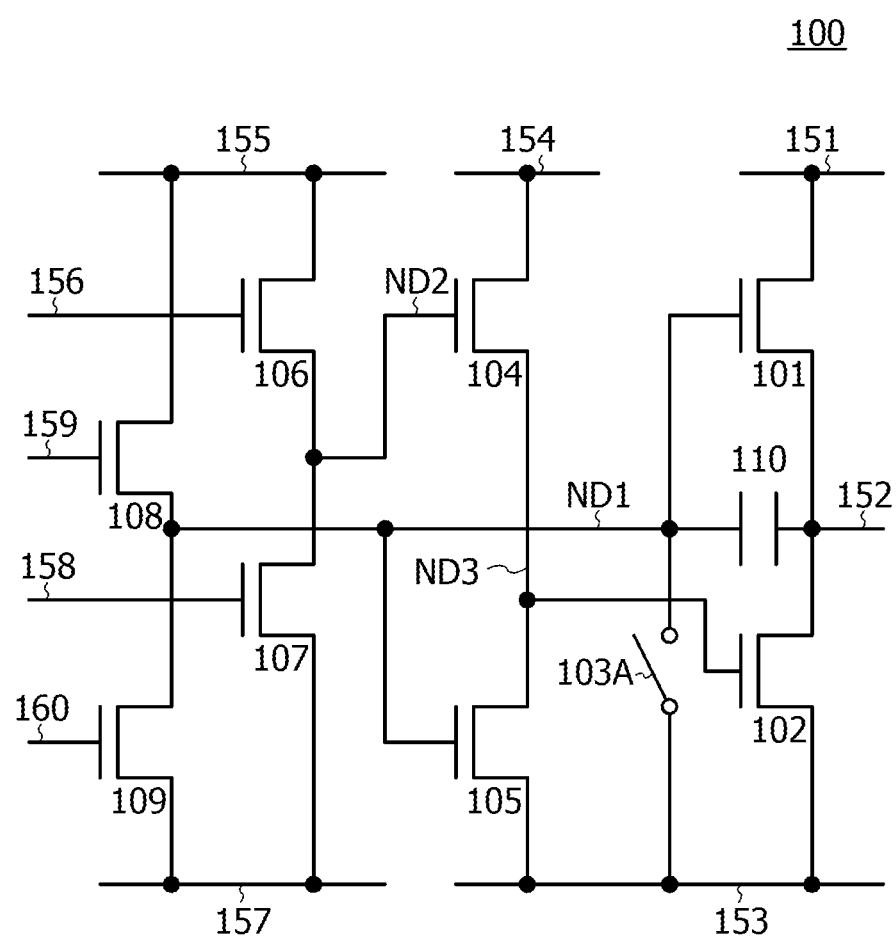
FIG. 13 is a circuit diagram illustrating one embodiment of the present invention.

A semiconductor device illustrated in FIG. 11 is different from the semiconductor device illustrated in FIG. 1 in that switches 105A to 109A are used instead of the transistors 105 to 109. A semiconductor device illustrated in FIG. 12 is different from the semiconductor device illustrated in FIG. 1 in that a switch 102A is used instead of the transistor 102. Similarly, a semiconductor device illustrated in FIG. 13 is different from the semiconductor device illustrated in FIG. 1 in that a switch 103A is used instead of the transistor 103.

The switches 102A, 103A, and 105A to 109A may be electrical switches or mechanical switches without being limited to transistors; thus, the degree of design flexibility can be increased.

<Variation 7>

Figure 14:
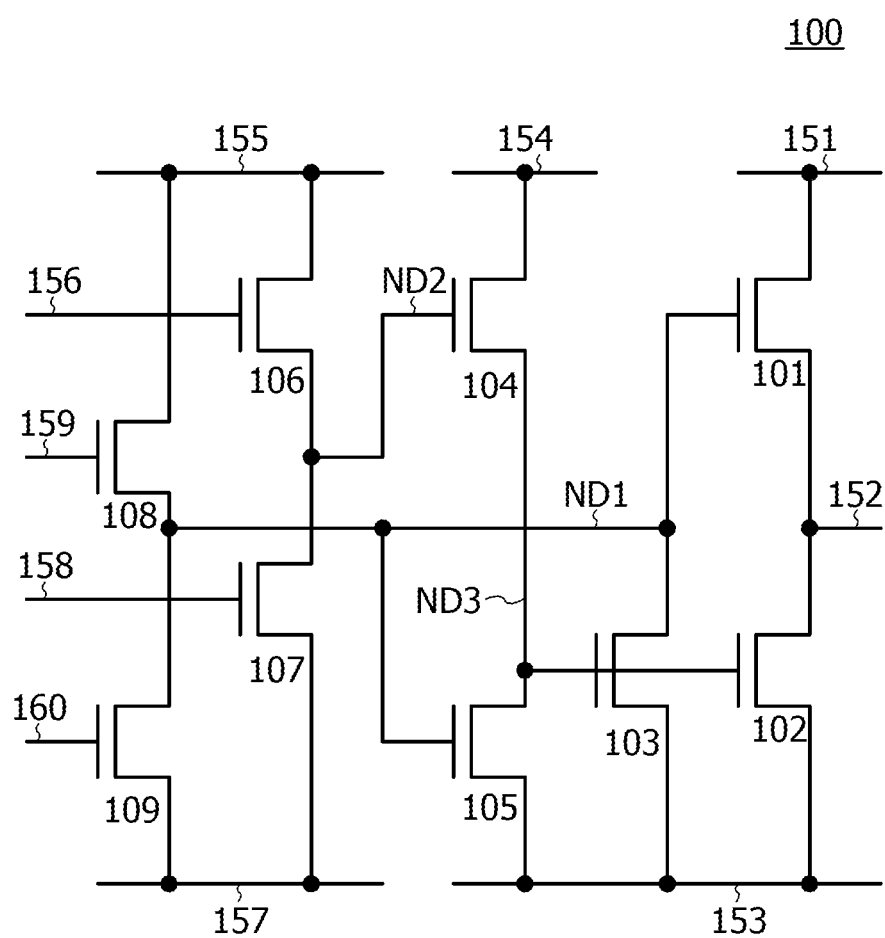
FIG. 14 is a circuit diagram illustrating one embodiment of the present invention.

A semiconductor device illustrated in FIG. 14 is different from the semiconductor device illustrated in FIG. 1 in not including the capacitor 110.

The capacitor 110 can be omitted in the semiconductor device illustrated in FIG. 14 by designing a large parasitic capacitance between the gate of the transistor 101 and the other of the source and the drain thereof. The omission of the capacitor can increase the degree of design flexibility and reduce the area occupied by the circuit 100.

<Variation 8>

Figure 15:
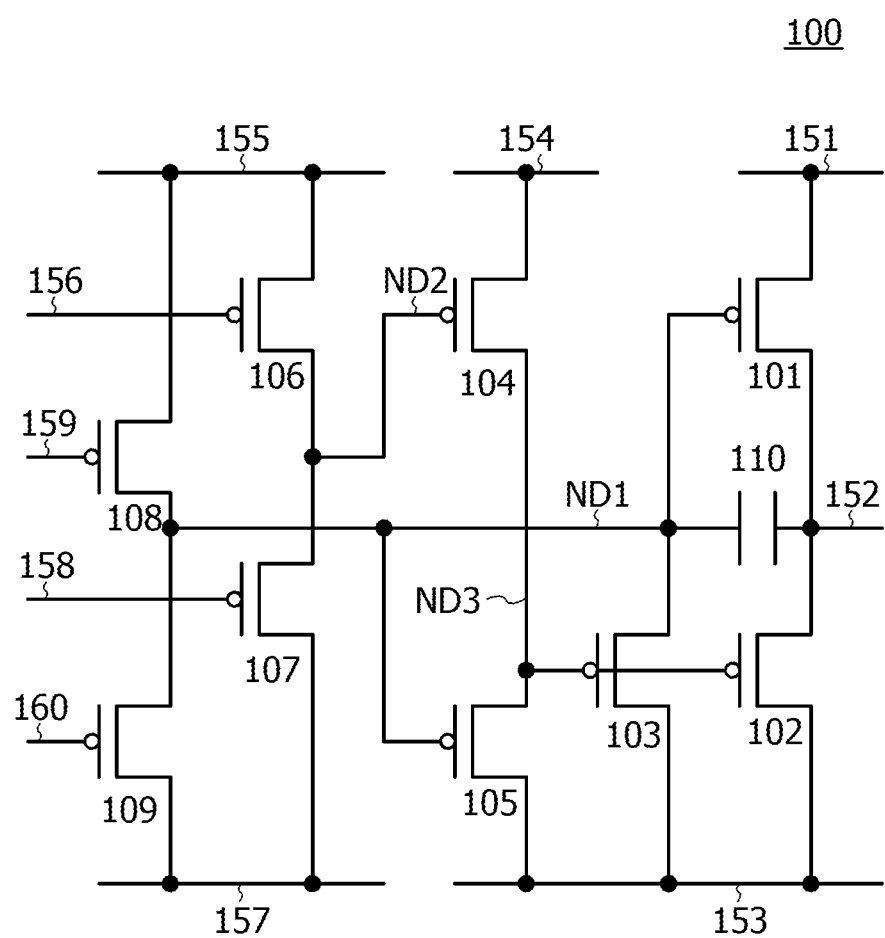
FIG. 15 is a circuit diagram illustrating one embodiment of the present invention.

A semiconductor device illustrated in FIG. 15 is different from the semiconductor device illustrated in FIG. 1 in that the transistors 101 to 109 are p-channel transistors.

In the semiconductor device illustrated in FIG. 15, the transistors in the circuit 100 can be formed using a semiconductor material that can form only p-channel transistors.

<Variation 9>

Figure 16:
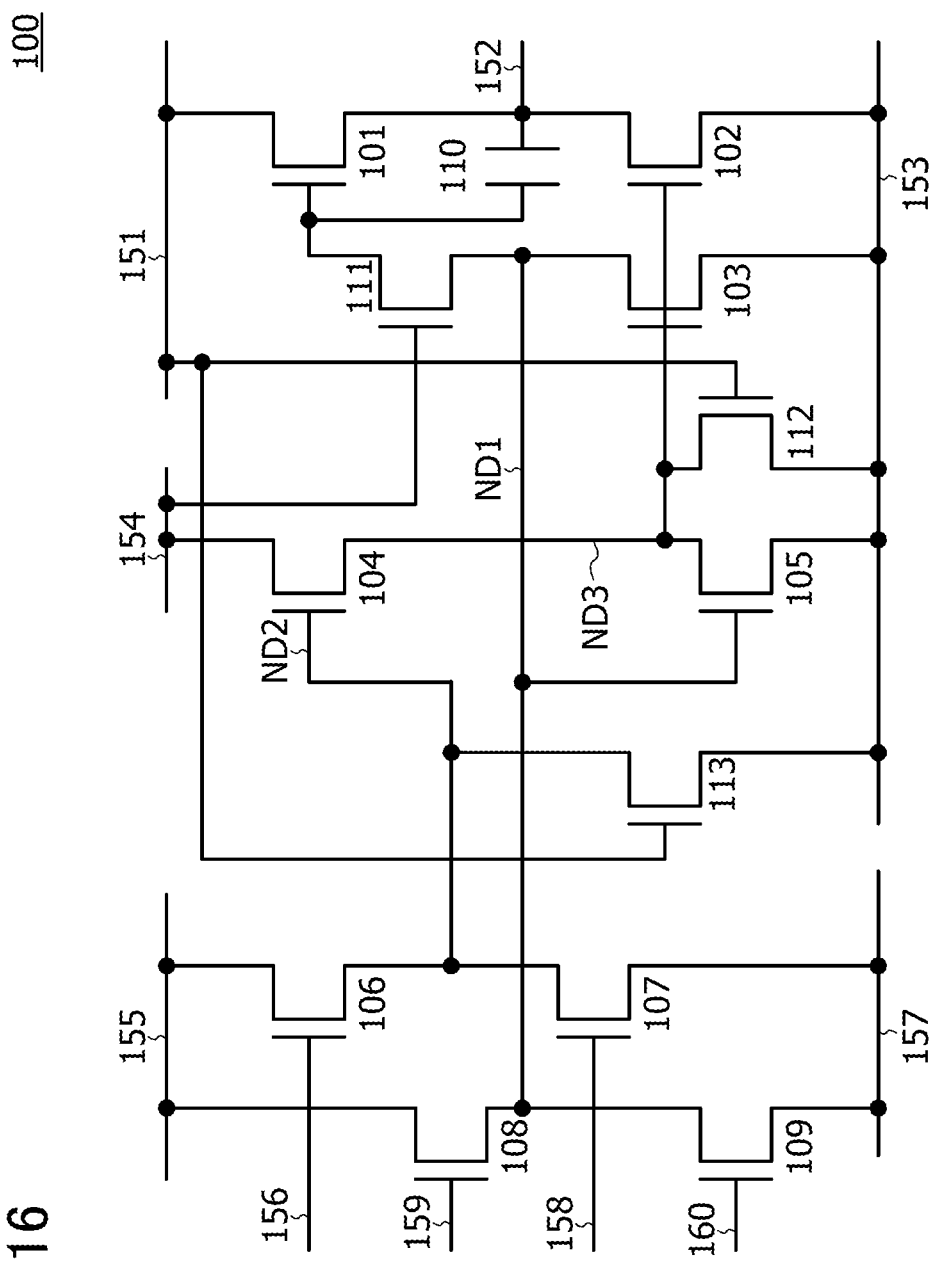
FIG. 16 is a circuit diagram illustrating one embodiment of the present invention.

A semiconductor device illustrated in FIG. 16 is different from the semiconductor device illustrated in FIG. 1 in including the transistors 111, 112, and 113 by combining Variations 1 to 3 described above.

By combining Variations 1 to 3, the semiconductor device illustrated in FIG. 16 can include the circuit 100 having the above-described advantages of those variations.

<Variation 10>

Figure 17:
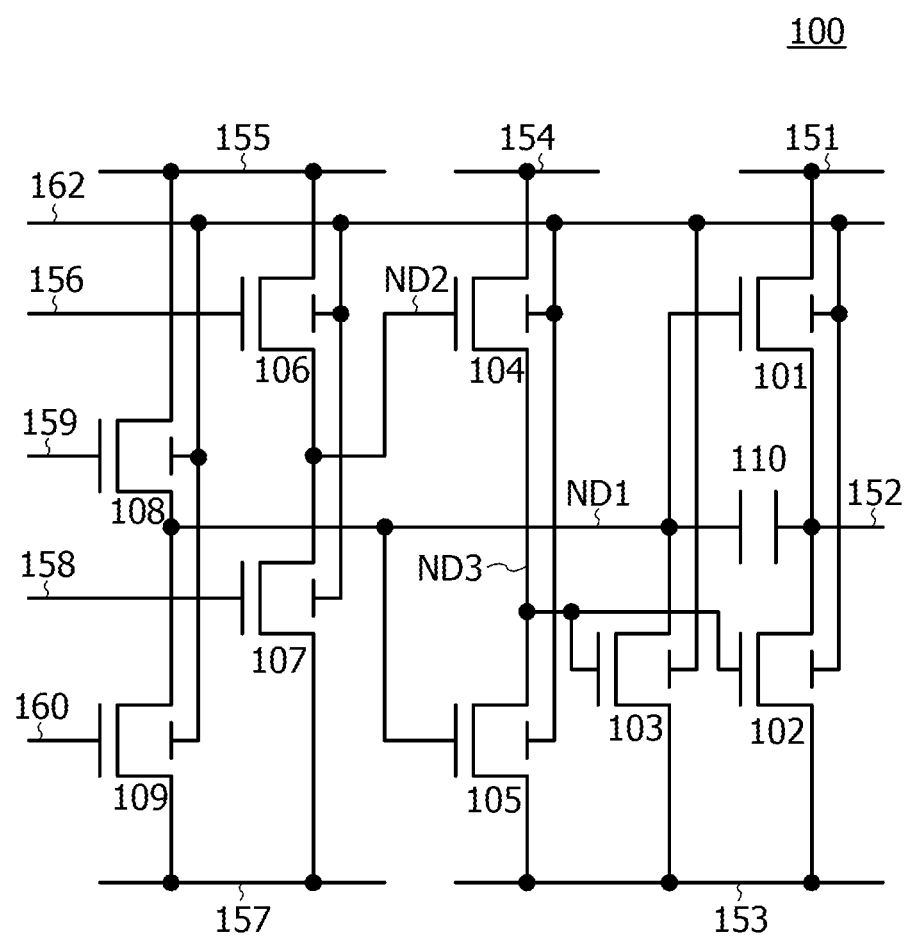
FIG. 17 is a circuit diagram illustrating one embodiment of the present invention.
Figure 18:
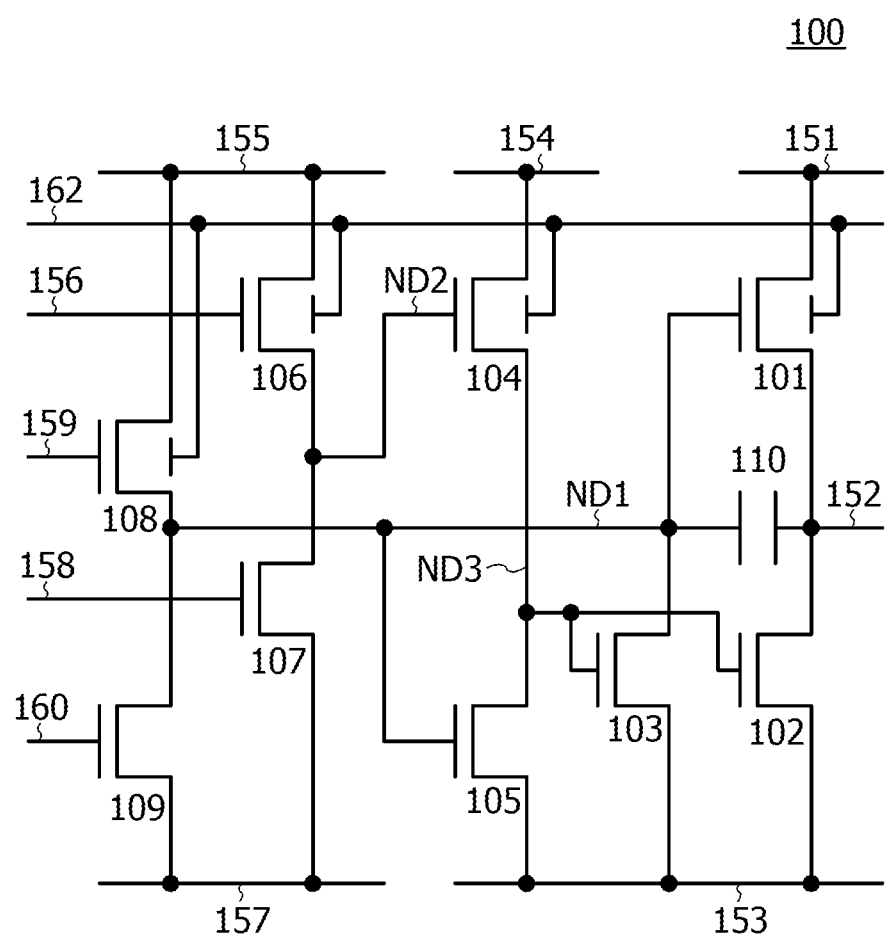
FIG. 18 is a circuit diagram illustrating one embodiment of the present invention.
Figure 19:
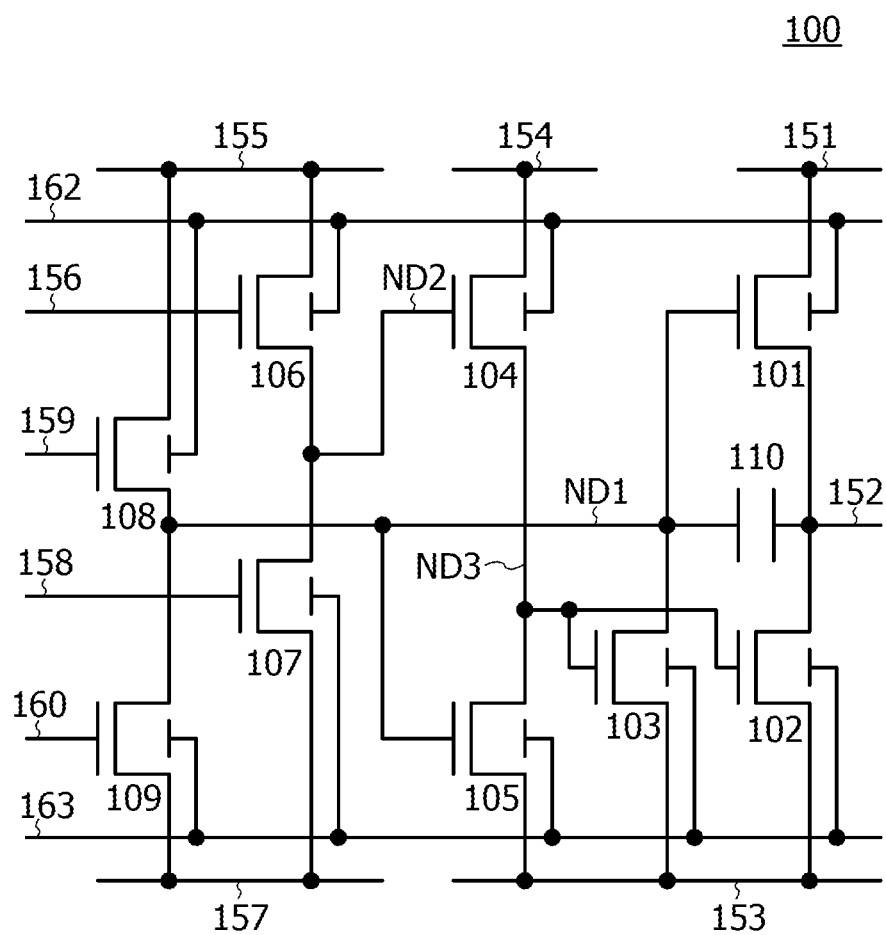
FIG. 19 is a circuit diagram illustrating one embodiment of the present invention.
Figure 20:
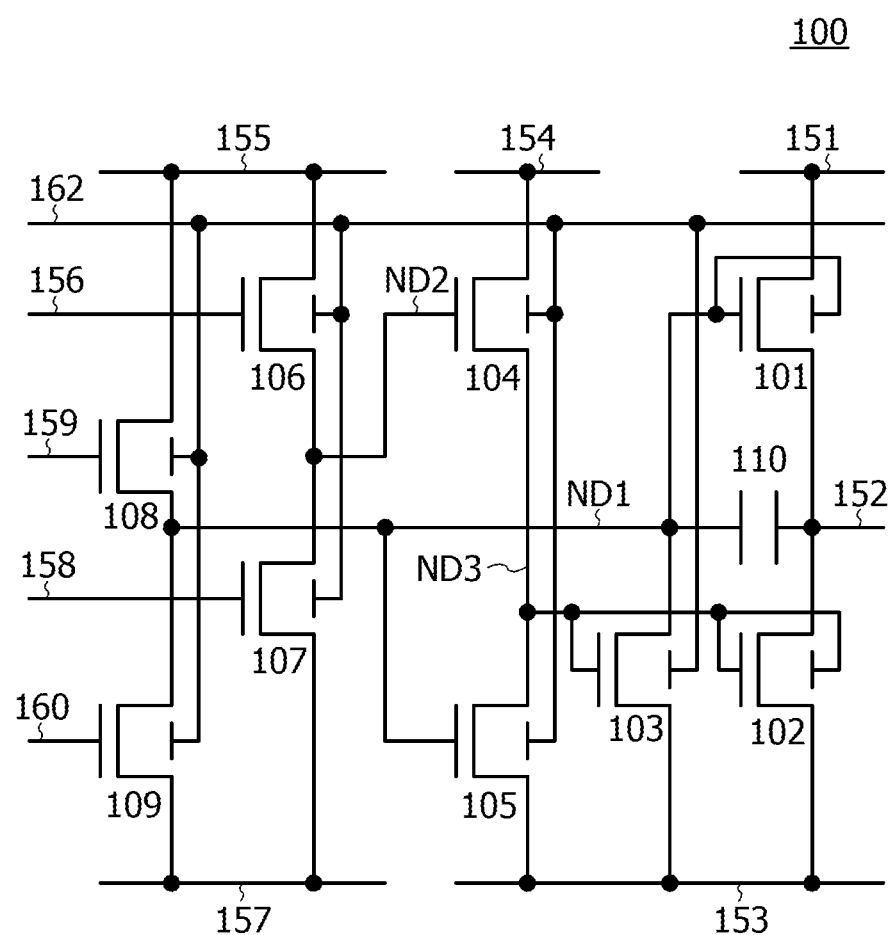
FIG. 20 is a circuit diagram illustrating one embodiment of the present invention.

A semiconductor device illustrated in FIG. 17 is different from the semiconductor device illustrated in FIG. 1 in that the transistors 101 to 109 include back gates connected to a wiring 162. A semiconductor device illustrated in FIG. 18 is different from the semiconductor device illustrated in FIG. 1 in that the transistors 101, 104, 106, and 108 include back gates connected to the wiring 162. A semiconductor device illustrated in FIG. 19 is different from the semiconductor device illustrated in FIG. 1 in that the transistors 101 to 109 include back gates, the back gates of the transistors 101, 104, 106, and 108 are connected to the wiring 162, and the back gates of the transistors 102, 103, 105, 107, and 109 are connected to a wiring 163. A semiconductor device illustrated in FIG. 20 is different from the semiconductor device illustrated in FIG. 1 in that the transistors 101 and 102 include back gates connected to their respective gates and the transistors 103 to 109 include back gates connected to the wiring 162.

The wiring 162 has a function of transmitting a high-level or low-level potential. Specifically, for example, the wiring 162 has a function of transmitting a potential with which the threshold voltages of the transistors can be controlled in the first operation and the second operation. The wiring 163 has a function of transmitting a high-level or low-level potential. Specifically, for example, the wiring 163 has a function of transmitting a potential which is different from the potential of the wiring 162 and with which the threshold voltages of the transistors can be controlled in the first operation and the second operation. For example, the potential with which the threshold voltages of the transistors can be controlled is preferably a potential that is lower than or equal to VH or a potential that is higher than or equal to VL.

The semiconductor devices illustrated in FIG. 17, FIG. 18, and FIG. 19 can reduce a flow-through current between the wiring set at VH and the wiring set at VL. Consequently, power consumption can be reduced. The semiconductor device illustrated in FIG. 20 can increase the current supply capability of the transistors 101 and 102 because the potentials supplied to the back gates of the transistors 101 and 102 are the same as those supplied to the gates of the transistors 101 and 102. Consequently, the rise time and fall time of the signal transmitted to the wiring 152 can be shortened.

<Summary>

As described above, one embodiment of the present invention is not limited to the example of the circuit and the example of the operation described in Embodiments 1 and 2. One embodiment of the present invention can have a variety of circuit configurations by employing a different transistor and/or a different capacitor, employing an additional wiring, or eliminating the existing transistor, capacitor, or wiring.

Embodiment 4

In this embodiment, an example of a shift register that includes the circuits 100 described in Embodiments 1 to 3 will be described.

Figure 21:
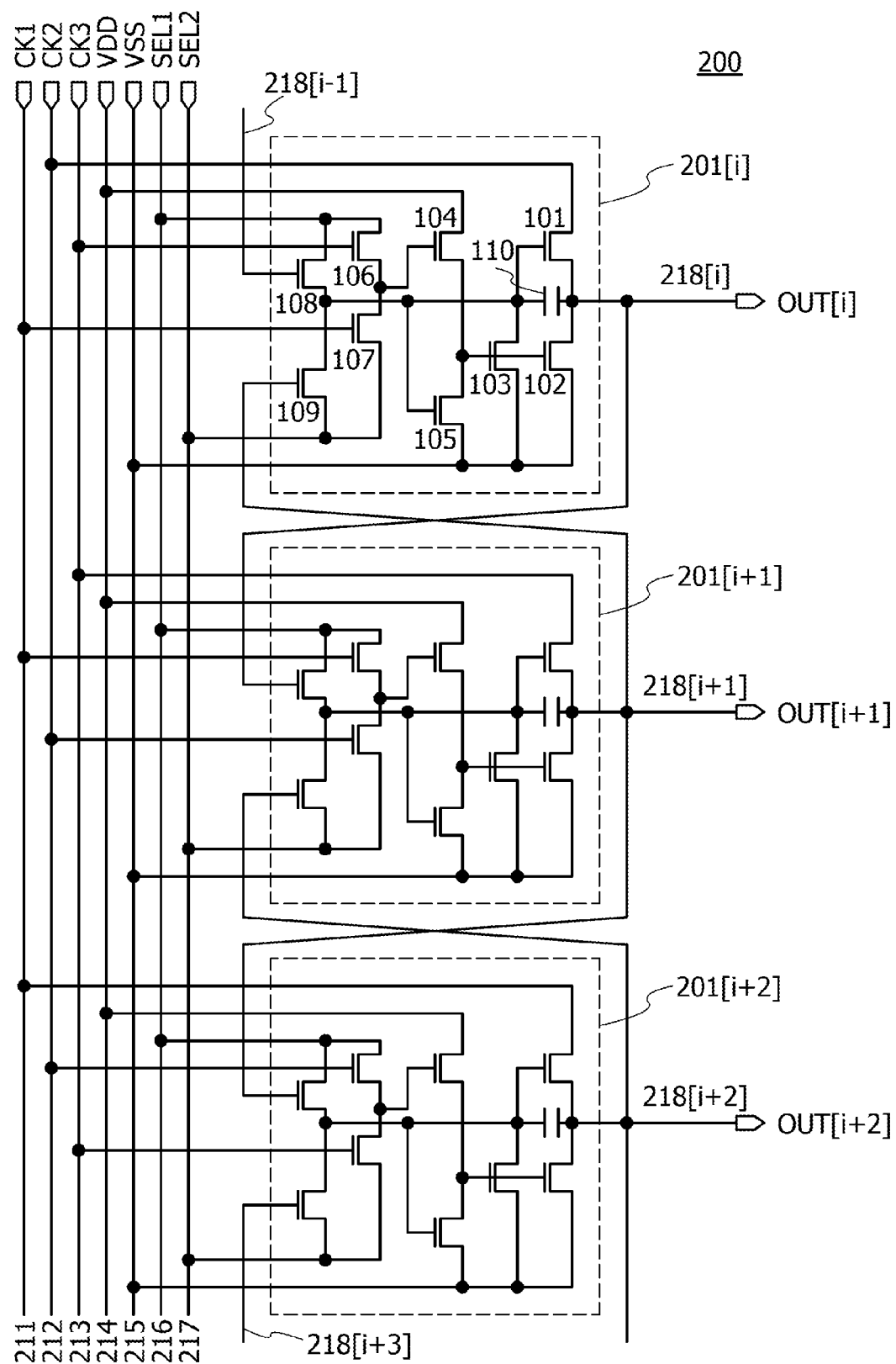
FIG. 21 is a circuit diagram illustrating one embodiment of the present invention.

A shift register 200 illustrated in FIG. 21 includes circuits 201[i] to 201[i+2] (i is a natural number of 3 or more) each of which corresponds to the circuit 100 described in Embodiments 1 to 3. The circuits 201[i] to 201[i+2] each include the transistors 101 to 109 and the capacitor 110.

In FIG. 21, output signals from the circuits 201[i] to 201[i+2] are represented by OUT[i] to OUT[i+2]. Wirings through which OUT[i] to OUT[i+2] are transmitted are represented by wirings 218[i] to 218[i+2]. The wirings 218[i] to 218[i+2] correspond to the wiring 152 described in Embodiments 1 to 3. A wiring through which an output signal OUT[i−1] from a circuit 201[i−1] (not shown) in the stage previous to the circuit 201[i] is transmitted is represented by a wiring 218[i−1]. Similarly, a wiring through which an output signal OUT[i+3] from a circuit 201[i+3] (not shown) in the stage next to the circuit 201[i+2] is transmitted is represented by a wiring 218[i+3].

In FIG. 21, wirings 211 to 217 are shown as examples of the wirings through which signals and potentials are transmitted to the circuit 201[i].

For example in the circuit 201[i], the wiring 211 corresponds to the wiring 158 described in Embodiments 1 to 3. The wiring 211 has a function of transmitting a signal CK1, for example. The signal CK1 corresponds to any one of the first to third clock signals.

For example in the circuit 201[i], the wiring 212 corresponds to the wiring 151 described in Embodiments 1 to 3. The wiring 212 has a function of transmitting a signal CK2, for example. The signal CK2 corresponds to any one of the first to third clock signals which is different from the signal CK1.

For example in the circuit 201[i], the wiring 213 corresponds to the wiring 156 described in Embodiments 1 to 3. The wiring 213 has a function of transmitting a signal CK3, for example. The signal CK3 corresponds to any one of the first to third clock signals which is different from the signals CK1 and CK2.

For example in the circuit 201[$i$], the wiring 214 corresponds to the wiring 154 described in Embodiments 1 to 3. The wiring 214 has a function of being set at VDD, for example. Note that VDD corresponds to VH.

For example in the circuit 201[$i$], the wiring 215 corresponds to the wiring 153 described in Embodiments 1 to 3. The wiring 215 has a function of being set at VSS, for example. Note that VSS corresponds to VL.

For example in the circuit 201[$i$], the wiring 216 corresponds to the wiring 155 described in Embodiments 1 to 3. The wiring 216 has a function of transmitting a signal SEL1, for example. The signal SEL1 is a signal that is at the high level, e.g., VDD, in a first period and at the low level, e.g., VSS, in a second period.

For example in the circuit 201[$i$], the wiring 217 corresponds to the wiring 157 described in Embodiments 1 to 3. The wiring 217 has a function of transmitting a signal SEL2, for example. The signal SEL2 is a signal that is at the low level, e.g., VSS, in the first period and at the high level, e.g., VDD, in the second period.

Figure 22:
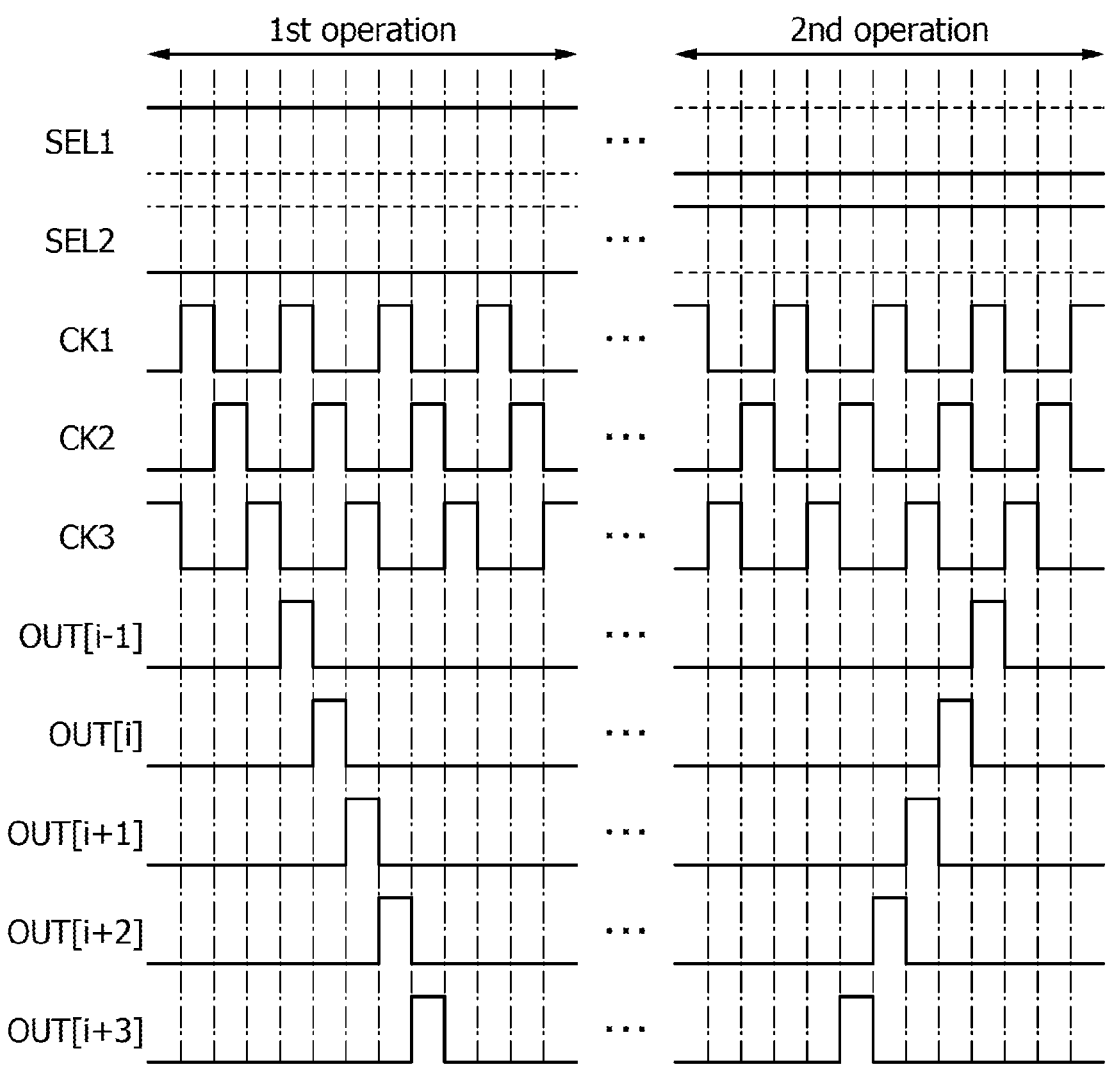
FIG. 22 is a timing chart showing one embodiment of the present invention.

The shift register 200 has a function of, for example, transmitting the output signal OUT[i], which is shifted from the output signal OUT[i−1] from the circuit 201[$i$−1] (not shown), to the wiring 218[$i$] from the circuit 201[$i$] in the first operation. Similarly, the shift register 200 has a function of, for example, transmitting the output signal OUT[i+1], which is shifted from the output signal OUT[i] from the circuit 201[$i$], to the wiring 218[$i$+1] from the circuit 201[$i$+1]. FIG. 22 shows signal waveforms in the first operation. Embodiment 2 can be referred to for the operation in the first operation of each transistor in the circuits 201[$i$−1] to 201[$i$+3].

Furthermore, the shift register 200 has a function of, for example, transmitting the output signal OUT[i+1], which is shifted from the output signal OUT[i+2] from the circuit 201[$i$+2], to the wiring 218[$i$+1] from the circuit 201[$i$+1] in the second operation. Similarly, the shift register 200 has a function of, for example, transmitting the output signal OUT[i], which is shifted from the output signal OUT[i+1] from the circuit 201[$i$+1], to the wiring 218[$i$] from the circuit 201[$i$]. FIG. 22 shows signal waveforms in the second operation. Embodiment 2 can be referred to for the operation in the second operation of each transistor in the circuits 201[$i$−1] to 201[$i$+3].

As shown in FIG. 22, the shift register 200 can shift the pulse in a first direction from the wiring 218[$i$] to the wiring 218[$i$+1] in the first operation. Similarly, the shift register 200 can shift the pulse in a second direction from the wiring 218[$i$+1] to the wiring 218[$i$] in the second operation. In this manner, the shift register 200 can function as a shift register capable of outputting a pulse particularly in both directions. The shift register 200 can change the pulse shift direction by switching the levels of the signal SEL1 and the signal SEL2 between the high and low levels. Note that the function of the shift register 200 is not limited to this.

Figure 33:
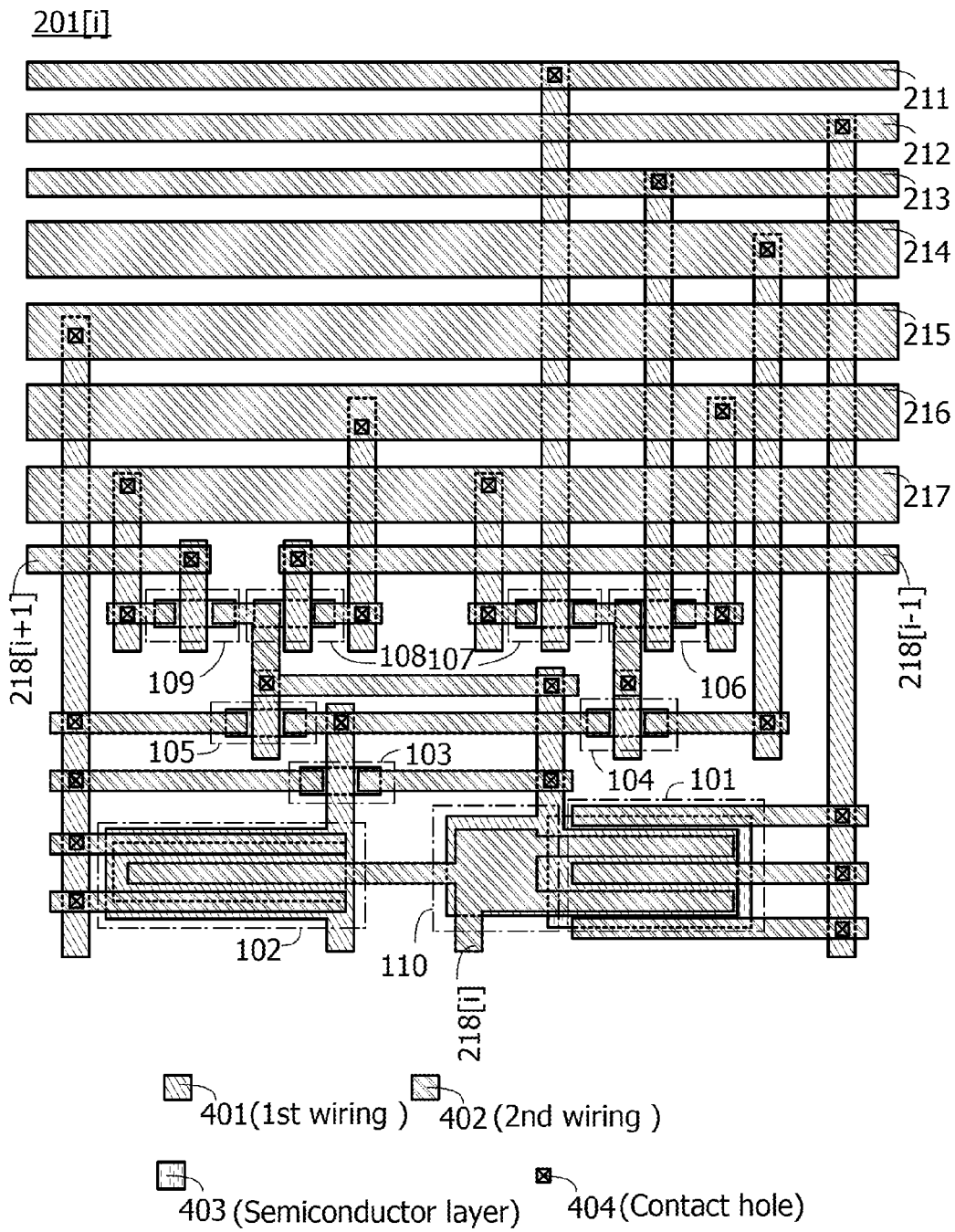
FIG. 33 is a layout diagram illustrating one embodiment of the present invention.

FIG. 33 is an example of a layout diagram illustrating the circuit 201[$i$] illustrated in FIG. 21. FIG. 33 illustrates a layout example of a first wiring 401 provided in the same layer as the gate electrode, a second wiring 402 provided in the same layer as the source electrode and the drain electrode, a semiconductor layer 403, and an opening 404 for connecting the first wiring 401 to the second wiring 402.

In the region occupied by the transistor, the semiconductor layer 403 overlaps with the first wiring 401 and both end portions of the semiconductor layer overlap with the second wiring 402. Furthermore, a region where the first wiring 401 and the second wiring 402 overlap each other is the region occupied by the capacitor. FIG. 33 illustrates the layout of the transistors 101 to 109 and the capacitor 110 illustrated in FIG. 21. FIG. 33 also illustrates the layout of the wirings 211 to 217 and the wirings 218[$i$−1] to 218[$i$+1].

In the example of the layout illustrated in FIG. 33, the semiconductor layer 403, the first wiring 401, and the second wiring 402 are stacked in this order from the bottom. However, without limitation to this example, the first wiring 401 or the second wiring 402 may be positioned in the lowest layer. The semiconductor layer 403 may be provided to have a larger width than the first wiring 401 and the second wiring 402, or may be provided to have a smaller width than the first wiring 401 and the second wiring 402.

Embodiment 5

In this embodiment, a display device in which the semiconductor device of one embodiment of the present invention can be used is described.

Figure 23A:
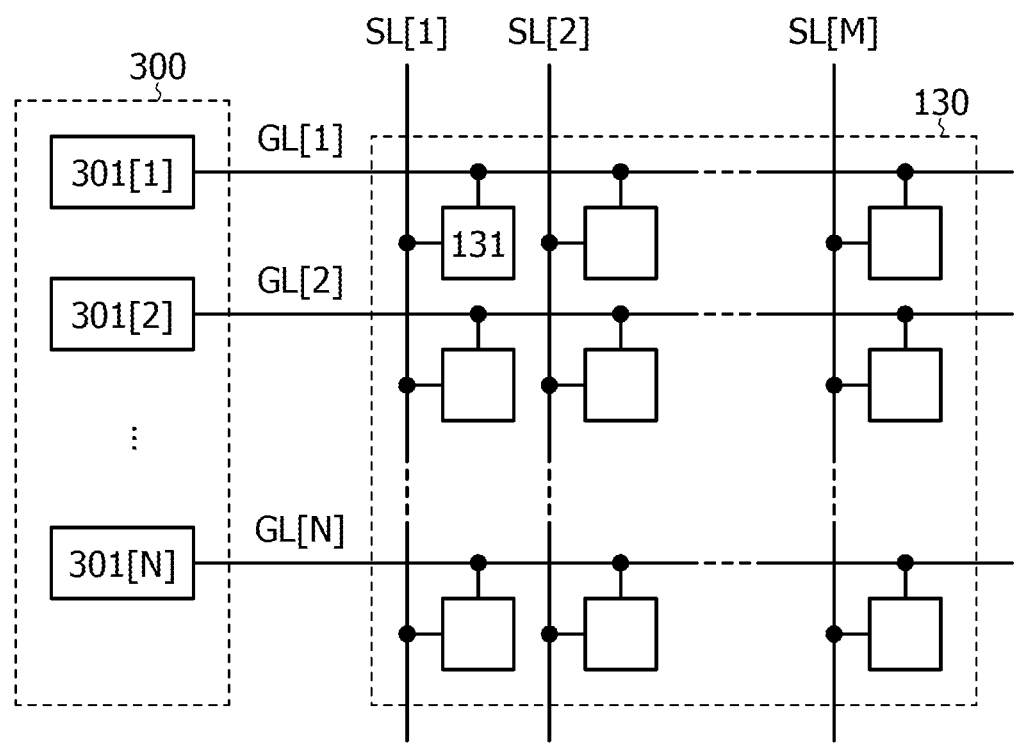
FIGS. 23A to 23C are circuit diagrams illustrating one embodiment of the present invention.

A display device illustrated in FIG. 23A includes a circuit 300 and a pixel portion 130. In the pixel portion 130, N (N is a natural number of 3 or more) wirings GL (GL[1] to GL[N]) and M (M is a natural number) wirings SL (also referred to as wirings SL[1] to SL[M]) are provided. Pixels 131 are provided for the N wirings GL and M wirings SL. The circuit 300 has a function of a gate driver (also referred to as a gate line driver circuit, a gate signal line driver circuit, or a scan line driver circuit). The N wirings GL have a function of gate lines (also referred to as gate signal lines or scan lines). The M wirings SL have a function of transmitting video signals. That is, the M wirings SL have a function of source lines (also referred to as source signal lines or signal lines). The M wirings SL are connected to a circuit having a function of a source driver (also referred to as a source line driver circuit, a source signal line driver circuit, or a signal line driver circuit).

As the circuit 300, the shift register 200 described in Embodiment 4 can be used. In that case, the N wirings GL correspond to the wirings 218. As N circuits 301 (also referred to as circuits 301[1] to 301[N]) included in the circuit 300, any types of the circuits 100 described in Embodiments 1 to 3 can be used. In that case, the N wirings GL correspond to the wirings 152.

The selection and non-selection of the pixel 131 are controlled based on the potential of the wiring GL. That is, the selection and non-selection of the pixel 131 are controlled with the circuit 300. When the pixel 131 is selected, a video signal is written from the wiring SL to the pixel 131. While the video signal is held in the pixel 131, the pixel 131 displays an image in accordance with the video signal. After that, when the pixel 131 is not selected, the pixel 131 keeps displaying the image in accordance with the held video signal.

Next, a specific structure example of the pixel 131 is described.

Figure 23B:
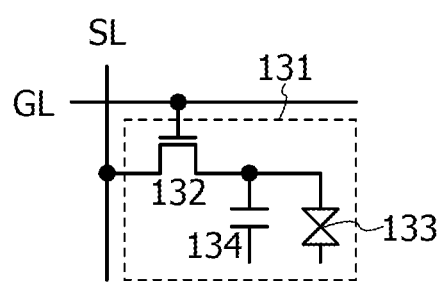

The pixel 131 illustrated in FIG. 23B includes a transistor 132, a liquid crystal element 133, and a capacitor 134. A first terminal of the transistor 132 is connected to the wiring SL, a second terminal of the transistor 132 is electrically connected to a first electrode (also referred to as a pixel electrode) of the liquid crystal element 133 and a first electrode of the capacitor 134, and a gate of the transistor 132 is connected to the wiring GL. A second electrode (also referred to as a common electrode) of the liquid crystal element 133 is shared by all or two or more of the plurality of pixels 131. In other words, a conductor including a region serving as the second electrode of the liquid crystal element 133 of a first pixel 131 includes a region serving as the second electrode of the liquid crystal element 133 of a second pixel 131. A second electrode of the capacitor 134 is connected to a wiring having a function of a capacitor line. The second electrode of the capacitor 134 is connected to the same wiring in all or two or more of the plurality of pixels 131. Note that the second electrode of the capacitor 134 may be connected to the second electrode of the liquid crystal element 133. On/off of the transistor 132 is controlled with the potential of the wiring GL. When the transistor 132 is turned on, a video signal of the wiring SL is input to the pixel 131. The liquid crystal element 133 includes a liquid crystal material. The alignment of the liquid crystal material is controlled with the potential difference between the first electrode of the liquid crystal element 133 and the second electrode of the liquid crystal element 133. The capacitor 134 has a function of accumulating electric charge based on the video signal. In other words, the capacitor 134 has a function of maintaining the potential of the first electrode of the liquid crystal element 133 at a value corresponding to the video signal.

Figure 23C:
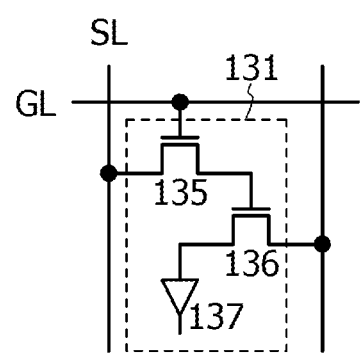

The pixel 131 illustrated in FIG. 23C includes a transistor 135, a transistor 136, and an EL element 137. A first terminal, a second terminal, and a gate of the transistor 135 are connected to the wiring SL, a gate of the transistor 136, and the wiring GL, respectively. A first terminal and a second terminal of the transistor 136 are connected to a wiring having a function of supplying a current flowing through the EL element 137 and a first electrode (also referred to as a pixel electrode) of the EL element 137, respectively. A second electrode (also referred to as a common electrode) of the EL element 137 is shared by all or two or more of the plurality of pixels 131. In other words, a conductor including a region serving as the second electrode of the EL element 137 of the first pixel 131 includes a region serving as the second electrode of the EL element 137 of the second pixel 131. On/off of the transistor 135 is controlled with the potential of the wiring GL. When the transistor 135 is turned on, the video signal of the wiring SL is input to the pixel 131. The transistor 136 has a function of supplying a current to the EL element 137. The current supplied to the EL element 137 by the transistor 136 has a value corresponding to the video signal. The EL element 137 has a function of emitting light in accordance with the current supplied from the transistor 136.

The structure of the pixel 131 is not limited to those in FIGS. 23B and 23C. The pixel 131 has any structure as long as it includes a transistor whose gate is connected to the wiring GL and first terminal is connected to the wiring SL and a display element which displays an image on the basis of a video signal input through the transistor. Alternatively, the pixel 131 has any structure as long as it includes a transistor whose gate is connected to the wiring GL and first terminal is connected to the wiring SL and a pixel electrode to which a potential or a current based on a video signal input through the transistor is supplied. Alternatively, the pixel 131 has any structure as long as it includes a transistor whose gate is connected to the wiring GL and first terminal is connected to the wiring SL and a transistor which supplies a current based on a video signal input through the transistor to a display element or a pixel electrode.

Embodiment 6

In this embodiment, structure examples of a transistor that can be used as the transistors 101 to 109 in the circuit 100 will be described with reference to drawings.

<Structural Example of Transistor>

Figure 24A:
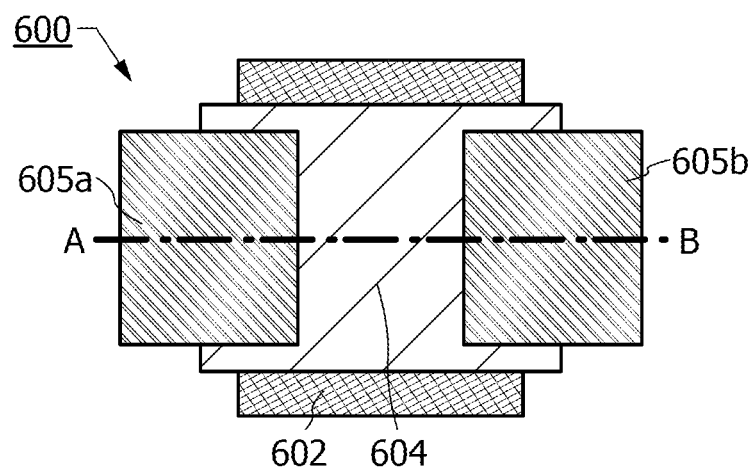
FIGS. 24A and 24B are a plan view and a cross-sectional view, respectively, illustrating one embodiment of the present invention.
Figure 24B:
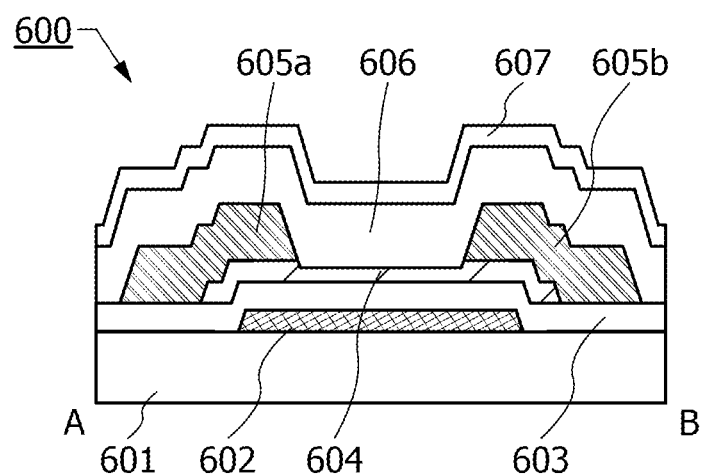

FIG. 24A is a schematic top view of a transistor 600 described below as an example. FIG. 24B is a schematic cross-sectional view of the transistor 600 taken along line A-B in FIG. 24A. The transistor 600 described as an example in FIGS. 24A and 24B is a bottom-gate transistor.

The transistor 600 includes a gate electrode 602 over a substrate 601, an insulating layer 603 over the substrate 601 and the gate electrode 602, an oxide semiconductor layer 604 provided over the insulating layer 603 to overlap with the gate electrode 602, and a pair of electrodes 605a and 605b in contact with a top surface of the oxide semiconductor layer 604. An insulating layer 606 covers the insulating layer 603, the oxide semiconductor layer 604, and the pair of electrodes 605a and 605b. An insulating layer 607 is provided over the insulating layer 606.

There is no particular limitation on the properties of a material and the like of the substrate 601 as long as the material has heat resistance high enough to withstand at least heat treatment performed later. For example, a glass substrate, a ceramic substrate, a quartz substrate, a sapphire substrate, or an yttria-stabilized zirconia (YSZ) substrate may be used as the substrate 601. Alternatively, a single crystal semiconductor substrate or a polycrystalline semiconductor substrate made of silicon or silicon carbide, a compound semiconductor substrate made of silicon germanium, an SOI substrate, or the like can be used as the substrate 601. Still alternatively, any of these substrates provided with a semiconductor element may be used as the substrate 601.

A flexible substrate such as a plastic substrate may be used as the substrate 601, and the transistor 600 may be provided directly on the flexible substrate. Alternatively, a separation layer may be provided between the substrate 601 and the transistor 600. The separation layer can be used when part or the whole of the transistor formed over the separation layer is formed, separated from the substrate 601, and then transmitted to another substrate. Thus, the transistor 600 can be transmitted to a substrate having low heat resistance or a flexible substrate.

The gate electrode 602 can be formed using a metal selected from aluminum, chromium, copper, tantalum, titanium, molybdenum, and tungsten; an alloy containing any of these metals as a component; an alloy containing any of these metals in combination; or the like. Furthermore, one or both of manganese and zirconium may be used. The gate electrode 602 may have a single-layer structure or a stacked structure of two or more layers. For example, the gate electrode 602 can have a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like. Alternatively, an alloy film or a nitride film that contains aluminum and one or more elements selected from titanium, tantalum, tungsten, molybdenum, chromium, neodymium, and scandium may be used.

The gate electrode 602 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The gate electrode 602 can have a stacked structure using the above light-transmitting conductive material and the above metal.

Furthermore, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 602 and the insulating layer 603. Materials of these films each have a work function of 5 eV or higher, preferably 5.5 eV or higher; thus, the threshold voltage of a transistor including such an oxide semiconductor film can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor layer 604, specifically, an In—Ga—Zn-based oxynitride semiconductor film having a nitrogen concentration of 7 atomic % or higher is used.

The insulating layer 603 functions as a gate insulating film. The insulating layer 603 in contact with a bottom surface of the oxide semiconductor layer 604 is preferably an oxide insulating film.

The insulating layer 603 has a single-layer structure or a stacked structure using silicon oxide, silicon oxynitride, silicon nitride oxide, silicon nitride, aluminum oxide, hafnium oxide, gallium oxide, or Ga—Zn-based metal oxide, for example.

The insulating layer 603 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case gate leakage current of the transistor can be reduced.

The pair of electrodes 605a and 605b function as a source electrode and a drain electrode of the transistor.

The pair of electrodes 605a and 605b can be formed to have a single-layer structure or a stacked structure using, as a conductive material, any of metals such as aluminum, titanium, chromium, nickel, copper, yttrium, zirconium, molybdenum, silver, tantalum, and tungsten or an alloy containing any of these metals as its main component. For example, the pair of electrodes 605a and 605b can have a single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The insulating layer 606 is preferably an oxide insulating film which contains oxygen in excess of that in the stoichiometric composition. Part of oxygen is released by heating from the oxide insulating film which contains oxygen in excess of that in the stoichiometric composition. The oxide insulating film which contains oxygen in excess of that in the stoichiometric composition is an oxide insulating film in which the amount of released oxygen converted into oxygen atoms is $1.0 \times 10^{18}$ atoms/cm$^3$ or more, preferably $3.0 \times 10^{20}$ atoms/cm$^3$ or more in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

As the insulating layer 606, a silicon oxide film, a silicon oxynitride film, or the like can be used.

Note that the insulating layer 606 also functions as a film that relieves damage to the oxide semiconductor layer 604 at the time of forming the insulating layer 607 later.

Moreover, an oxide film transmitting oxygen may be provided between the insulating layer 606 and the oxide semiconductor layer 604.

As the oxide film transmitting oxygen, a silicon oxide film, a silicon oxynitride film, or the like can be used. Note that in this specification, a "silicon oxynitride film" refers to a film that contains more oxygen than nitrogen, and a "silicon nitride oxide film" refers to a film that contains more nitrogen than oxygen.

The insulating layer 607 can be an insulating film having a blocking effect against oxygen, hydrogen, water, and the like. Providing the insulating layer 607 over the insulating layer 606 can prevent outward diffusion of oxygen from the oxide semiconductor layer 604 and entry of hydrogen, water, or the like into the oxide semiconductor layer 604 from the outside. Examples of the insulating film having a blocking effect against oxygen, hydrogen, water, and the like are a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

<Example of Method for Manufacturing Transistor>

Next, an example of a manufacturing method of the transistor 600 in FIGS. 24A and 24B is described.

Figure 25A:
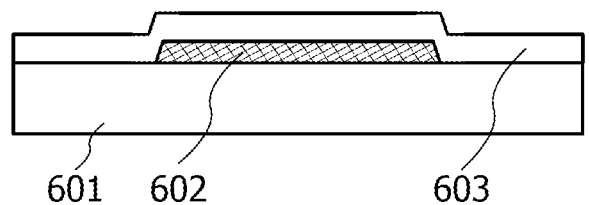
FIGS. 25A to 25D are cross-sectional views illustrating one embodiment of the present invention.

First, as illustrated in FIG. 25A, the gate electrode 602 is formed over the substrate 601, and the insulating layer 603 is formed over the gate electrode 602.

Here, a glass substrate is used as the substrate 601.

A method for forming the gate electrode 602 is described below. First, a conductive film is formed by a sputtering method, a CVD method, an evaporation method, or the like and then a resist mask is formed over the conductive film using a first photomask by a photolithography process. Next, part of the conductive film is etched using the resist mask to form the gate electrode 602. After that, the resist mask is removed.

Note that the gate electrode 602 may be formed by an electrolytic plating method, a printing method, an inkjet method, or the like instead of the above formation method.

The insulating layer 603 is formed by a sputtering method, a PECVD method, an evaporation method, or the like.

When a silicon oxide film, a silicon oxynitride film, or a silicon nitride oxide film is formed as the insulating layer 603, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

When a silicon nitride film is formed as the insulating layer 603, it is preferable to use a two-step formation method. First, a first silicon nitride film with few defects is formed by a plasma CVD method using a mixed gas of silane, nitrogen, and ammonia as a source gas. Then, a second silicon nitride film that has low hydrogen concentration and can block hydrogen is formed by switching the source gas to a mixed gas of silane and nitrogen. With such a formation method, a silicon nitride film having few defects and a blocking property against hydrogen can be formed as the insulating layer 603.

When a gallium oxide film is formed as the insulating layer 603, a metal organic chemical vapor deposition (MOCVD) method can be employed.

Figure 25B:
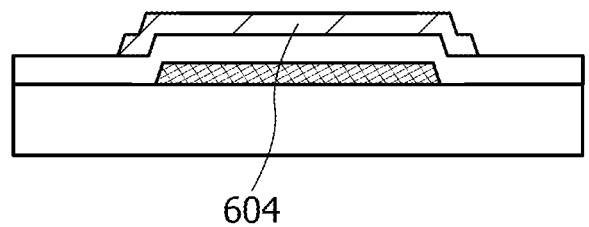

Next, as illustrated in FIG. 25B, the oxide semiconductor layer 604 is formed over the insulating layer 603.

A method for forming the oxide semiconductor layer 604 is described below. First, an oxide semiconductor film is formed. Then, a resist mask is formed over the oxide semiconductor film using a second photomask by a photolithography process. Then, part of the oxide semiconductor film is etched using the resist mask to form the oxide semiconductor layer 604. After that, the resist mask is removed.

After that, heat treatment may be performed. In such a case, the heat treatment is preferably performed under an atmosphere containing oxygen. The temperature of the heat treatment may be, for example, higher than or equal to 150° C. and lower than or equal to 600° C., preferably higher than or equal to 200° C. and lower than or equal to 500° C.

Figure 25C:
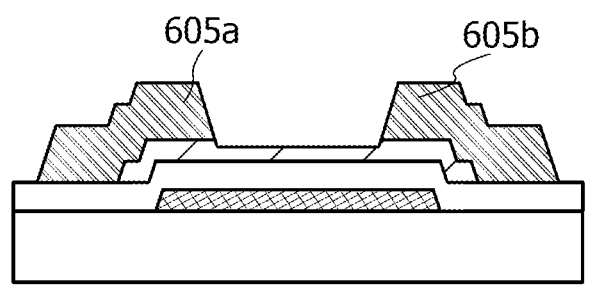

Next, as illustrated in FIG. 25C, the pair of electrodes 605a and 605b are formed.

A method for forming the pair of electrodes 605a and 605b is described below. First, a conductive film is formed by a sputtering method, a PECVD method, an evaporation method, or the like. Next, a resist mask is formed over the conductive film using a third photomask by a photolithography process. Then, part of the conductive film is etched using the resist mask to form the pair of electrodes 605a and 605b. After that, the resist mask is removed.

Note that as illustrated in FIG. 25C, the upper part of the oxide semiconductor layer 604 is partly etched and thinned by the etching of the conductive film in some cases. For this reason, the oxide semiconductor film is preferably formed thick.

Figure 25D:
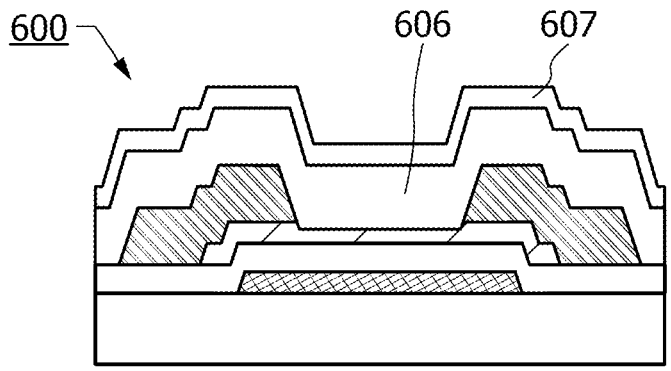

Next, as illustrated in FIG. 25D, the insulating layer 606 is formed over the oxide semiconductor layer 604 and the pair of electrodes 605a and 605b, and the insulating layer 607 is successively formed over the insulating layer 606.

When a silicon oxide film or a silicon oxynitride film is formed as the insulating layer 606, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

For example, a silicon oxide film or a silicon oxynitride film is formed under the following conditions: the substrate placed in an vacuum-evacuated treatment chamber of a plasma CVD apparatus is held at a temperature ranging from 180° C. to 260° C., preferably from 200° C. to 240° C.; the pressure of the treatment chamber into which the source gas is introduced is set in the range from 100 Pa to 250 Pa, preferably from 100 Pa to 200 Pa; and an electrode provided in the treatment chamber is supplied with a high-frequency power ranging from 0.17 W/cm$^2$ to 0.5 W/cm$^2$, preferably from 0.25 W/cm$^2$ to 0.35 W/cm$^2$.

As the film formation conditions, the high-frequency power with the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film becomes higher than that in the stoichiometric composition. However, when the substrate temperature is within the above temperature range, the bond between silicon and oxygen is weak, and accordingly, part of oxygen is released by heating. Thus, it is possible to form an oxide insulating film which contains oxygen in excess of that in the stoichiometric composition and from which part of oxygen is released by heating.

In the case where an oxide insulating film is provided between the oxide semiconductor layer 604 and the insulating layer 606, the oxide insulating film serves as a protection film of the oxide semiconductor layer 604 in the step of forming the insulating layer 606. Thus, the insulating layer 606 can be formed using the high-frequency power with high power density while damage to the oxide semiconductor layer 604 is reduced.

For example, a silicon oxide film or a silicon oxynitride film can be formed as the oxide insulating film under the following conditions: the substrate placed in an vacuum-evacuated treatment chamber of the PECVD apparatus is held at a temperature ranging from 180° C. to 400° C., preferably from 200° C. to 370° C.; the pressure of the treatment chamber into which the source gas is introduced is set in the range from 20 Pa to 250 Pa, preferably from 100 Pa to 250 Pa; and high-frequency power is supplied to the electrode provided in the treatment chamber. Setting the pressure in the treatment chamber in the range from 100 Pa to 250 Pa can reduce damage to the oxide semiconductor layer 604 at the time of forming the oxide insulating film.

A deposition gas containing silicon and an oxidizing gas are preferably used as a source gas of the oxide insulating film. Typical examples of the deposition gas containing silicon are silane, disilane, trisilane, and silane fluoride. Examples of the oxidizing gas are oxygen, ozone, dinitrogen monoxide, and nitrogen dioxide.

The insulating layer 607 can be formed by a sputtering method, a PECVD method, or the like.

When a silicon nitride film or a silicon nitride oxide film is formed as the insulating layer 607, a deposition gas containing silicon, an oxidizing gas, and a gas containing nitrogen are preferably used as a source gas. Typical examples of the deposition gas containing silicon are silane, disilane, trisilane, and silane fluoride. Examples of the oxidizing gas are oxygen, ozone, dinitrogen monoxide, and nitrogen dioxide. Examples of the gas containing nitrogen are nitrogen and ammonia.

Through the above steps, the transistor 600 can be formed.

<Variation of Transistor>

Examples of the structure of a transistor that is partly different from the transistor 600 are described below.

Figure 26A:
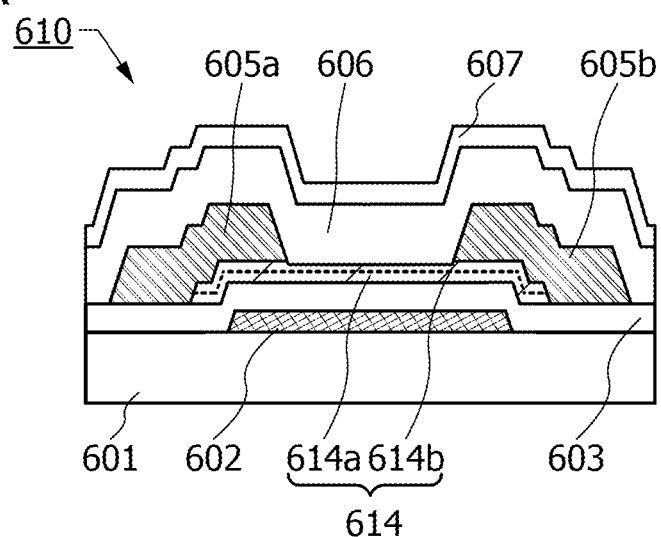
FIGS. 26A and 26B are cross-sectional views illustrating one embodiment of the present invention.

FIG. 26A is a schematic cross-sectional diagram of a transistor 610 described below as an example. The transistor 610 differs from the transistor 600 in the structure of the oxide semiconductor layer.

An oxide semiconductor layer 614 included in the transistor 610 is a stack of an oxide semiconductor layer 614a and an oxide semiconductor layer 614b.

Note that a boundary between the oxide semiconductor layers 614a and 614b is shown by broken lines in FIG. 26A and the like because the boundary is not clear in some cases.

Typical examples of a material of the oxide semiconductor layer 614a are an In—Ga oxide, an In—Zn oxide, and an In-M-Zn oxide (M represents Al, Ti, Ga, Y, Zr, La, Ce, Nd, or Hf). When the oxide semiconductor layer 614a is In-M-

Zn oxide, without taking Zn and O into consideration, the proportion of In and the proportion of M are preferably set to less than 50 atomic % and greater than or equal to 50 atomic %, respectively, more preferably less than 25 atomic % and greater than or equal to 75 atomic %, respectively. For example, a material that has an energy gap of 2 eV or more, preferably 2.5 eV or more, more preferably 3 eV or more is used for the oxide semiconductor layer 614a.

The oxide semiconductor layer 614b contains In or Ga, and typically contains an In—Ga oxide, an In—Zn oxide, or an In-M-Zn oxide (M represents Al, Ti, Ga, Y, Zr, La, Ce, Nd, or Hf). The energy at the conduction band bottom of the oxide semiconductor layer 614b is closer to a vacuum level than that of the oxide semiconductor layer 614a, and typically, the difference in the energy at the conduction band bottom between the oxide semiconductor layer 614b and the oxide semiconductor layer 614a is preferably 0.05 eV or more, 0.07 eV or more, 0.1 eV or more, or 0.15 eV or more and 2 eV or less, 1 eV or less, 0.5 eV or less, or 0.4 eV or less.

For example, when the oxide semiconductor layer 614b is an In-M-Zn oxide, the proportion of In and the proportion of M, not taking Zn and O into consideration, are preferably greater than or equal to 25 atomic % and less than 75 atomic %, respectively, more preferably greater than or equal to 34 atomic % and less than 66 atomic %, respectively.

For example, for the oxide semiconductor layer 614a, an In—Ga—Zn oxide with an atomic ratio of In:Ga:Zn=1:1:1, 1:1:1.2, or 3:1:2 can be used. For the oxide semiconductor layer 614b, an In—Ga—Zn oxide with an atomic ratio of In:Ga:Zn=1:3:2, 1:6:4, or 1:9:6 can be used. Note that the atomic ratio of each of the oxide semiconductor layers 614a and 614b may vary within a margin of ±20% of the corresponding atomic ratio.

The oxide with a high content of Ga serving as a stabilizer is used for the oxide semiconductor layer 614b provided over the oxide semiconductor layer 614a, thereby preventing release of oxygen from the oxide semiconductor layers 614a and 614b.

Note that without limitation to the materials given above, a material with an appropriate composition depending on intended semiconductor characteristics and electrical characteristics (e.g., field-effect mobility and threshold voltage) of a transistor can be used. In order to obtain intended semiconductor characteristics of the transistor, it is preferable that the carrier density, the impurity concentration, the defect density, the atomic ratio of a metal element to oxygen, the interatomic distance, the density, and the like of each of the oxide semiconductor layers 614a and 614b be set to appropriate values.

Although the oxide semiconductor layer 614 is a stack of two oxide semiconductor layers in the above structure, it may be a stack of three or more oxide semiconductor layers.

Figure 26B:
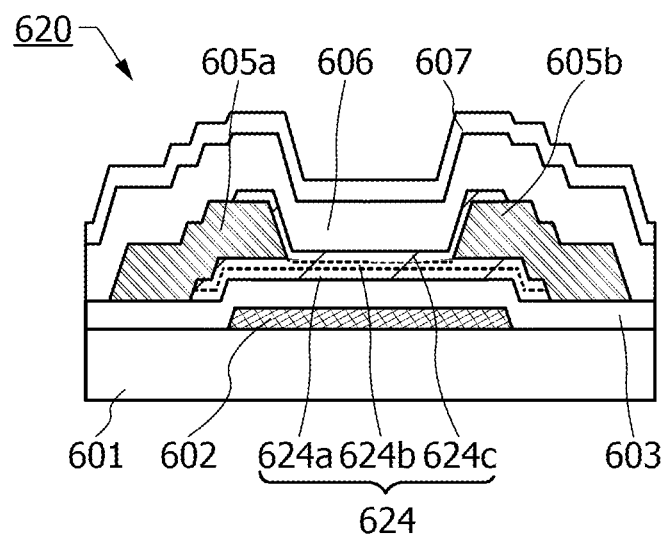

FIG. 26B is a schematic cross-sectional diagram of a transistor 620 described below as an example. The transistor 620 differs from the transistor 600 and the transistor 610 in the structure of the oxide semiconductor layer.

In an oxide semiconductor layer 624 included in the transistor 620, an oxide semiconductor layer 624a, an oxide semiconductor layer 624b, and an oxide semiconductor layer 624c are stacked in this order.

The oxide semiconductor layers 624a and 624b are stacked over the insulating layer 603. The oxide semiconductor layer 624c is provided in contact with a top surface of the oxide semiconductor layer 624b and top and side surfaces of the pair of electrodes 605a and 605b.

The oxide semiconductor layer 624b can have a structure similar to that of the oxide semiconductor layer 614a exemplified in <Variation of Transistor>, for example. Moreover, the oxide semiconductor layers 624a and 624c can have a structure similar to that of the oxide semiconductor layer 614b exemplified in <Variation of Transistor>, for example.

For example, when an oxide with a high content of Ga serving as a stabilizer is used for the oxide semiconductor layer 624a provided under the oxide semiconductor layer 624b and the oxide semiconductor layer 624c provided over the oxide semiconductor layer 624b, oxygen can be prevented from being released from the oxide semiconductor layers 624a to 624c.

For example, in the case where a channel is formed mainly in the oxide semiconductor layer 624b, the on-state current of the transistor 620 can be increased when an oxide with a high content of In is used for the oxide semiconductor layer 624b and the pair of electrodes 605a and 605b are provided in contact with the oxide semiconductor layer 624b.

<Another Structure Example of Transistor>

A structural example of a top-gate transistor to which the oxide semiconductor film of one embodiment of the present invention can be applied is described below.

Note that components having structures or functions similar to the above are denoted by the same reference numerals, and the description thereof is omitted below.

Figure 27A:
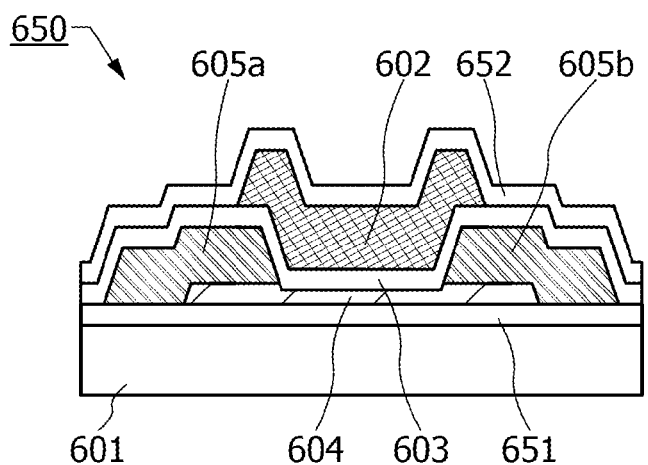
FIGS. 27A to 27C are cross-sectional views illustrating one embodiment of the present invention.

FIG. 27A is a schematic cross-sectional diagram of a top-gate transistor 650 described below as an example.

The transistor 650 includes the oxide semiconductor layer 604 over the substrate 601 provided with an insulating layer 651, the pair of electrodes 605a and 605b in contact with the top surface of the oxide semiconductor layer 604, the insulating layer 603 over the oxide semiconductor layer 604 and the pair of electrodes 605a and 605b, and the gate electrode 602 provided over the insulating layer 603 to overlap with the oxide semiconductor layer 604. An insulating layer 652 is provided to cover the insulating layer 603 and the gate electrode 602.

The insulating layer 651 has a function of suppressing diffusion of impurities from the substrate 601 to the oxide semiconductor layer 604. For example, a structure similar to that of the insulating layer 607 can be employed. Note that the insulating layer 651 is not necessarily provided.

Like the insulating layer 607, the insulating layer 652 can be an insulating film having a blocking effect against oxygen, hydrogen, water, and the like. Note that the insulating layer 607 is not necessarily provided.

Examples of the structure of a transistor that is partly different from the transistor 650 are described below.

Figure 27B:
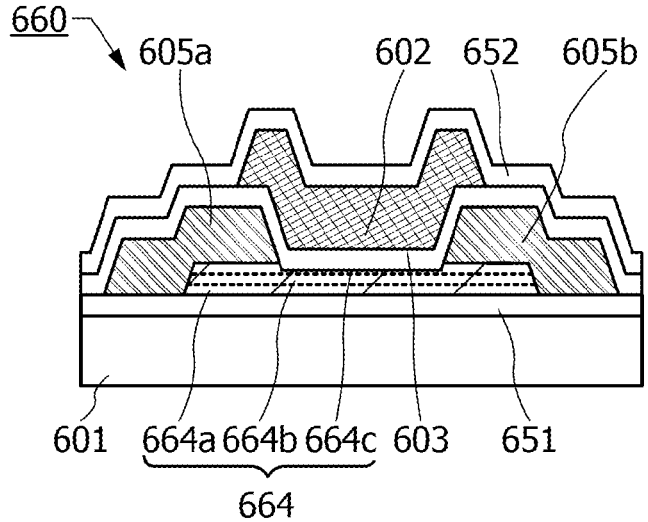

FIG. 27B is a schematic cross-sectional diagram of a transistor 660. The transistor 660 differs from the transistor 650 in the structure of the oxide semiconductor layer.

In an oxide semiconductor layer 664 included in the transistor 660, an oxide semiconductor layer 664a, an oxide semiconductor layer 664b, and an oxide semiconductor layer 664c are stacked in this order.

The oxide semiconductor film described above can be used as one or more of the oxide semiconductor layers 664a to 664c.

The oxide semiconductor layer 664b can have a structure similar to that of the oxide semiconductor layer 614a exemplified in <Variation of Transistor>, for example. The oxide semiconductor layers 664a and 664c can have a structure similar to that of the oxide semiconductor layer 614b exemplified in <Variation of Transistor>, for example.

For example, when an oxide with a high content of Ga serving as a stabilizer is used for the oxide semiconductor layer 664a provided under the oxide semiconductor layer 664b and the oxide semiconductor layer 664c provided over the oxide semiconductor layer 664b, oxygen can be prevented from being released from the oxide semiconductor layers 664a to 664c.

A structure example of a transistor, which is partly different from the transistor 650, is described below.

Figure 27C:
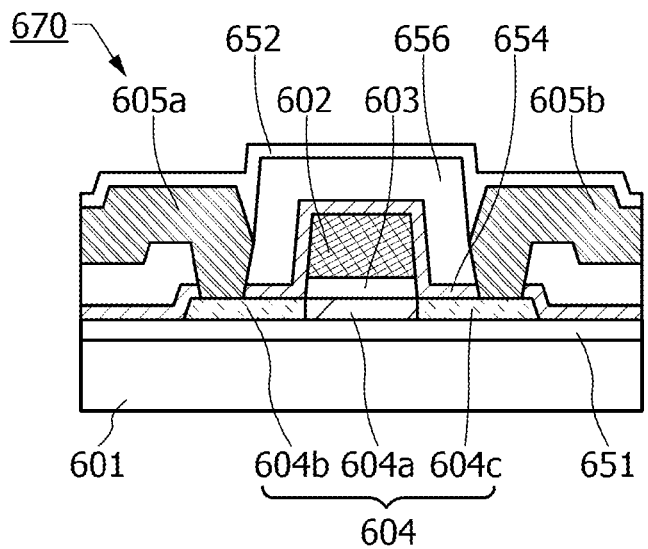

FIG. 27C is a schematic cross-sectional diagram of a transistor 670 exemplified below. The transistor 670 differs from the transistor 650 in the shapes of the pair of electrodes 605a and 605b in contact with the oxide semiconductor layer 604, the shape of the gate electrode 602, and the like.

The transistor 670 includes the oxide semiconductor layer 604 over the substrate 601 provided with the insulating layer 651, the insulating layer 603 over the oxide semiconductor layer 604, the gate electrode 602 over the insulating layer 603, an insulating layer 654 over the insulating layer 651 and the oxide semiconductor layer 604, an insulating layer 656 over the insulating layer 654, the pair of electrodes 605a and 605b electrically connected to the oxide semiconductor layer 604 through openings provided in the insulating layers 654 and 656, and the insulating layer 652 over the insulating layer 656 and the pair of electrodes 605a and 605b.

The insulating layer 654 is formed using, for example, an insulating film containing hydrogen. As an example of the insulating film containing hydrogen, a silicon nitride film can be given. Hydrogen contained in the insulating layer 654 is bonded to oxygen vacancies in the oxide semiconductor layer 604 to be carriers in the oxide semiconductor layer 604. Thus, in the structure illustrated in FIG. 27C, regions where the oxide semiconductor layer 604 and the insulating layer 654 are in contact with each other refer to an n-type region 604b and an n-type region 604c. Note that a region between the n-type region 604b and the n-type region 604c serves as a channel region 604a.

By providing the n-type regions 604b and 604c in the oxide semiconductor layer 604, contact resistance with the pair of electrodes 605a and 605b can be reduced. The n-type regions 604b and 604c can be formed using the insulating layer 654 covering the gate electrode 602 at the time of forming the gate electrode 602 in a self-aligned manner. The transistor 670 illustrated in FIG. 27C is a so-called top-gate transistor having a self-aligned structure. With a top-gate transistor having a self-aligned structure, an overlap of the gate electrode 602 and the pair of electrodes 605a and 605b serving as a source electrode and a drain electrode is not formed, which enables a reduction in parasitic capacitance between the electrodes.

The insulating layer 656 included in the transistor 670 can be formed using a silicon oxynitride film, for example.

Embodiment 7

In this embodiment, the OS transistor described in the above embodiment is described.

<Characteristics of OS Transistor>

The off-state current of an OS transistor can be reduced by reducing the concentration of impurities in an oxide semiconductor to make the oxide semiconductor intrinsic or substantially intrinsic. The term "substantially intrinsic" refers to a state where an oxide semiconductor has a carrier density lower than $1\times10^{17}/cm^3$, lower than $1\times10^{15}/cm^3$, or lower than $1\times10^{13}/cm^3$. In the oxide semiconductor, hydrogen, nitrogen, carbon, silicon, and metal elements other than main components are impurities. For example, hydrogen and nitrogen form donor levels to increase the carrier density.

A transistor using an intrinsic or substantially intrinsic oxide semiconductor has a low carrier density and thus is less likely to have negative threshold voltage. Moreover, because of few carrier traps in the oxide semiconductor, the transistor using the oxide semiconductor has small variation in electrical characteristics and high reliability. Furthermore, the transistor using the oxide semiconductor achieves an ultra-low off-state current.

For example, the OS transistor with reduced off-state current can exhibit an off-state current per micrometer in channel width of $1\times10^{-18}$ A or less, $1\times10^{-21}$ A or less, or $1\times10^{-24}$ A or less at room temperature (approximately 25° C.), or $1\times10^{-15}$ A or less, $1\times10^{-18}$ A or less, or $1\times10^{-21}$ A or less at 85° C.

<Off-State Current>

Unless otherwise specified, the off-state current in this specification refers to a drain current of a transistor in the off state (also referred to as non-conduction state or cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification, the off-state current of a transistor with a channel width W is sometimes represented by a current value per the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the required reliability of a semiconductor device or the like including the transistor is ensured, or Vds at which in the semiconductor device or the like including the transistor is used.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Composition of Oxide Semiconductor>

Note that at least indium (In) or zinc (Zn) is preferably contained as an oxide semiconductor used for the semiconductor layer of the OS transistor. In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, it is possible to use an In—Ga—Zn-based oxide with an atomic ratio of In:Ga:Zn=1:1:1, 3:1:2, or 2:1:3 or an oxide with an atomic ratio close to the above atomic ratios. It is particularly preferable to use an In—Ga—Zn-based oxide with an atomic ratio of In:Ga:Zn=4:2:3 or close thereto. An oxide semiconductor film of an In—Ga—Zn-based oxide with an atomic ratio of In:Ga:Zn=4:2:3 or close thereto is formed using a target with an atomic ratio of In:Ga:Zn=4:2:4.1.

<Impurity in Oxide Semiconductor>

If an oxide semiconductor film forming the semiconductor layer contains hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferred that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For this reason, it is preferred that oxygen be added to the oxide semiconductor film to fill oxygen vacancies increased by the dehydration treatment (dehydrogenation treatment).

In this manner, hydrogen or moisture is removed from the oxide semiconductor film by the dehydration treatment (dehydrogenation treatment) and oxygen vacancies therein are filled by oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film.

<Structure of Oxide Semiconductor>

Next, a structure of an oxide semiconductor will be described.

Note that in this specification, the term "parallel" indicates that an angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part.

Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the InGaZnO$_4$ crystal, focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single-crystal oxide semiconductor film having the same composition as the oxide semiconductor film. For example, the density of an a-like OS film is higher than or equal to 78.6% and lower than 92.3% of that of the single-crystal oxide semiconductor film. In addition, for example, the density of an nc-OS film or a CAAC-OS film is higher than or equal to 92.3% and lower than 100% of that of the single-crystal oxide semiconductor film. Note that it is difficult to form an oxide semiconductor film whose density is lower than 78% of that of the single-crystal oxide semiconductor film.

Specific examples of the above are described. For example, in the case of an oxide semiconductor film with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor film with an atomic ratio of In:Ga:Zn=1:1:1, the density of an a-like OS film is higher than or equal to 5.0 g/cm$^3$ and lower than 5.9 g/cm$^3$. In addition, for example, in the case of the oxide semiconductor film with an atomic ratio of In:Ga:Zn=1:1:1, the density of an nc-OS film or a CAAC-OS film is higher than or equal to 5.9 g/cm$^3$ and lower than 6.3 g/cm$^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

As described above, the OS transistor can achieve highly favorable off-state current characteristics.

Embodiment 8

In this embodiment, a display module in which any of the semiconductor devices described in the above embodiments is used will be described. For example, the semiconductor device can be used in part of a gate driver circuit portion, a source driver circuit portion, or a pixel portion. An example of the display module will be described below with reference to FIG. 28 and FIG. 29.

<Plan View of Display Module>

Figure 28:
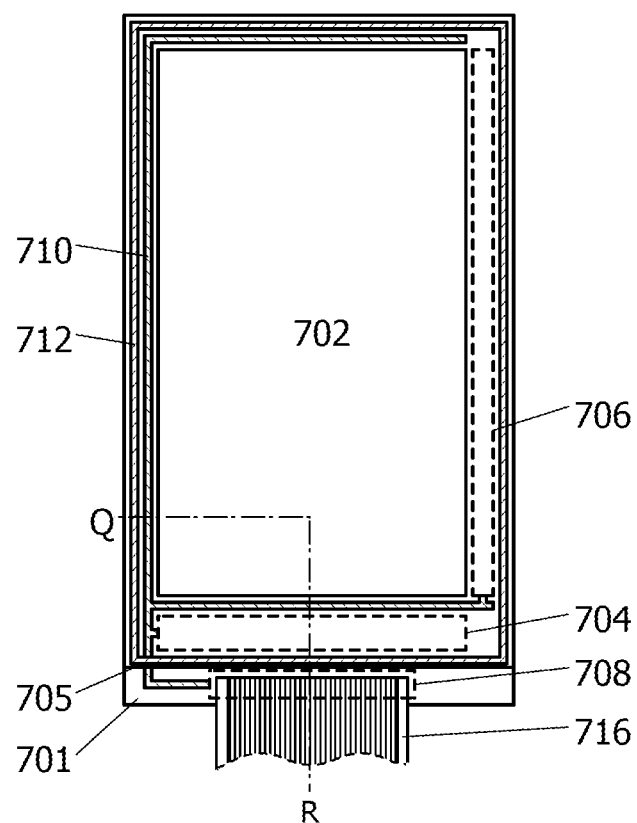
FIG. 28 is a plan view illustrating one embodiment of the present invention.

FIG. 28 is a top view of an example of a display module. A display module 700 illustrated in FIG. 28 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 28, a display element is provided between the first substrate 701 and the second substrate 705.

In the display module 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. The variety of signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display module 700. An example of the display module 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display module 700 include a plurality of transistors. As the plurality of transistors, any of the transistors that are described in the above embodiments can be used.

The display module 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption. Note that in this embodiment, a structure including a liquid crystal element as a display element is described below.

As a display method in the display module 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases. Note that in this embodiment, a structure in which a backlight and the like are not provided, that is, a so-called reflective liquid crystal display module is described below.

<Cross-Sectional View of Display Module>

Figure 29:
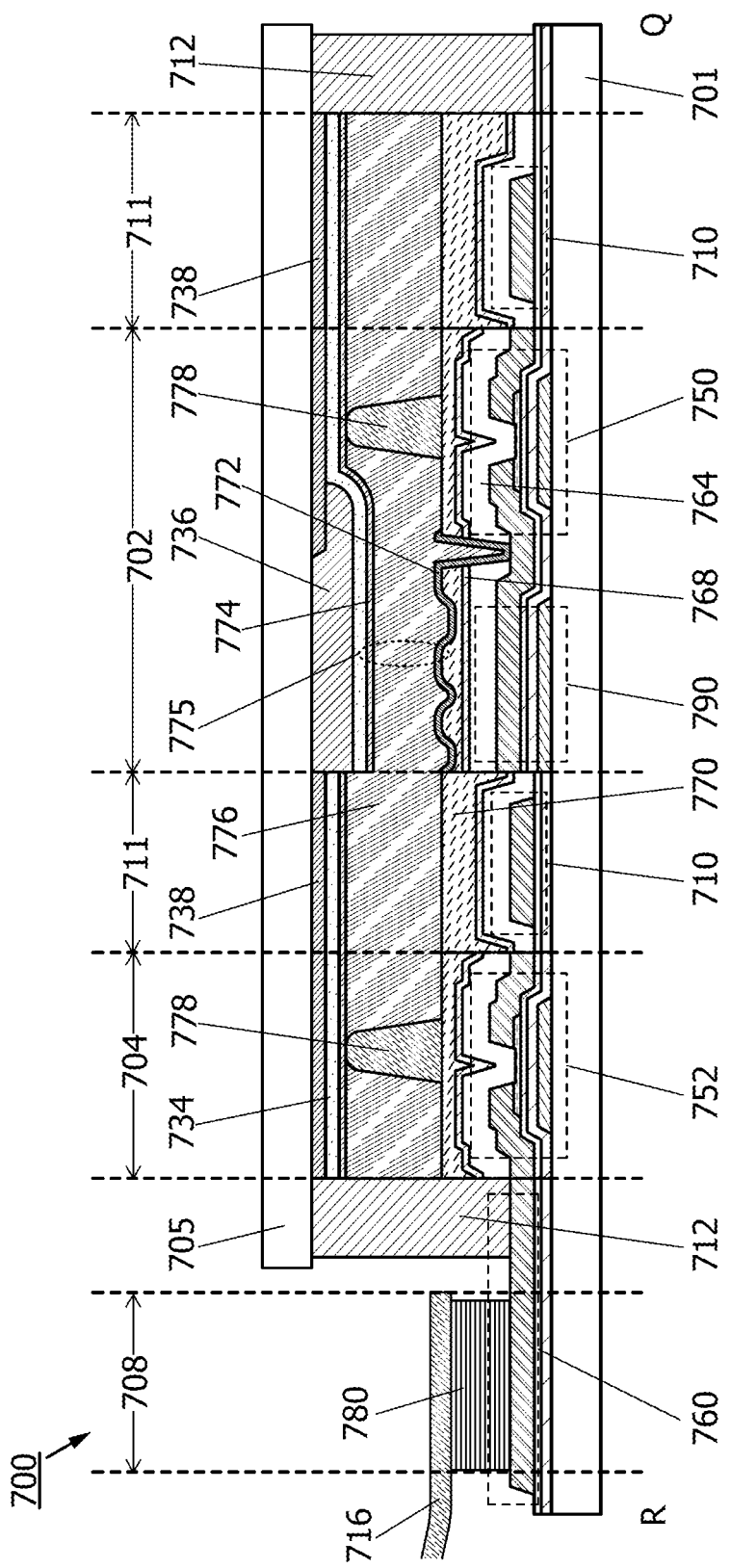
FIG. 29 is a cross-sectional view illustrating one embodiment of the present invention.

FIG. 29 is a cross-sectional view taken along dashed-dotted line Q-R in FIG. 28. The display module illustrated in FIG. 29 is described in detail below.

The display module 700 illustrated in FIG. 29 includes a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 29, insulating films 764 and 768 and a planarization insulating film 770 are formed over the transistor 750, the transistor 752, and the capacitor 790.

As the insulating film 764, a silicon oxide film, a silicon oxynitride film, or the like may be formed by a PECVD device, for example. As the insulating film 768, a silicon nitride film or the like may be formed by a PECVD device, for example. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process as a source electrode and a drain electrode of the transistor 750 or 752, e.g., a conductive film formed in the same process as a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

In the cross-sectional view illustrated in FIG. 29 as an example, the display module 700 includes a liquid crystal element 775. The liquid crystal element 775 includes a conductive film 772, a conductive film 774, and a liquid crystal layer 776. The liquid crystal layer 776 is formed using a liquid crystal material having a dielectric constant anisotropy of greater than or equal to 2 and less than or equal to 3.8. The conductive film 774 is provided on the second substrate 705 side and functions as a counter electrode. The display module 700 in FIG. 29 is capable of displaying an image in such a manner that transmission or non-transmission of light is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display module 700 in FIG. 29 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display module 700 in FIG. 29. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved. As illustrated in FIG. 29, a reflective color liquid crystal display device can display an image without a backlight, which enables a reduction in power consumption.

Note that the display module 700 illustrated in FIG. 29 is a reflective color liquid crystal display module given as an example, but a display type is not limited thereto. For example, a transmissive color liquid crystal display module in which the conductive film 772 is a conductive film that transmits visible light may be used. In the case of a transmissive color liquid crystal display module, projections and depressions are not necessarily provided on the planarization insulating film 770.

Although not illustrated in FIG. 29, an alignment film may be provided on a side of the conductive film 772 in contact with the liquid crystal layer 776 and on a side of the conductive film 774 in contact with the liquid crystal layer 776. Although not illustrated in FIG. 29, an optical member (an optical substrate) and the like such as a polarizing member, a retardation member, or an anti-reflection member may be provided as appropriate. For example, circular polarization may be employed by using a polarizing substrate and a retardation substrate. In the case of the transmissive display module or the semi-transmissive display module, a backlight, a sidelight, or the like may be used as a light source.

As the liquid crystal element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time, and has optical isotropy, which makes the alignment process unneeded and viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

Embodiment 9

In this embodiment, an input/output device (also referred to as a touch panel) obtained by providing a touch sensor (a contact sensor device) for the display module described in the above embodiment is described with reference to FIGS. 30A to 30C and FIG. 31. Hereinafter, the description of the same portions as those in the above embodiments is omitted in some cases.

FIGS. 30A to 30C are projection drawings illustrating a structure of the input/output device.

FIG. 30A is a projection drawing of an input/output device 800, and FIG. 30B is a projection drawing illustrating a structure of a sensor unit 820U included in the input/output device 800.

Figure 31:
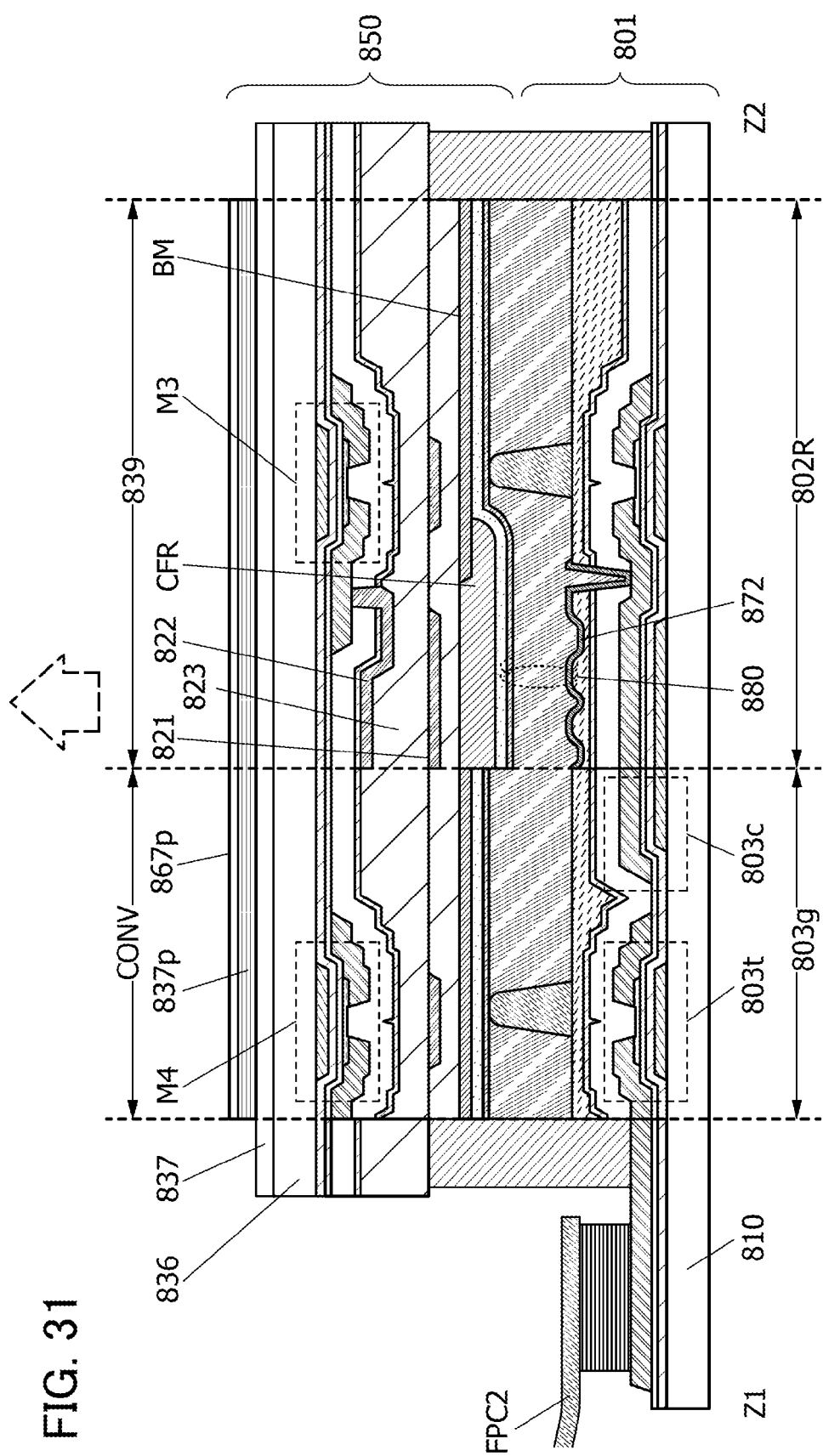
FIG. 31 is a cross-sectional view illustrating one embodiment of the present invention.

FIG. 31 is a cross-sectional view taken along line Z1-Z2 of the input/output device 800 in FIG. 30A.

The input/output device 800 described in this embodiment includes an input device 850 and a display module 801. The input device 850 includes a plurality of sensor units 820U arranged in matrix and each provided with window portions 834 transmitting visible light, a scan line G1 electrically connected to a plurality of sensor units 820U placed in the row direction (indicated by arrow Rx in the drawing), a signal line DL electrically connected to a plurality of sensor units 820U placed in the column direction (indicated by arrow Ry in the drawing), and a first base material 836 supporting the sensor unit 820U, the scan line G1, and the signal line DL. The display module 801 includes a plurality of pixels 802 overlapping with the window portions 834 and arranged in matrix and a second base material 810 supporting the pixels 802 (see FIGS. 30A to 30C).

The sensor unit 820U includes a sensor element Ca overlapping with the window portion 834 and a sensor circuit 839 electrically connected to the sensor element Ca (see FIG. 30B).

The sensor element Ca includes an insulating layer 823, and a first electrode 821 and a second electrode 822 between which the insulating layer 823 (not illustrated in FIG. 30B) is sandwiched (see FIG. 30B).

A selection signal is supplied to the sensor circuit 839, and the sensor circuit 839 supplies a sensor signal DATA based on the change in capacitance of the sensor element Ca.

The scan line G1 can supply the selection signal, the signal line DL can supply the sensor signal DATA, and the sensor circuit 839 is placed to overlap with gaps between the plurality of window portions 834.

In addition, the input/output device 800 described in this embodiment includes a coloring layer between the sensor unit 820U and the pixel 802 overlapping with the window portion 834 of the sensor unit 820U.

The input/output device 800 described in this embodiment includes the input device 850 including the plurality of sensor units 820U, each of which is provided with the window portions 834 transmitting visible light, and the display module 801 including the plurality of pixels 802 overlapping with the window portions 834. The coloring layer is included between the window portion 834 and the pixel 802.

With such a structure, the input/output device can supply a sensor signal based on the change in the capacitance and positional information of the sensor unit supplying the sensor signal and can display image data relating to the positional information of the sensor unit. As a result, a novel input/output device with high convenience or high reliability can be provided.

The input/output device 800 may include a flexible substrate FPC1 to which a signal from the input device 850 is supplied and/or a flexible substrate FPC2 supplying a signal including image data to the display module 801.

In addition, a protective base material 837 or a protective layer 837p that protects the input/output device 800 by preventing damage and/or an anti-reflective layer 867p that weakens the intensity of external light reflected by the input/output device 800 may be included.

Moreover, the input/output device 800 includes a scan line driver circuit 803g that supplies the selection signal to a scan line of the display module 801, a wiring 811 supplying a signal, and a terminal 819 electrically connected to the flexible substrate FPC2.

Components of the input/output device 800 are described below. Note that these components cannot be clearly distinguished and one component also serves as another component or includes part of another component in some cases. For example, the input device 850 including the coloring layer overlapping with the plurality of window portions 834 also serves as a color filter.

The input/output device 800 includes the input device 850 and the display module 801 (see FIG. 30A).

The input device 850 includes the plurality of sensor units 820U and the first base material 836 supporting the sensor units 820U. For example, the plurality of sensor units 820U are arranged in matrix with 40 rows and 15 columns on the first base material 836.

The window portion 834 transmits visible light.

A coloring layer transmitting light of a predetermined color is provided to overlap with the window portion 834. For example, a coloring layer CFB transmitting blue light, a coloring layer CFG transmitting green light, and a coloring layer CFR transmitting red light are included (see FIG. 30B).

Note that, in addition to the coloring layers transmitting blue light, green light, and/or red light, coloring layers transmitting light of various colors such as a coloring layer transmitting white light and a coloring layer transmitting yellow light can be included.

For a coloring layer, a metal material, a pigment, dye, or the like can be used.

A light-blocking layer BM is provided to surround the window portions 834. The light-blocking layer BM does not easily transmit light as compared to the window portion 834.

For the light-blocking layer BM, carbon black, a metal oxide, a composite oxide containing a solid solution of a plurality of metal oxides, or the like can be used.

The scan line G1, the signal line DL, a wiring VPI, a wiring RES, a wiring VRES, and the sensor circuit 839 are provided to overlap with the light-blocking layer BM.

Note that a light-transmitting overcoat layer covering the coloring layer and the light-blocking layer BM can be provided.

The sensor element Ca includes the first electrode 821, the second electrode 822, and the insulating layer 823 between the first electrode 821 and the second electrode 822 (see FIG. 31).

The first electrode 821 is formed in, for example, an island shape so as to be apart from other regions. A layer that can be formed in the same process as that of the first electrode 821 is preferably placed close to the first electrode 821 so that the user of the input/output device 800 does not recognize the first electrode 821. Further preferably, the number of the window portions 834 placed in the gap between the first electrode 821 and the layer placed close to the first electrode 821 is reduced as much as possible. In particular, the window portion 834 is preferably not placed in the gap.

When an object whose dielectric constant is different from that of the air gets closer to the first electrode 821 or the second electrode 822 of the sensor element Ca that is put in the air, the capacitance of the sensor element Ca is changed. Specifically, when a finger or the like gets closer to the sensor element Ca, the capacitance of the sensor element Ca is changed. Thus, the sensor element Ca can be used in a proximity sensor.

The first electrode 821 and the second electrode 822 include a conductive material.

For example, an inorganic conductive material, an organic conductive material, a metal material, a conductive ceramic material, or the like can be used for the first electrode 821 and the second electrode 822.

Specifically, a metal element selected from aluminum, chromium, copper, tantalum, titanium, molybdenum, tungsten, nickel, silver, and manganese; an alloy including any of the above-described metal elements; an alloy including any of the above-described metal elements in combination; or the like can be used for the first electrode 821 and the second electrode 822.

Alternatively, a conductive oxide such as indium oxide, indium tin oxide, indium zinc oxide, zinc oxide, or zinc oxide to which gallium is added can be used for the first electrode 821 and the second electrode 822.

Alternatively, graphene or graphite can be used for the first electrode 821 and the second electrode 822. The film including graphene can be formed, for example, by reducing a film containing graphene oxide. As a reducing method, a method with application of heat, a method using a reducing agent, or the like can be employed.

Alternatively, a conductive polymer can be used for the first electrode 821 and the second electrode 822.

The sensor circuit 839 includes transistors M1 to M3, for example. In addition, the sensor circuit 839 includes wirings supplying a power supply potential and a signal. For example, the signal line DL, the wiring VPI, a wiring CS, the scan line G1, the wiring RES, and the wiring VRES are included.

Note that the sensor circuit 839 may be placed not to overlap with the window portion 834.

A conductive material can be used for the wirings (e.g., the signal line DL, the wiring VPI, the wiring CS, the scan line G1, the wiring RES, and the wiring VRES). For example, an inorganic conductive material, an organic conductive material, a metal material, a conductive ceramic material, or the like can be used for the wirings. Alternatively, a material which is the same as those of the first electrode 821 and the second electrode 822 may be used.

For the scan line G1, the signal line DL, the wiring VPI, the wiring RES, and the wiring VRES, a metal material such as aluminum, gold, platinum, silver, nickel, titanium, tungsten, chromium, molybdenum, iron, cobalt, copper, or palladium, or an alloy material containing any of these metal materials can be used.

The sensor circuit 839 may be formed on the first base material 836. Alternatively, the sensor circuit 839 formed on another base material may be transmitted to the first base material 836.

Examples of the materials of the first base material 836 and the second base material 810 are glass substrates or flexible materials (e.g., a resin, a resin film, and a plastic film).

More specifically, non-alkali glass, soda-lime glass, potash glass, crystal glass, or the like can be used for the first base material 836 and the second base material 810. Alternatively, a resin film or resin plate of polyester, polyolefin, polyamide, polyimide, polycarbonate, an acrylic resin, or the like can be used for the first base material 836.

For example, a glass substrate, a resin film or resin plate of polyester, polyolefin, polyamide, polyimide, polycarbonate, an acrylic resin, or the like, a stack thereof, or the like can be used as the protective base material 837 and/or the protective layer 837*p*.

For example, a hard coat layer or a ceramic coat layer can be used as the protective layer 837*p*. Specifically, a layer containing a UV curable resin or aluminum oxide may be formed to overlap with the second electrode 822.

The display module 801 includes the plurality of pixels 802 arranged in a matrix (see FIG. 30C).

For example, the pixel 802 includes a sub-pixel 802B, a sub-pixel 802G, and a sub-pixel 802R, and each sub-pixel includes a display element and a pixel circuit for driving the display element.

In the pixel 802, the sub-pixel 802B is placed to overlap with the coloring layer CFB, the sub-pixel 802G is placed to overlap with the coloring layer CFG, and the sub-pixel 802R is placed to overlap with the coloring layer CFR.

The coloring layer CFR is positioned in a region overlapping with the liquid crystal element 880. Note that the liquid crystal element 880 includes a reflective electrode 872 as one electrode (see FIG. 31). Thus, part of external light reflected by the reflective electrode 872 passes through the coloring layer CFR and is emitted in a direction indicated by an arrow in the drawing. The reflective electrode 872 can have a structure similar to that of the conductive film 772 serving as the reflective electrode in the above embodiment. The liquid crystal element 880 includes a liquid crystal layer having a dielectric constant anisotropy of greater than or equal to 2 and less than or equal to 3.8.

The light-blocking layer BM is provided to surround the coloring layer (e.g., the coloring layer CFR).

The scan line driver circuit 803*g* includes a transistor 803*t* and a capacitor 803*c* (see FIG. 31).

Various circuits that can convert the sensor signal DATA supplied from the sensor unit 820U and supply the converted signal to the flexible substrate FPC1 can be used as a converter CONV (see FIG. 30A and FIG. 31).

For example, a transistor M4 can be used in the converter CONV.

The display module 801 includes the anti-reflective layer 867*p* positioned in a region overlapping with pixels. As the anti-reflective layer 867*p*, a circular polarizing plate can be used, for example.

As illustrated in FIG. 30A, the display module 801 includes the wirings 811 through which signals can be supplied. The wirings 811 are provided with the terminal 819. Note that the flexible substrate FPC2 through which a signal such as an image signal or a synchronization signal is supplied is electrically connected to the terminal 819.

Note that a printed wiring board (PWB) may be attached to the flexible substrate FPC2.

The display module 801 includes wirings such as scan lines, signal lines, and power supply lines. Any of various conductive films can be used as the wirings.

For the wirings included in the display module 801, for example, a metal element selected from aluminum, chromium, copper, tantalum, titanium, molybdenum, tungsten, nickel, yttrium, zirconium, silver, and manganese; an alloy including any of the above-described metal elements; or an alloy including any of the above-described metal elements in combination can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

As specific structures of the wirings included in the display module 801, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a stacked structure in which an alloy film or a nitride film which contains one or more elements selected from titanium, tantalum, tungsten, molybdenum, chromium, neodymium, and scandium is stacked over an aluminum film can be used. Alternatively, a light-transmitting conductive material including indium oxide, tin oxide, or zinc oxide may be used.

Embodiment 10

In this embodiment, specific examples of electronic devices each of which is manufactured using the liquid crystal display device described in the above embodiment are described with reference to FIGS. 32A to 32C.

Examples of electronic devices to which one embodiment of the present invention can be applied include a television set (also referred to as a television or a television receiver), a monitor of a computer or the like, a camera such as a digital camera or a digital video camera, a digital photo frame, a mobile phone, a portable game machine, a portable information terminal, a music reproducing device, a game machine (e.g., a pachinko machine or a slot machine), and a game console. FIGS. 32A to 32C illustrate specific examples of these electronic devices.

Figure 32A:
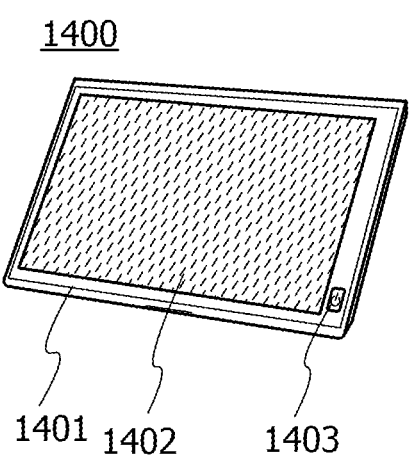
FIGS. 32A to 32C illustrate electronic devices according to one embodiment of the present invention.

FIG. 32A illustrates a portable information terminal 1400 including a display portion. The portable information terminal 1400 includes a display portion 1402 and an operation button 1403 which are incorporated in a housing 1401. The liquid crystal display device of one embodiment of the present invention can be used for the display portion 1402.

Figure 32B:
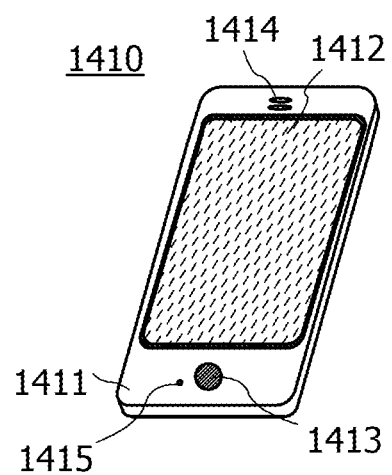

FIG. 32B illustrates a cellular phone 1410. The cellular phone 1410 includes a display portion 1412, an operation button 1413, a speaker 1414, and a microphone 1415 which are incorporated in a housing 1411. The liquid crystal display device of one embodiment of the present invention can be used for the display portion 1412.

Figure 32C:
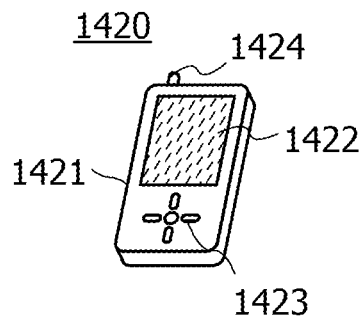

FIG. 32C illustrates a music reproducing device 1420. The music reproducing device 1420 includes a display portion 1422, an operation button 1423, and an antenna 1424 which are incorporated in a housing 1421. In addition, the antenna 1424 transmits and receives data via a wireless signal. The liquid crystal display device of one embodiment of the present invention can be used for the display portion 1422.

The display portions 1402, 1412, and 1422 each have a touch-input function. When a user touches a displayed button (not illustrated) which is displayed on the display portion 1402, 1412, or 1422 with his/her fingers or the like, the user can carry out operation on the screen and input of information.

When the liquid crystal display device described in the above embodiment is used for the display portions 1402, 1412, and 1422, the display quality of the display portions 1402, 1412, and 1422 can be improved.

Supplementary Notes on the Description in this Specification and the Like

The following are notes on the description of the above embodiments and structures in the embodiments.

Notes on One Embodiment of the Present Invention Described in Embodiments

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiment. For example, although the structure for changing the scan direction by switching between two operations, i.e., the first operation and the second operation, has been described as one embodiment of the present invention in each of Embodiments 1 and 2, one embodiment of the present invention is not limited to that structure. Depending on the conditions, a structure in which the scan direction is fixed to one direction may be employed, for example. Moreover, for example, although an example of using the circuit 100 in a shift register has been described as one embodiment of the present invention in Embodiment 4, one embodiment of the present invention is not limited to that example. For example, the circuit 100 can be used in a variety of circuits depending on the conditions, to form one embodiment of the present invention.

<Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

<Notes on Expressions that can be Rephrased>

In this specification or the like, in describing connections of a transistor, one of a source and a drain is referred to as "one of a source and a drain" (or a first electrode or a first terminal), and the other of the source and the drain is referred to as "the other of the source and the drain" (or a second electrode or a second terminal). This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms

The following are definitions of the terms mentioned in the above embodiments.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a plan view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of the transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<Pixel>>

In this specification and the like, one pixel refers to one element whose brightness can be controlled, for example.

Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel.

Note that the number of color elements is not limited to three, and more color elements may be used. For example, RGBW (W: white), RGB added with yellow, cyan, or magenta, and the like may be employed.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

This application is based on Japanese Patent Application serial no. 2014-178698 filed with Japan Patent Office on Sep. 3, 2014, the entire contents of which are hereby incorporated by reference.

What is claimed is:

1. A semiconductor device comprising:
   a first transistor, a second transistor, a third transistor, a fourth transistor, a fifth transistor, a sixth transistor, a seventh transistor, an eighth transistor, and a ninth transistor,
   wherein one of a source and a drain of the first transistor is electrically connected to a first wiring,
   wherein the other of the source and the drain of the first transistor and one of a source and a drain of the second transistor are electrically connected to a second wiring,
   wherein the other of the source and the drain of the second transistor, one of a source and a drain of the third transistor, and one of a source and a drain of the fifth transistor are electrically connected to a third wiring,
   wherein the other of the source and the drain of the third transistor is electrically connected to a gate of the first transistor,
   wherein one of a source and a drain of the fourth transistor is electrically connected to a fourth wiring,
   wherein the other of the source and the drain of the fourth transistor and the other of the source and the drain of the fifth transistor are electrically connected to at least one of a gate of the second transistor and a gate of the third transistor,
   wherein one of a source and a drain of the sixth transistor and one of a source and a drain of the eighth transistor are electrically connected to a fifth wiring,
   wherein a gate of the sixth transistor is electrically connected to a sixth wiring, wherein one of a source and a drain of the seventh transistor and one of a source and a drain of the ninth transistor are electrically connected to a seventh wiring, wherein a gate of the seventh transistor is electrically connected to an eighth wiring, wherein a gate of the eighth transistor is electrically connected to a ninth wiring, wherein a gate of the ninth transistor is electrically connected to a tenth wiring, wherein the other of the source and the drain of the sixth transistor and the other of the source and the drain of the seventh transistor are electrically connected to a gate of the fourth transistor, and wherein the other of the source and the drain of the eighth transistor and the other of the source and the drain of the ninth transistor are electrically connected to the gate of the first transistor.

2. The semiconductor device according to claim 1, wherein the fifth wiring is configured to transmit one of a first potential and a second potential in a first operation and the other of the first potential and the second potential in a second operation, and wherein the seventh wiring is configured to transmit the other of the first potential and the second potential in the first operation and the one of the first potential and the second potential in the second operation.

3. The semiconductor device according to claim 2, wherein the fourth wiring is configured to transmit the first potential, and wherein the third wiring is configured to transmit the second potential.

4. The semiconductor device according to claim 1, wherein the first wiring is configured to transmit a first clock signal, wherein the sixth wiring is configured to transmit a second clock signal, and wherein the eighth wiring is configured to transmit a third clock signal.

5. The semiconductor device according to claim 1, wherein the second wiring is configured to transmit an output signal, wherein the tenth wiring is configured to transmit a signal output from a previous stage circuit, and wherein the ninth wiring is configured to transmit a signal output from a next stage circuit.

6. The semiconductor device according to claim 1, wherein a W/L of the first transistor, where W is a channel width and L is a channel length, is higher than W/Ls of the second to ninth transistors.

7. The semiconductor device according to claim 1, wherein a W/L of the sixth transistor, where W is a channel width and L is a channel length, is 0.8 times to 1.2 times a W/L of the seventh transistor.

8. The semiconductor device according to claim 1, wherein a W/L of the eighth transistor, where W is a channel width and L is a channel length, is 0.8 times to 1.2 times a W/L of the ninth transistor.

9. The semiconductor device according to claim 1, wherein the first to ninth transistors have the same polarity.

10. The semiconductor device according to claim 1, wherein a channel formation region of each of the first to ninth transistors comprises an oxide semiconductor.

11. The semiconductor device according to claim 1, further comprising a first capacitor, wherein one electrode of the first capacitor is electrically connected to the other of the source and the drain of the first transistor, and wherein the other electrode of the first capacitor is electrically connected to the gate of the first transistor.

12. The semiconductor device according to claim 1, further comprising a second capacitor, wherein one electrode of the second capacitor is electrically connected to the other of the source and the drain of the fourth transistor, and wherein the other electrode of the second capacitor is electrically connected to the gate of the fourth transistor.

13. The semiconductor device according to claim 1, further comprising a tenth transistor, wherein one of a source and a drain of the tenth transistor is electrically connected to the gate of the first transistor, and wherein the other of the source and the drain of the tenth transistor is electrically connected to the other of the source and the drain of the third transistor.

14. The semiconductor device according to claim 1, further comprising an eleventh transistor, wherein one of a source and a drain of the eleventh transistor is electrically connected to the third wiring, wherein the other of the source and the drain of the eleventh transistor is electrically connected to the other of the source and the drain of the fifth transistor, and wherein a gate of the eleventh transistor is electrically connected to the first wiring.

15. The semiconductor device according to claim 1, further comprising a twelfth transistor, wherein one of a source and a drain of the twelfth transistor is electrically connected to the gate of the fourth transistor, wherein the other of the source and the drain of the twelfth transistor is electrically connected to the second wiring, and wherein a gate of the twelfth transistor is electrically connected to the first wiring.

16. The semiconductor device according to claim 1, wherein the other of the source and the drain of the fourth transistor and the other of the source and the drain of the fifth transistor are electrically connected to one of the gate of the second transistor and the gate of the third transistor, and wherein the other of the gate of the second transistor and the gate of the third transistor is electrically connected to an eleventh wiring.

17. The semiconductor device according to claim 1, wherein each of the first, fourth, sixth, and eighth transistors comprises a back gate.

18. The semiconductor device according to claim 1, wherein each of the first to ninth transistors comprises a back gate.

19. A display module comprising:
the semiconductor device according to claim 1; and
an FPC.

20. An electronic device comprising:
the display module according to claim 19; and
a speaker, an operation button, and/or an antenna.

* * * * *